United States Patent
Kamigaichi et al.

(10) Patent No.: US 8,994,180 B2
(45) Date of Patent: *Mar. 31, 2015

(54) NONVOLATILE SEMICONDUCTOR MEMORY HAVING A WORD LINE BENT TOWARDS A SELECT GATE LINE SIDE

(71) Applicant: Kabushiki Kaisha Toshiba, Minato-ku (JP)

(72) Inventors: Takeshi Kamigaichi, Yokohama (JP); Takeshi Murata, Yokohama (JP); Itaru Kawabata, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/301,102

(22) Filed: Jun. 10, 2014

(65) Prior Publication Data

US 2014/0293694 A1 Oct. 2, 2014

Related U.S. Application Data

(60) Continuation of application No. 13/935,637, filed on Jul. 5, 2013, now Pat. No. 8,786,096, which is a continuation of application No. 13/427,061, filed on Mar. 22, 2012, now Pat. No. 8,497,582, which is a (Continued)

(30) Foreign Application Priority Data

Jun. 27, 2006 (JP) .................................. 2006-176799
Dec. 28, 2006 (JP) .................................. 2006-354851

(51) Int. Cl.
*H01L 29/41* (2006.01)
*H01L 27/115* (2006.01)

(52) U.S. Cl.
CPC .............. *G11C 5/06* (2013.01); *G11C 16/0483* (2013.01); *H01L 27/115* (2013.01); *H01L 27/11519* (2013.01); *G11C 16/04* (2013.01); *H01L 27/11524* (2013.01)
USPC ................... 257/773; 257/315; 257/E27.102; 257/E29.112

(58) Field of Classification Search
CPC ................... H01L 27/11519; H01L 27/11524; G11C 16/0433
USPC .......... 257/301, 315, 696, 773–776, E27.102, 257/E29.112, E23.01, E23.141
See application file for complete search history.

(56) References Cited

U.S. PATENT DOCUMENTS 5,043,942 A * 8/1991 Iwata et al. .............. 365/185.13
6,531,357 B2 * 3/2003 Takeuchi et al. .............. 438/241

(Continued)

FOREIGN PATENT DOCUMENTS

| JP | 5-88375 | 4/1993 |
|---|---|---|
| JP | 8-55920 | 2/1996 |

(Continued)

OTHER PUBLICATIONS

Office Action issued Mar. 29, 2011 in Japanese Patent Application No. 2006-354851 (with English translation).

(Continued)

*Primary Examiner* — Allison P Bernstein
(74) *Attorney, Agent, or Firm* — Oblon, McClelland, Maier & Neustadt, L.L.P.

(57) ABSTRACT

A nonvolatile semiconductor memory includes a cell unit having a select gate transistor and a memory cell connected in series, a select gate line connected to the select gate transistor, and a word line connected to the memory cell. One end of the word line is bent to the select gate line side, and a fringe is connected between a bent point and a distal end of the word line.

20 Claims, 56 Drawing Sheets

Related U.S. Application Data continuation of application No. 12/683,499, filed on Jan. 7, 2010, now abandoned, which is a division of application No. 11/764,416, filed on Jun. 18, 2007, now Pat. No. 7,671,475.

(51) Int. Cl.
  *G11C 5/06* (2006.01)
  *G11C 16/04* (2006.01)

(56) References Cited

U.S. PATENT DOCUMENTS

| | | | |
|---|---|---|---|
| 6,891,262 B2 | 5/2005 | Nomoto et al. | |
| 7,244,984 B2 | 7/2007 | Kamigaichi et al. | |
| 7,825,439 B2 | 11/2010 | Izumi et al. | |
| 2002/0064898 A1 | 5/2002 | Adachi et al. | |
| 2007/0141780 A1 | 6/2007 | Higashitani | |
| 2007/0290232 A1 | 12/2007 | Nishiyama | |
| 2008/0099819 A1 | 5/2008 | Kito et al. | |
| 2010/0270606 A1* | 10/2010 | Kutsukake et al. | 257/316 |
| 2012/0241834 A1* | 9/2012 | Nakajima et al. | 257/316 |
| 2013/0237051 A1* | 9/2013 | Kikutani et al. | 438/622 |

FOREIGN PATENT DOCUMENTS

| | | |
|---|---|---|
| JP | 2003-168750 | 6/2003 |
| JP | 2006-245539 | 9/2006 |
| KR | 1988-028191 | 7/1998 |

OTHER PUBLICATIONS

Office Action issued Oct. 4, 2011 in Japanese Patent Application No. 2006-354851 (with English translation).

\* cited by examiner

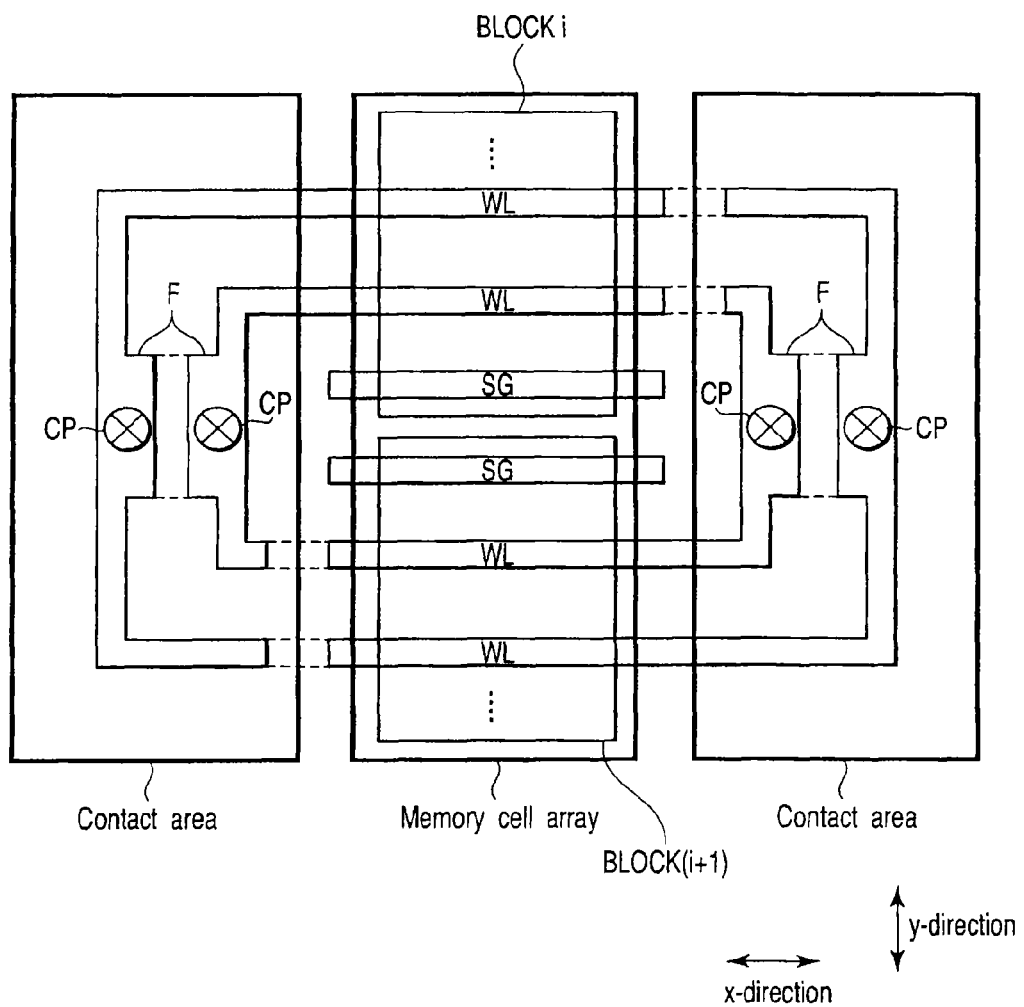
F I G. 1

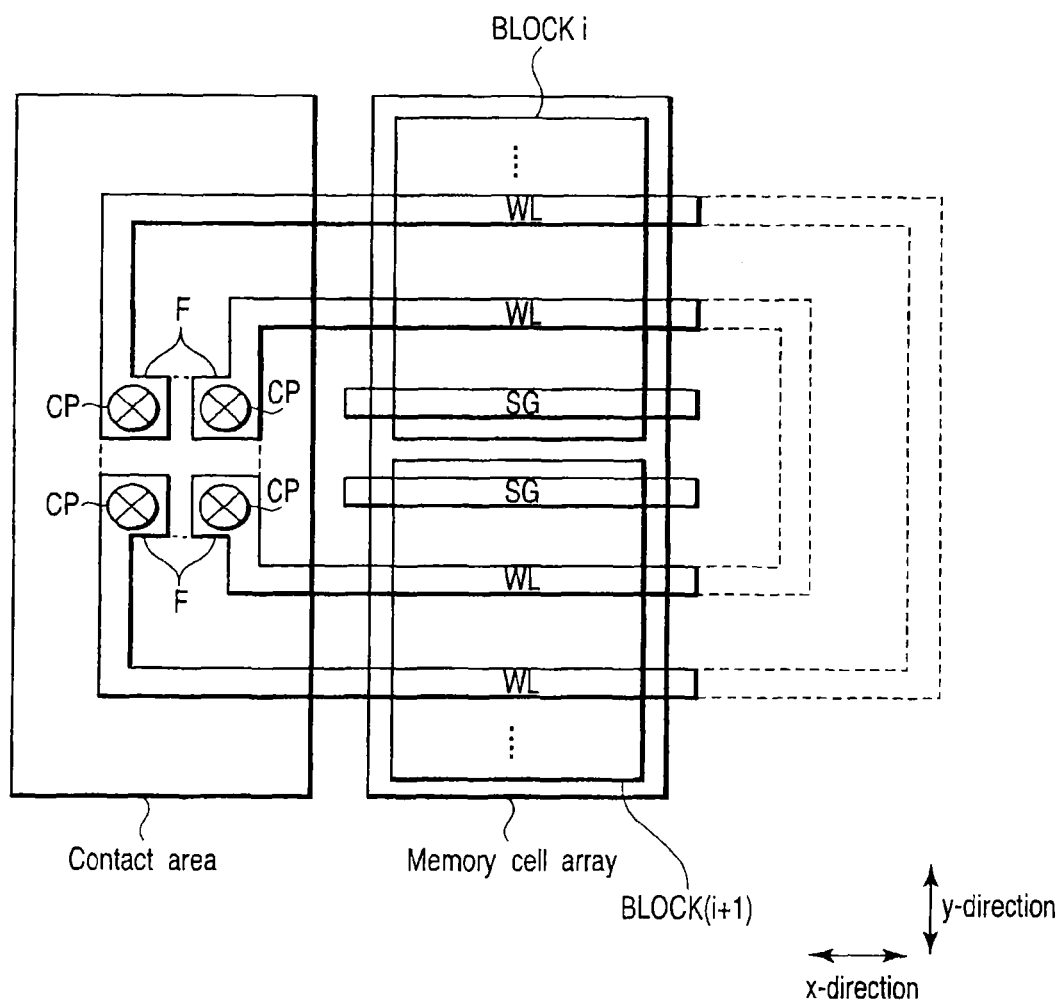
F I G. 2

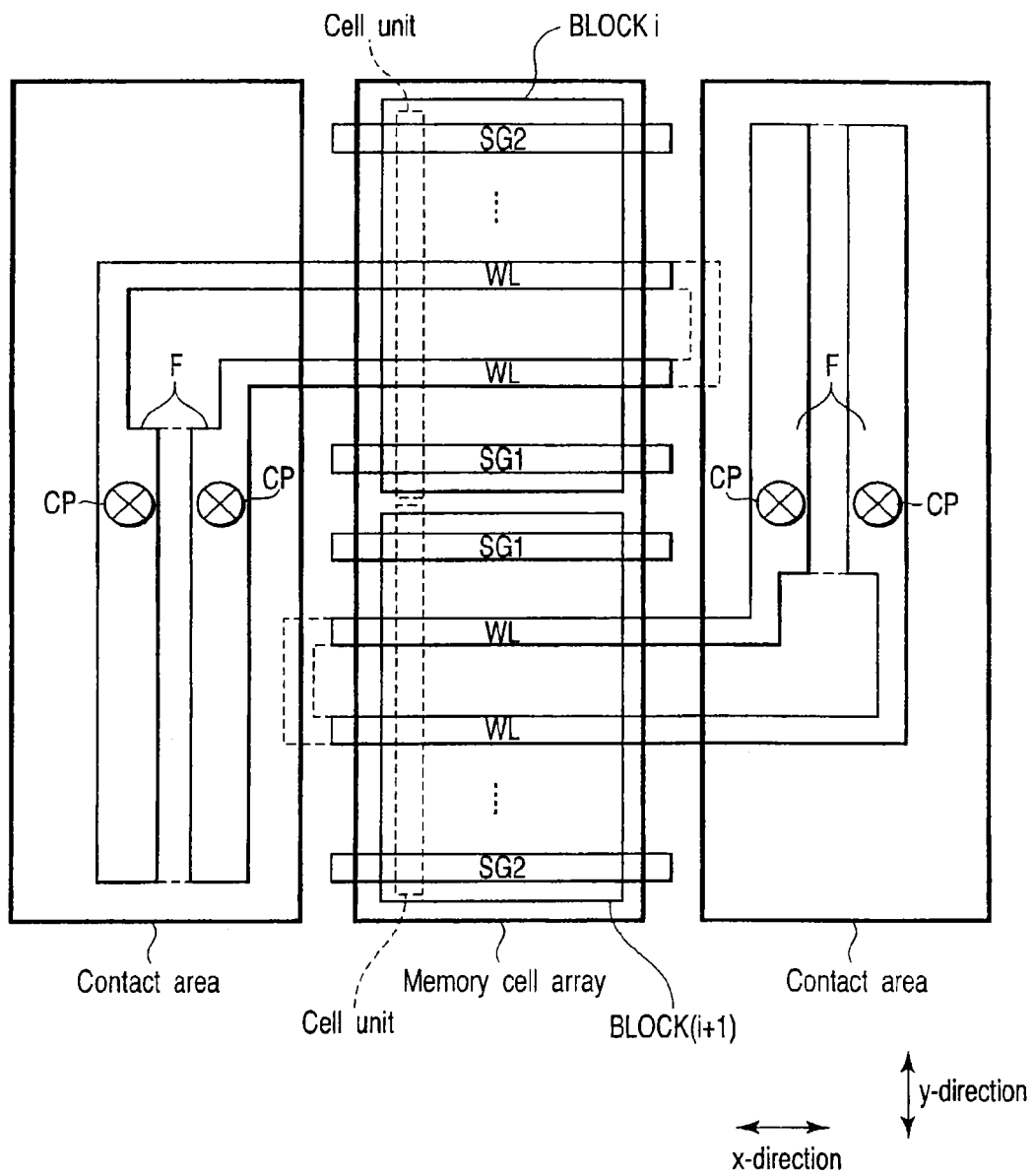
F I G. 3

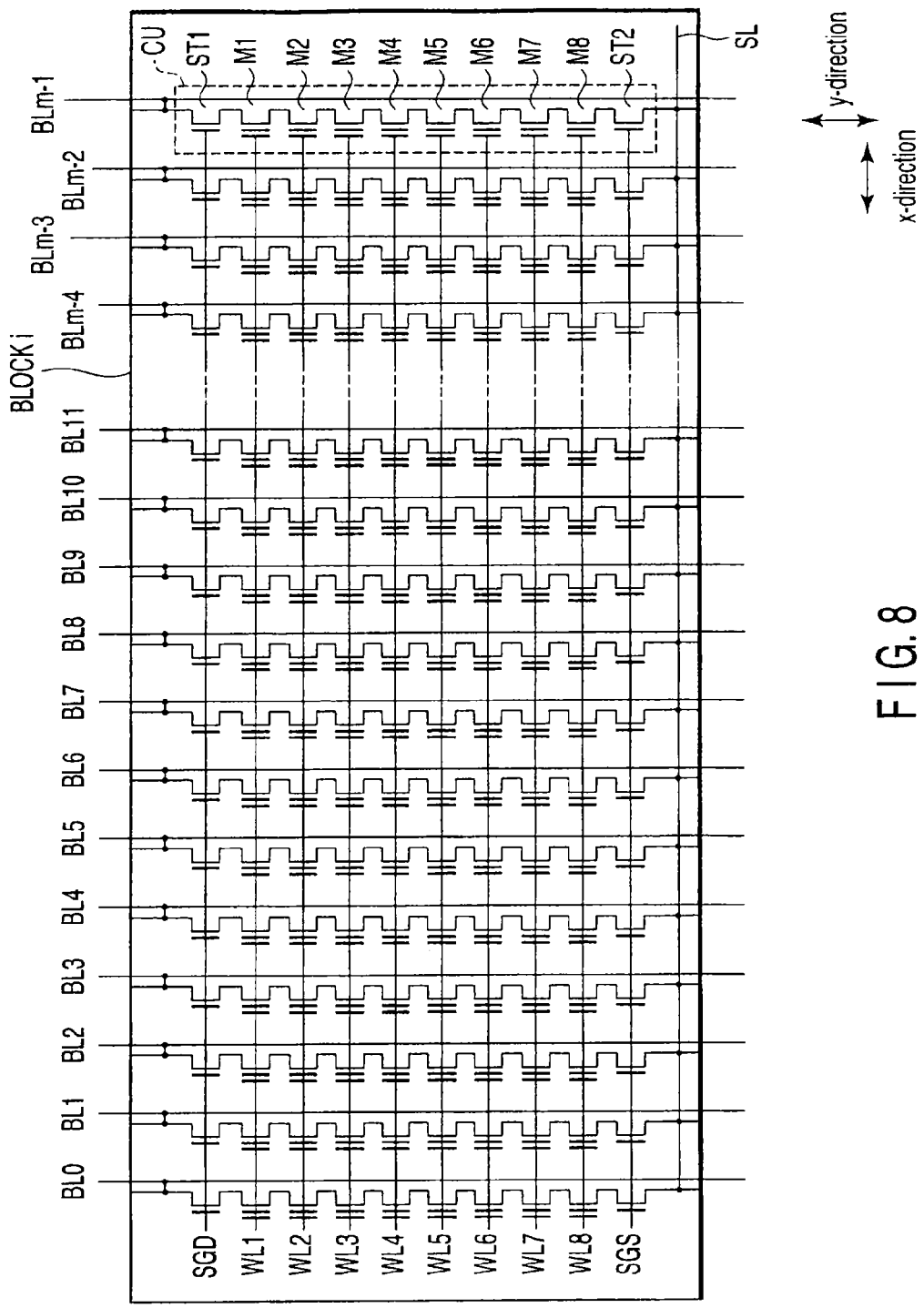
F I G. 8

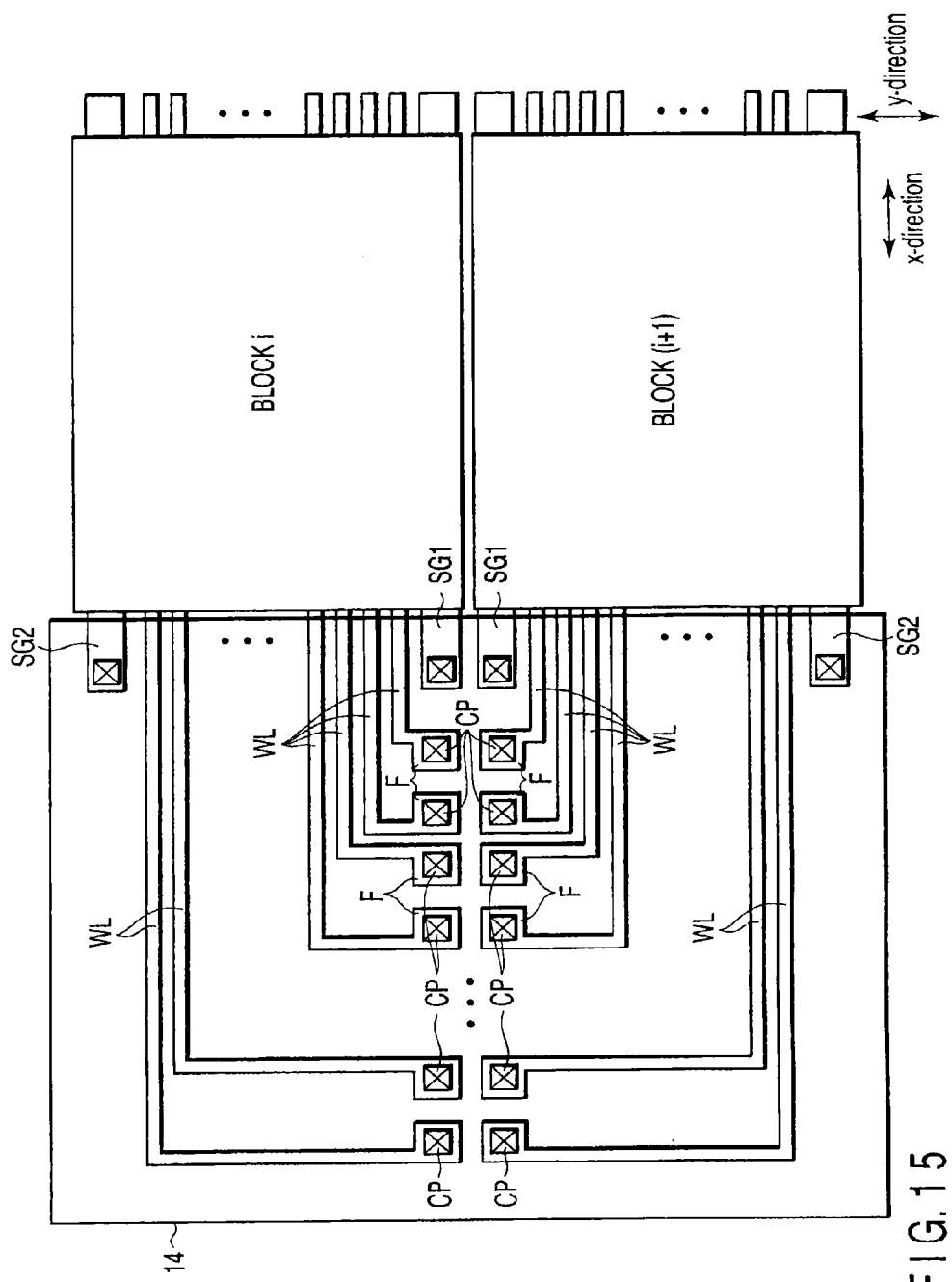
F I G. 15

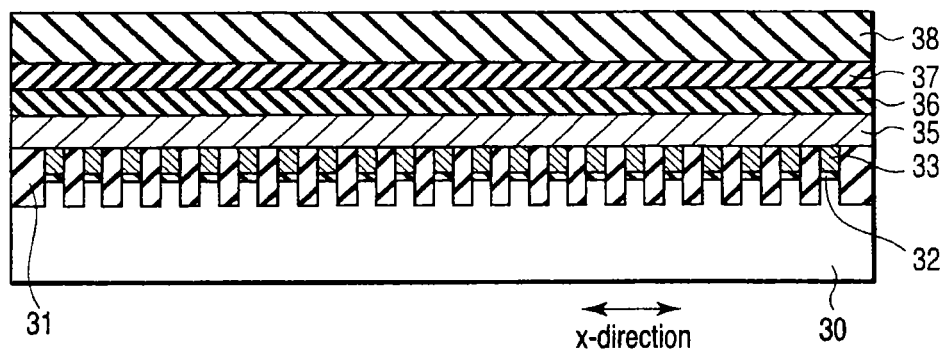
F I G. 2 1
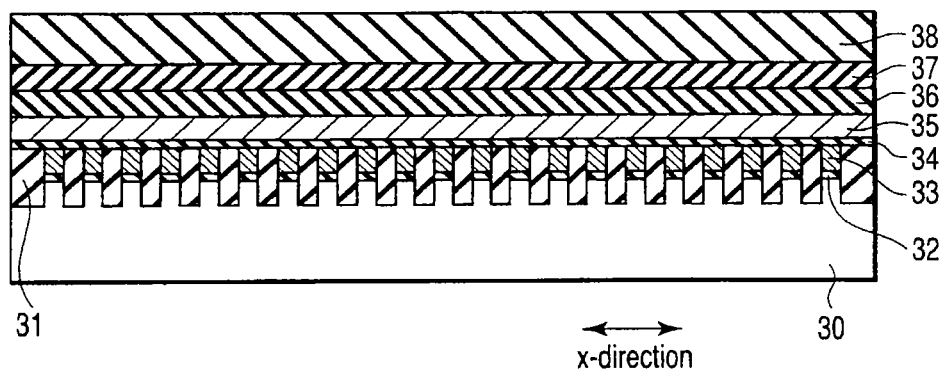
F I G. 2 2

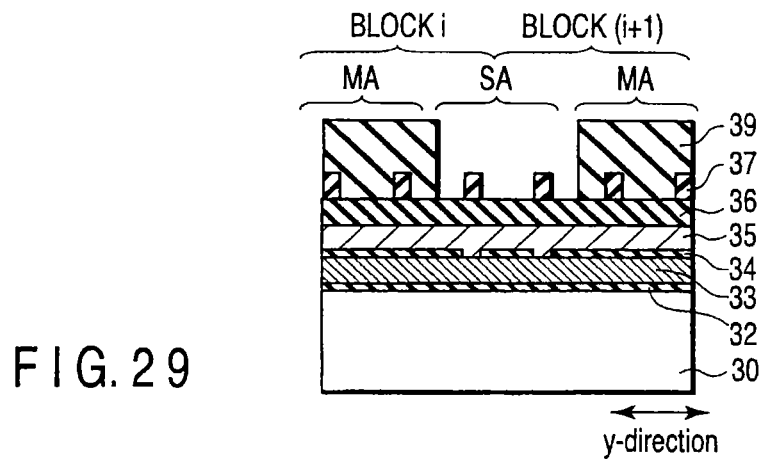
F I G. 29
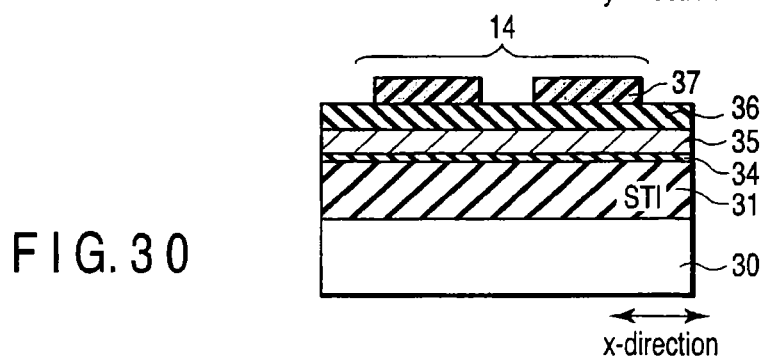
F I G. 30
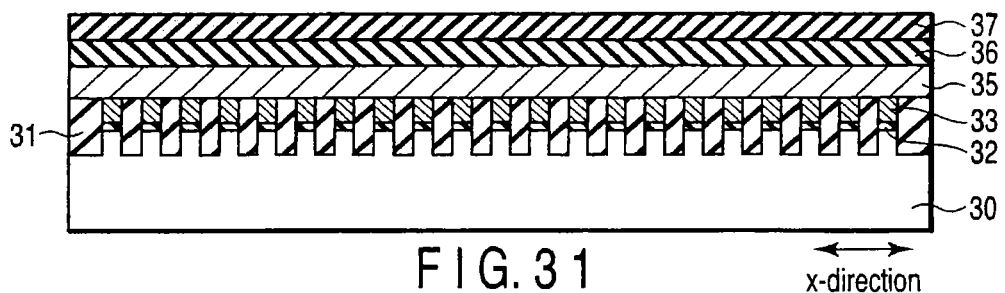
F I G. 31
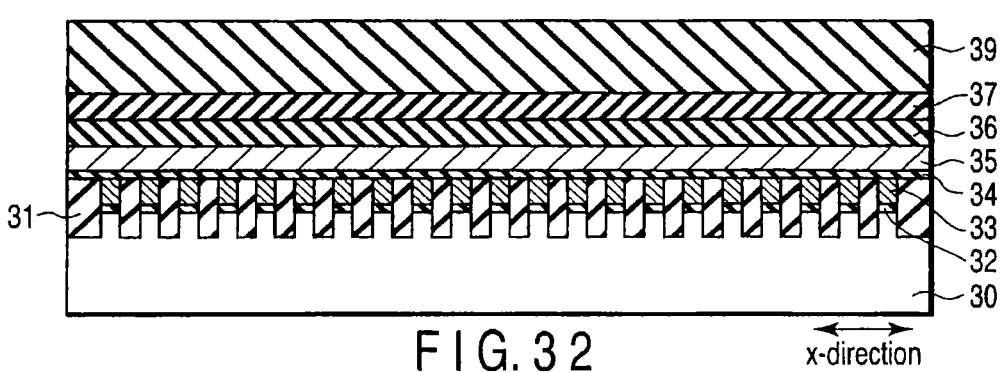
F I G. 32

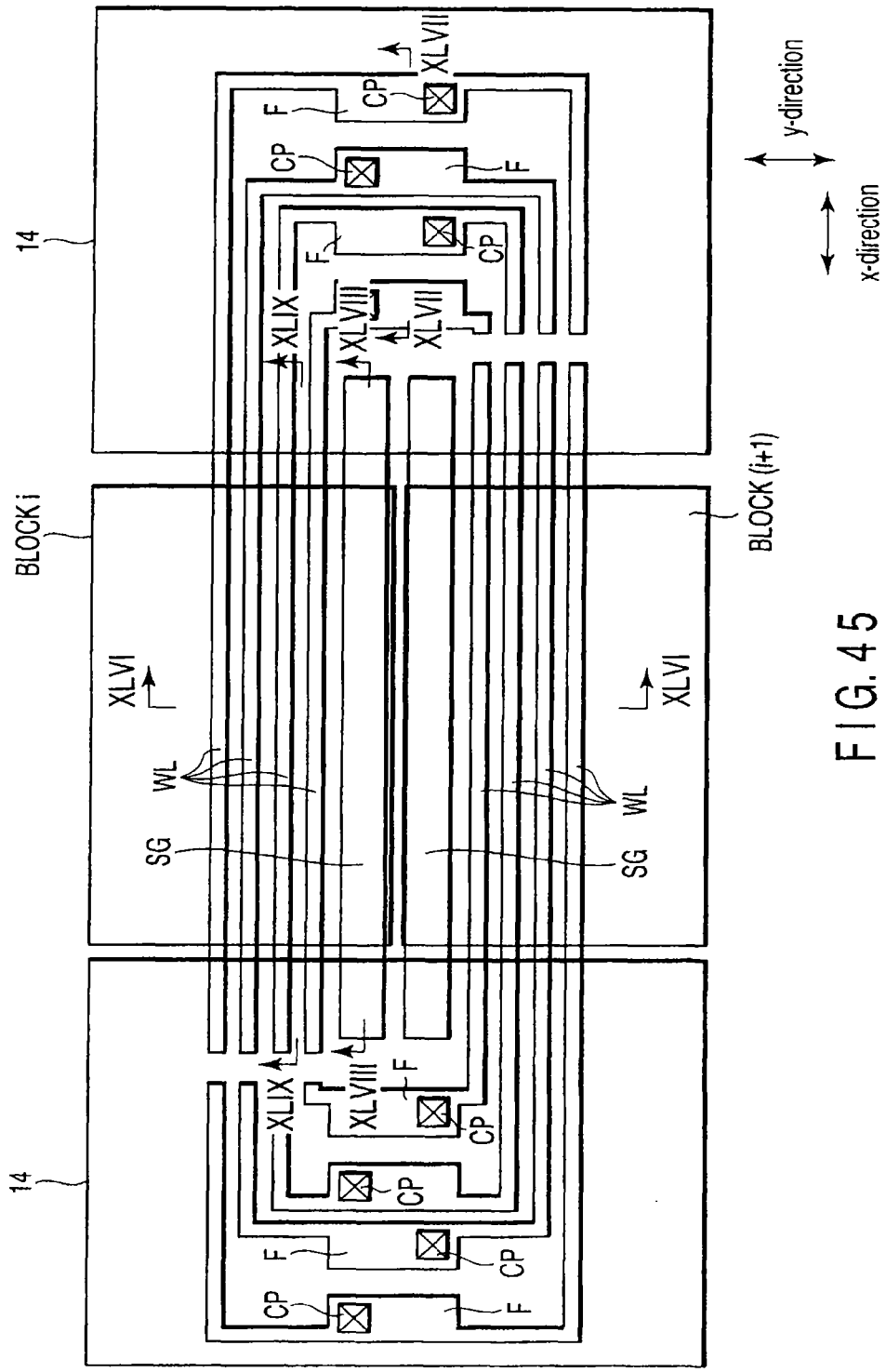
F I G. 45

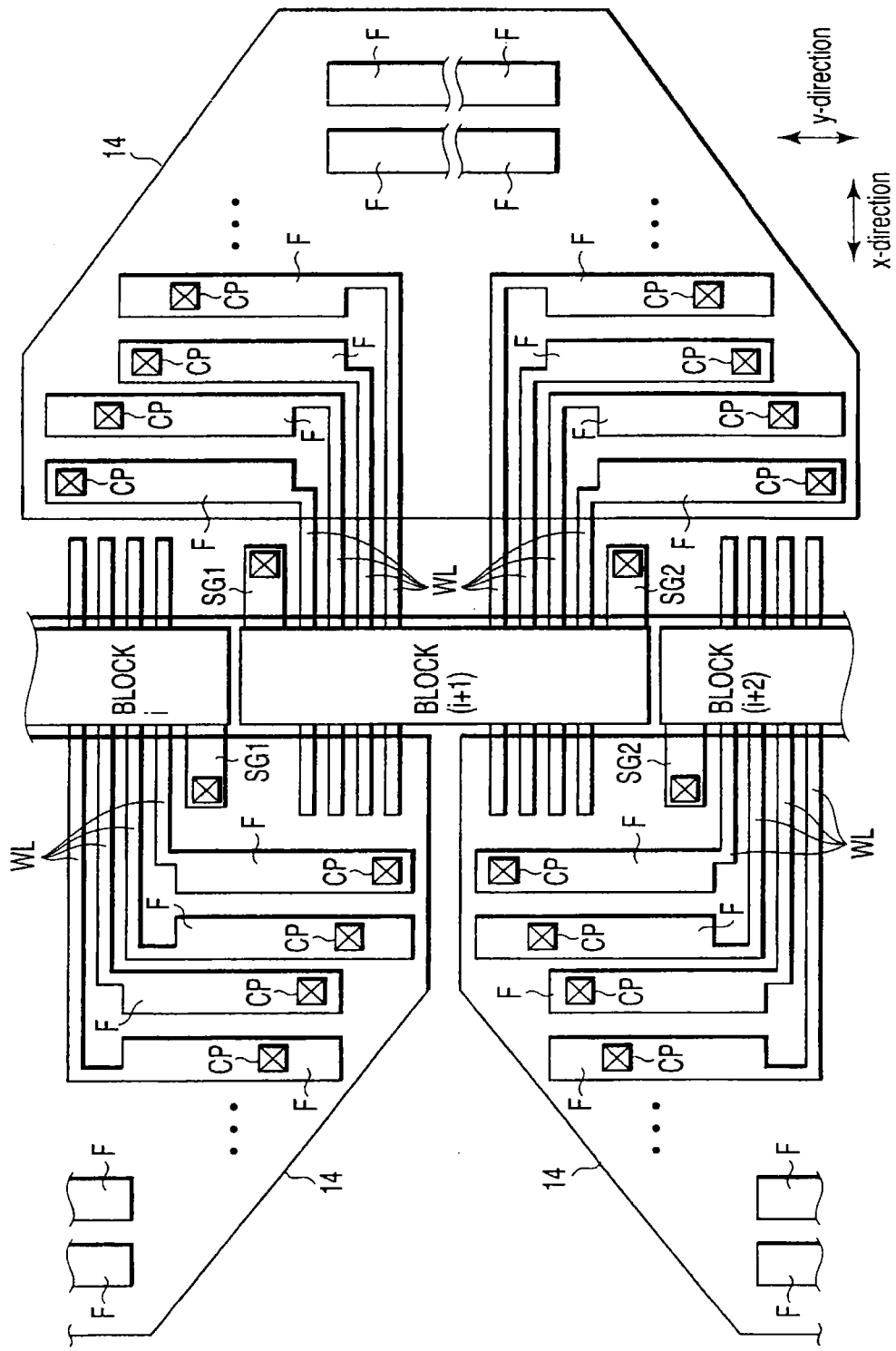
F I G. 59

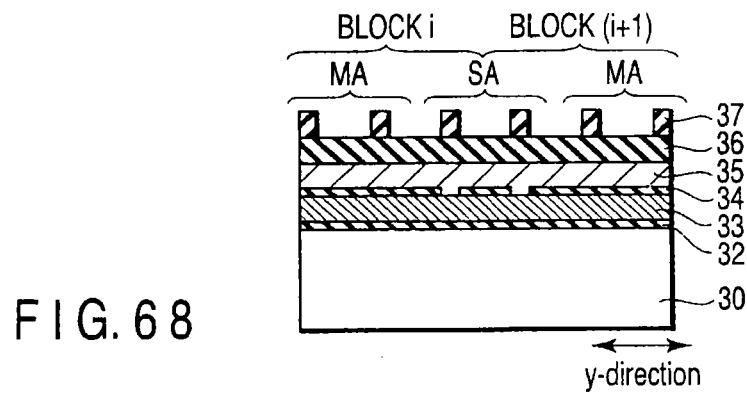
F I G. 68
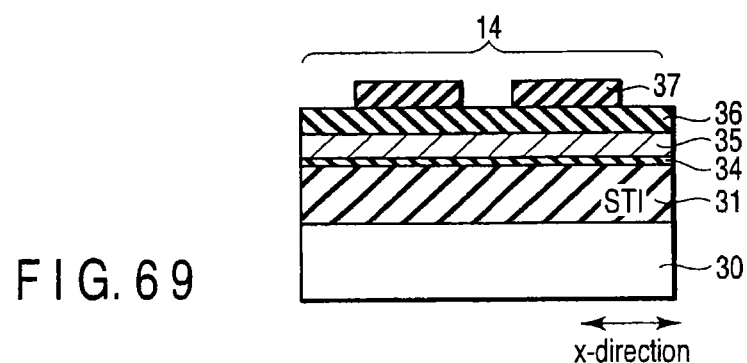
F I G. 69
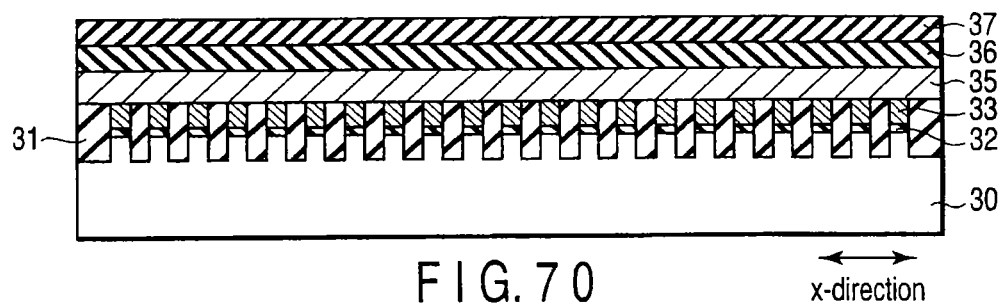
F I G. 70
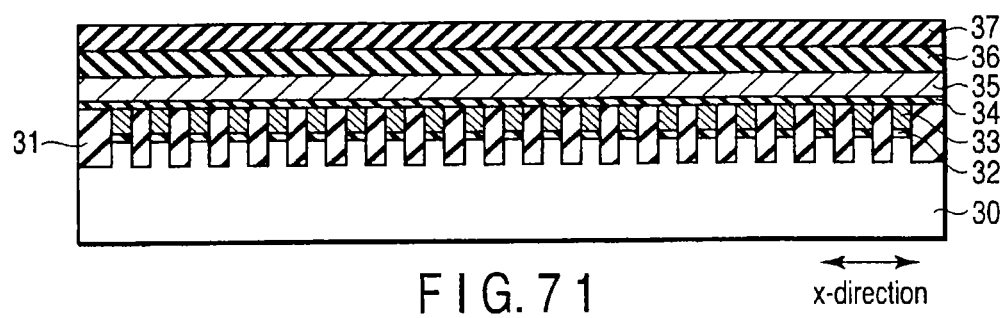
F I G. 71

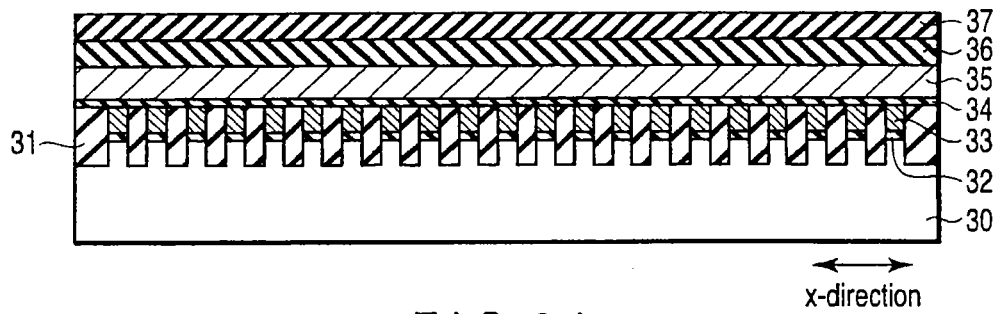
F I G. 81
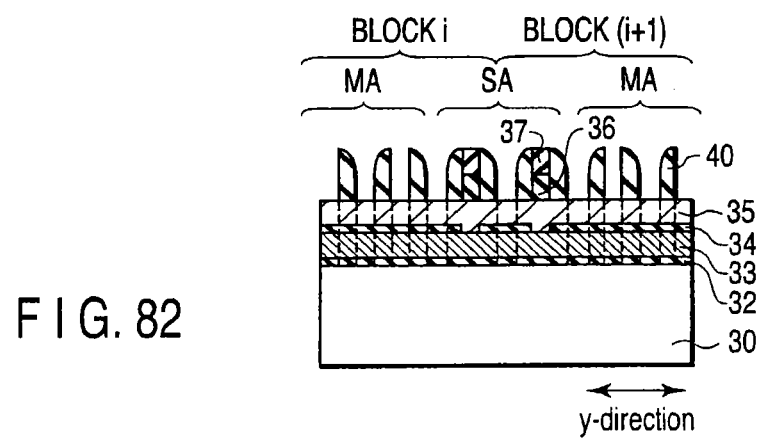
F I G. 82
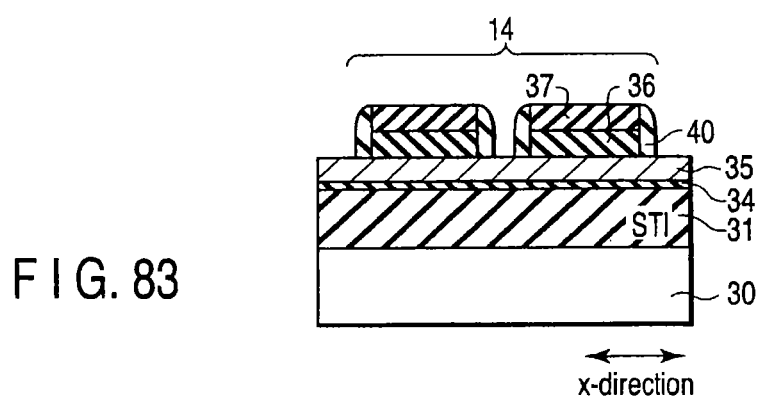
F I G. 83

NONVOLATILE SEMICONDUCTOR MEMORY HAVING A WORD LINE BENT TOWARDS A SELECT GATE LINE SIDE

CROSS-REFERENCE TO RELATED APPLICATIONS

This application a continuation of U.S. application Ser. No. 13/935,637, filed Jul. 5, 2013, which is a continuation of U.S. application Ser. No. 13/427,061, filed Mar. 22, 2012, now U.S. Pat. No. 8,497,582, which is a continuation of U.S. application Ser. No. 12/683,499, filed Jan. 7, 2010, now abandoned, which is a divisional of U.S. application Ser. No. 11/764,416, filed Jun. 18, 2007, now U.S. Pat. No. 7,671,475, and is based upon and claims the benefit of priority from prior Japanese Patent Applications No. 2006-176799, filed Jun. 27, 2006, and No. 2006-354851, filed Dec. 28, 2006, the entire contents of each of which are incorporated herein by reference.

BACKGROUND OF THE INVENTION

1. Field of the Invention

The present invention relates to a layout of word lines of a nonvolatile semiconductor memory.

2. Description of the Related Art

A nonvolatile semiconductor memory, in particular, a NAND cell type flash memory has been recently used as a main memory of a variety of electronic devices such as a portable audio device by utilizing features such as large capacity and nonvolatile properties.

Under such a circumstance, in the NAND cell type flash memory, in addition to improvement of its function, further increasing its capacity is a problem to be solved.

In order to achieve a NAND cell type flash memory with a large capacity, promoting downsizing of memory cells is the simplest method, whereas there exists an obstacle associated with the minimum processing dimension of a resist in an exposure device in order to downsize the memory cells.

For example, a size F (future size) of the memory cells in a direction parallel to a NAND string is determined by half of pitches of word lines (half pitches), whereas the half pitches generally cannot be smaller than the minimum processing dimension.

Therefore, a downsizing processing technique to achieve a size smaller than the minimum processing dimension from the viewpoint of process is proposed in each of document 1 (Jpn. Pat. Appln. KOKAI Publication No. 5-88375) and document 2 (Jpn. Pat. Appln. KOKAI Publication No. 8-55920).

This downsizing processing technique is featured in that an undercoat is processed using a side wall as a mask.

However, only forming a line & space pattern is disclosed in document 1, and there is no discussion of actually applying this pattern forming to a nonvolatile semiconductor memory. That is, in the downsizing processing technique utilizing the side wall, even if a line & space pattern can be formed, a contact hole cannot be formed.

Therefore, even if a fine line & space pattern has been formed, a contact cannot be brought about with respect to each pattern. Thus, for example, word lines of the nonvolatile semiconductor memory cannot be provided.

In contrast, in document 2, there is proposed a downsizing processing technique that presumes application to word lines. According to this technique, word lines are processed using a side wall as a mask and fringes are alternately formed at both ends of the word lines, thereby allocating a contact area relevant to the word lines.

However, in such a layout, the fringes are directly connected to both ends of the word lines, thus making it difficult to form fringes of sufficient size. In addition, even if the fringes are alternately connected to both ends of the word lines, and further, the fringes at one end of the word lines have been laid out in a zigzag manner, the size of the fringe is still influenced by the pitches of the word lines.

Therefore, as the pitches of the word lines become narrow, a fringe having a sufficient size cannot be formed. In addition, there occurs a problem associated with an increase in contact resistance when an alignment shift between the fringe and the contact hole occurs or short circuit between the adjacent word lines in the worst case.

BRIEF SUMMARY OF THE INVENTION

A nonvolatile semiconductor memory according to an aspect of the present invention comprises a cell unit having a select gate transistor and a memory cell connected in series in a first direction, a select gate line extending in a second direction that crosses the first direction and connected to the select gate transistor, and a word line extending in the second direction and connected to the memory cell, wherein one end of the word line is bent to the select gate line side, and a contact plug is connected between a bent point and a distal end thereof.

BRIEF DESCRIPTION OF THE SEVERAL VIEWS OF THE DRAWING

FIG. 1 is a view showing an outline of a word line layout according to an example of the present invention;

FIG. 2 is a view showing an outline of a word line layout according to an example of the present invention;

FIG. 3 is a view showing an outline of a word line layout according to an example of the present invention;

FIG. 8 is a view showing cell units in one block;

FIG. 15 is a detailed view showing a contact area;

FIG. 21 is a sectional view taken along the line XXI-XXI of FIG. 18;

FIG. 22 is a sectional view taken along the line XXII-XXII of FIG. 18;

FIG. 29 is a sectional view taken along the line XXIX-XXIX of FIG. 28;

FIG. 30 is a sectional view taken along the line XXX-XXX of FIG. 28;

FIG. 31 is a sectional view taken along the line XXXI-XXXI of FIG. 28;

FIG. 32 is a sectional view taken along the line XXXII-XXXII of FIG. 28;

FIG. 45 is a plan view showing one process in a method for manufacturing a nonvolatile semiconductor memory;

FIG. 59 is a detailed view showing a contact area;

FIG. 68 is a sectional view taken along the line LXVIII-VXVIII of FIG. 67;

FIG. 69 is a sectional view taken along the line LXIX-LXIX of FIG. 67;

FIG. 70 is a sectional view taken along the line LXX-LXX of FIG. 67;

FIG. 71 is a sectional view taken along the line LXXI-LXXI of FIG. 67;

FIG. 81 is a sectional view taken along the line LXXXI-LXXXI of FIG. 77;

FIG. 82 is a sectional view taken along the line LXXVIII-LXXVIII of FIG. 77;

FIG. 83 is a sectional view taken along the line LXXIX-LXXIX of FIG. 77;

DETAILED DESCRIPTION OF THE INVENTION

A nonvolatile semiconductor memory of an aspect of the present invention will be described with reference to the accompanying drawings.

1. Outline

In an example of the present invention, there is proposed a word line layout for bringing a contact with a word line, for example, without any problem associated with an increase in contact resistance or short-circuit of the adjacent word lines, in the case where a downsizing processing technique of forming a finer pattern than a resolution limit of lithography has been applied to processing of word lines of a nonvolatile semiconductor memory.

The layout, as shown in FIGS. 1 to 4, for example, is such that one end of a word line is bent to a select gate line side, and a contact plug (contact hole) is connected to a point selected from an area from a bent point to a distal end.

According to such a layout, the contact plug can achieve reduction of a contact resistance and prevention of short-circuit of word lines because its position, size, and further inter-pitches can be freely adjusted in a two-dimensional manner (x-direction and y-direction) in a contact area at one end of a memory cell array.

In addition, a fringe can be connected to a word line without being influenced by pitches of word lines. That is, a fringe position, a size, and further, inter-pitches can be freely adjusted in the same manner as in the contact plug.

In particular, in the layout disclosed in document 2, i.e., in the layout for adjusting a fringe position only in a one-dimensional manner in a direction in which word lines extend (x-direction), the fringe position and size are influenced by pitches of word lines. Thus, in terms of this point as well, it is evident that an advantageous effect obtained by the example of the present invention is significant.

Figure 4:
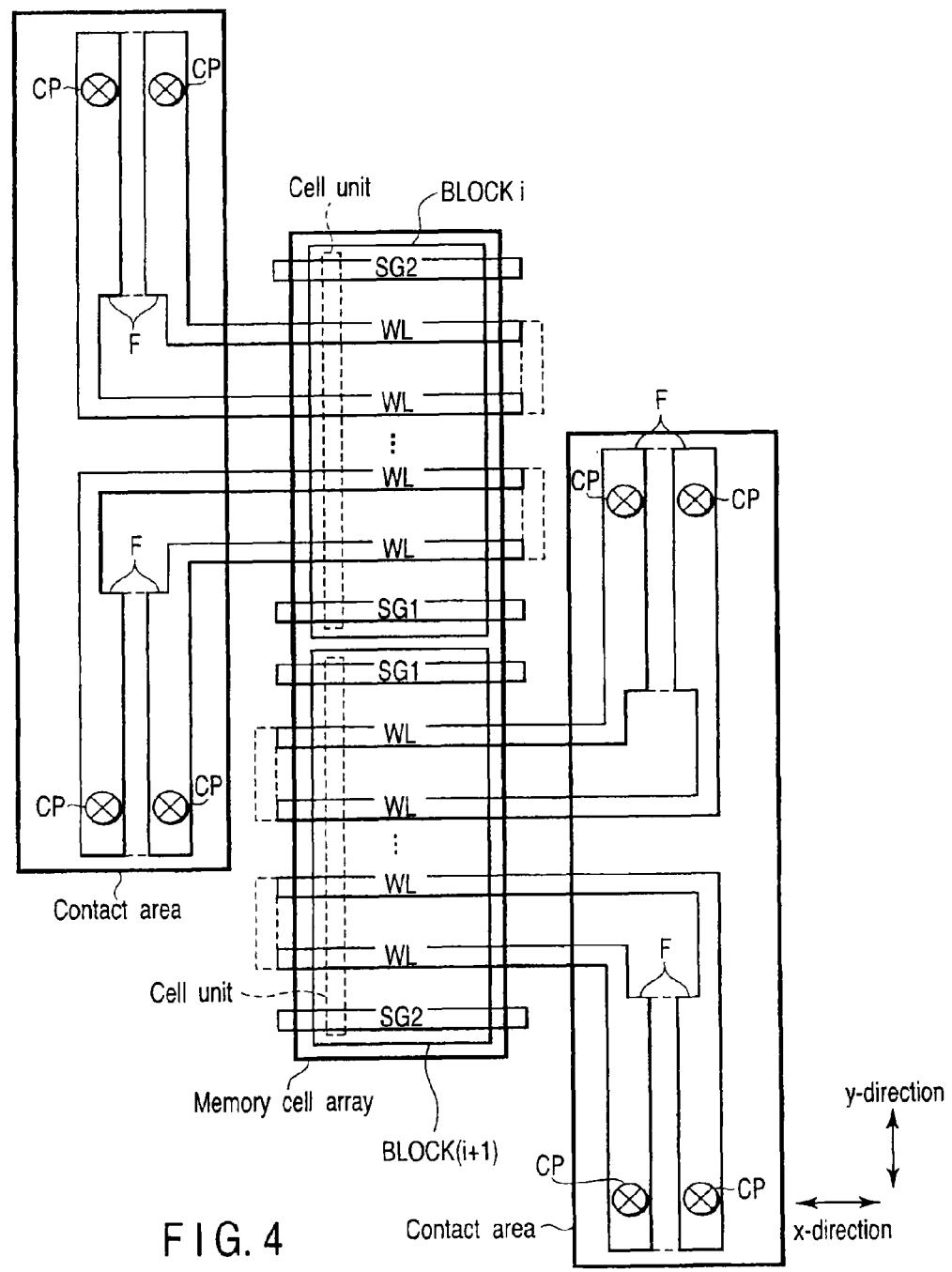
FIG. 4 is a view showing an outline of a word line layout according to an example of the present invention.

Specifically, in the example of the present invention, there are proposed: a layout of providing contact areas respectively on both ends of a memory cell array as shown in FIGS. 1, 3, and 4; and a layout of providing a contact area on one end of the memory cell array as shown in FIG. 2.

In the layout of FIG. 1, word lines WL have a loop shape that multiply surrounds a select gate line SG. Such a shape is referred to as a closed loop shape.

Due to this closed loop shape, in a contact area at one end in the x-direction of the memory cell array, an end of each of a plurality of word lines WL in a block BLOCKi is bent to the select gate line SG side (in the x-direction and downwardly). Then, a fringe F is provided between the bent point and its distal end, and a contact plug CP is connected to that fringe F.

In addition, in a contact area at the other end in the x-direction of the memory cell array, an end of each of a plurality of word lines WL in a block BLOCK (i+1) is bent to the select gate line SG side (in the y-direction and upwardly). Then, a fringe F is provided between the bent point and its distal end, and then, a contact plug CP is connected to that fringe F.

The word lines WL in the blocks BLOCKi and BLOCK (i+1) are separated from each other in an area other than a memory cell array, and their respective independencies are allocated. The dotted line portion indicates a site to be cut.

A fringe F of a first word line WL from a select gate line SG and a fringe F of a second word line WL are separated from each other by means of slits in the longitudinal direction (y-direction).

In the layout of FIG. 2, word lines WL have a loop shape that multiply surrounds a select gate line SG in part. Such a shape is referred to as a partial loop shape.

Due to this partial loop shape, in a contact area at one end in the x-direction of a memory cell array, an end of each of a plurality of word lines WL in blocks BLOCKi and BLOCK (i+1) is bent to the select gate line SG side (in the y-direction and downwardly/upwardly). Then, a fringe F is provided between the bent point and its distal end, and then, a contact plug CP is connected to that fringe F.

The word lines WL in the blocks BLOCKi and BLOCK (i+1) are separated from each other in an area other than a memory cell array, and their respective independencies are allocated. The dotted line portion indicates a site to be cut.

A contact area is not disposed at the other end in the x-direction of the memory cell array. The other end is set free. In this case, the layout at the other end in the x-direction of the memory cell array can be made clear. In addition, in order to allocate independency of word lines WL, a fringe F of a first word line WL and a fringe F of a second word line WL from a select gate line SG are separated from each other by means of cross slits (in the x-direction and y-direction).

While the layout of FIG. 3 is a modification of the layout of FIG. 1, a closed loop shape is not formed. This layout is featured in that the size in the y-direction of the fringe F can be made larger than that in the layout of FIG. 1, and in that the degree of freedom in positioning of a contact plug CP can be improved.

According to this layout, in the contact area at one end in the x-direction of the memory cell array, an end of each of a plurality of word lines WL in a block BLOCKi is bent to the select gate line SG1 side (in the y-direction and downwardly). Then, a fringe F is provided between the bent point and its distal end, and then, a contact plug CP is connected to that fringe F.

The distal end of each of a plurality of word lines WL in the block BLOCKi can be maximally extended to an end of the block BLOCK (i+1) at the opposite side to a site at which the select gate line SG1 is to be disposed (at a side at which a select gate line SG2 is to be disposed).

The position of the distal end of each of a plurality of word lines WL in the block BLOCKi can be freely set in the above range. That is, the position of the distal end may not extend to an end of the block BLOCK (i+1), and the positions of the distal end of all the word lines WL may not be identical to one another.

In addition, in a contact area at the other end in the x-direction of the memory cell array, an end of each of a plurality of word lines WL in the block BLOCK (i+1) is bent to the select gate line SG1 side (in the y-direction, upwardly). Then, a fringe F is provided between the bent point and its distal end, and then, a contact plug CP is connected to that fringe F.

The distal end of each of a plurality of word lines WL in the block BLOCK (i+1) can be maximally extended to an end of the block BLOCKi at the opposite side to a site at which a select gate line SG1 is to be disposed (at a side at which a select gate line SG2 is to be disposed).

The position of the distal end of each of a plurality of word lines WL in the block BLOCK (i+1) can be freely set in the above range. That is, the position of the distal end may not extend to the end of the block BLOCKi, and the positions of the distal ends of all the word lines WL may not be identical to one another.

The word lines WL in the block BLOCKi and BLOCK (i+1) are separated from each other in an area other than the memory cell array, and then, their respective independencies are allocated. The dotted line portion indicates a site to be cut.

A fringe F of a first word line WL and a fringe F of a second word line WL from the select gate line SG1 are separated from each other by means of slits in the vertical direction (y-direction).

While the layout of FIG. 4 is also a modification of the layout of FIG. 1, a closed loop shape is not formed. This layout is featured in that a plurality of word lines in one block BLOCKi are divided into two groups, and then, directions in which word lines are bent are differentiated from each other between these two groups.

In this case, the size in the y-direction of the fringe F can be made larger than that in the layout of FIG. 1 and the degree of freedom in position of a contact plug CP can be improved. In addition, the size in the x-direction of a contact area can be made smaller than that in the layout of FIG. 3.

According to these layouts, in the contact area at one end in the x-direction of the memory cell array, an end of at least one word line at the select gate line SG1 side among a plurality of word lines WL in a block BLOCKi (for example, half word line at the select gate line SG1 side) is bent to the select gate line SG1 side (in the y-direction and downwardly). In addition, an end of at least one word line of the select gate line SG2 side among a plurality of word lines WL in the block BLOCKi (half word line at the select gate line SG2 side, for example) is bent to the select gate line SG2 side (in the y-direction and upwardly).

Then, a fringe F is provided between the bent point and its distal end, and a contact plug CP is connected to that fringe F.

A distal end of at least one word line of the select gate line SG1 side among a plurality of word lines WL in the block BLOCKi can be maximally extended up a center part in the y-direction of the block BLOCK (i+1).

The position of the distal end of at least one word line at the select gate line SG1 side can be freely set in the above range. That is, the position of the distal end may not extend to the center part in the y-direction of the block BLOCK (i+1), and the positions of the distal ends of all the word lines WL may not be identical to one another.

In addition, in the contact area at the other end in the x-direction of the memory cell array, an end of at least one word line at the select gate line SG1 side among a plurality of word lines WL in the block BLOCK (i+1) (half word line at the select gate line SG1 side, for example) is bent to the select gate line SG1 side (in the y-direction and upwardly). An end of at least one word line at the select gate line SG2 side among a plurality of word lines WL in the block BLOCK (i+1) is bent to the select gate line SG2 side (in the y-direction and downwardly).

Then, a fringe F is provided between the bent point and its distal end, and then, a contact plug CP is connected to that fringe F.

A distal end of at least one word line at the select gate line SG 1 side among a plurality of word lines WL in the block BLOCK (i+1) can be maximally extended to the center part in the y-direction of the block BLOCKi.

The position of the distal end of at least one word line at the select gate line SG1 side can be freely set in the above range. That is, the position of the distal end may not extend to the center part in the y-direction of the block BLOCKi, and the positions of the distal ends of all the word lines WL may not be identical to one another.

The word lines WL in the block BLOCKi and BLOCK (i+1) are separated from each other in an area other than the memory cell array, and their respective independencies are allocated. The dotted line portion indicates a site to be cut.

A fringe F of a first word line and a fringe F of a second word line from a select gate line SG1 or a select gate line SG2 are separated from each other by means of slits in the vertical direction (y-direction).

2. Embodiments

Some embodiments considered to be best will be described here.

A description will be given by way of example of a NAND cell type flash memory that is significant in the downsizing of memory cells.

(1) Overview

Figure 5:
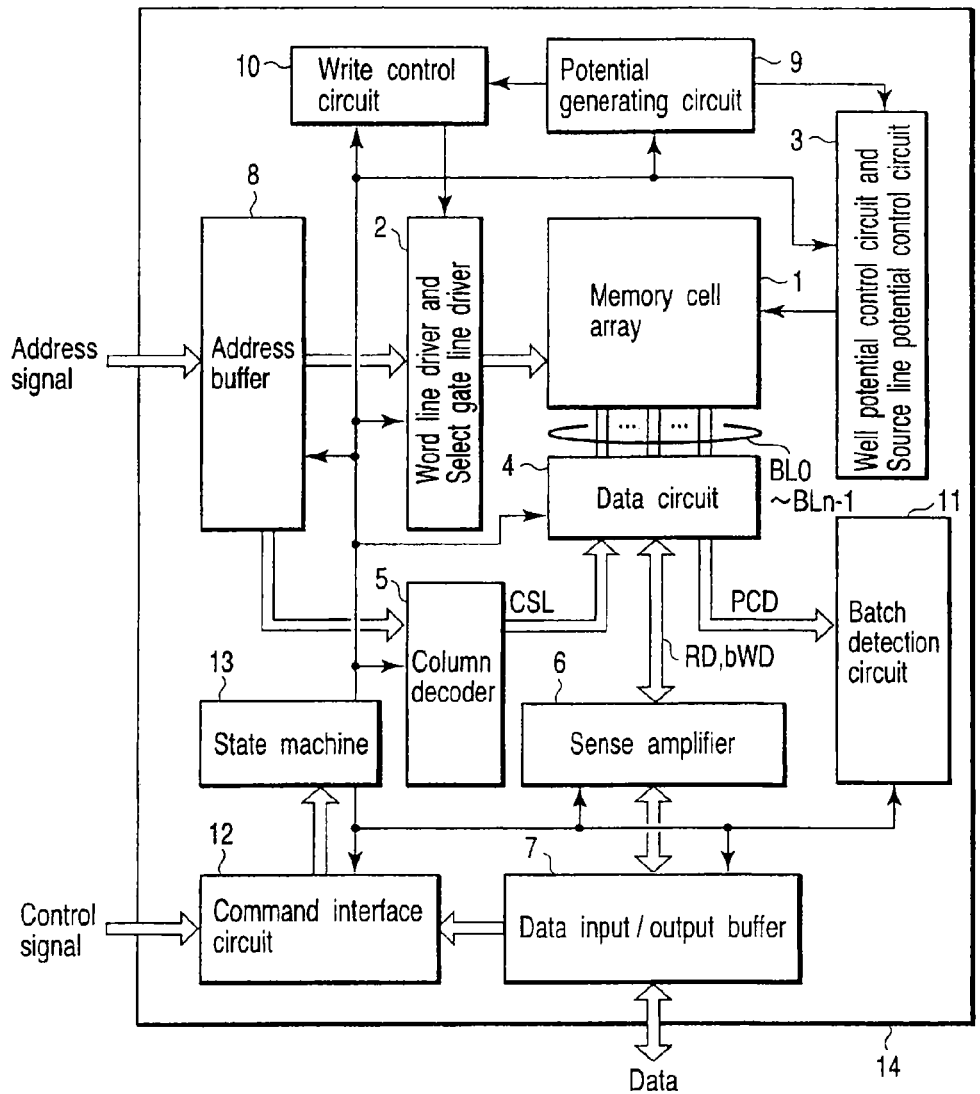
FIG. 5 is a view showing a NAND cell type flash memory.

FIG. 5 shows essential portions of a NAND cell type flash memory.

A memory cell array 1 has a cell unit comprised a plurality of memory cells connected in series and two select gate transistors connected on a one by one basis on both ends thereof.

Word line/select gate line drivers 2 are connected to word lines and select gate lines in the memory cell array 1. A well/source line potential control circuit 3 controls an electric potential of a well region and an electric potential of a source line in the memory cell array 1.

A data circuit 4 has a function of temporarily storing data. For example, at the time of programming, program data for one page is stored in a latch circuit incorporated in the data circuit 4. At the time of reading, read data for one page is stored in a latch circuit incorporated in the data circuit 4.

A column decoder 5 selects a column of the memory cell array 1 in response to a column address signal.

A sense amplifier 6 senses read data. A data input/output buffer 7 serves as an interface of data input/output. An address buffer 8 serves as a row/column address signal input buffer.

A potential generating circuit 9 generates a write electric potential and a transfer electric potential at the time of programming. The write electric potential and the transfer electric potential are inputted to a write control circuit 10. The write control circuit 10 controls a write condition relevant to a selected cell targeted for writing in the cell unit.

A row address signal is inputted to the word line/select gate line driver 2 via the address buffer 8. A column address signal is inputted to the column decoder 5 via the address buffer 8.

A batch detection circuit 11 verifies whether or not data has been precisely written in a selected memory cell based on a detection signal PCD outputted from the data circuit 4 at the time of programming.

A command interface circuit 12 judges whether or not the data inputted to the data input/output buffer 7 is command data based on a control signal generated by a chip (for example, host microcomputer) other than a memory chip 14.

In the case where the data inputted to the data input/output buffer 7 is command data, the command interface circuit 12 transfers the command data to a state machine 13.

The state machine 13 determines an operating mode of a flash memory based on the command data and controls a whole operation of the flash memory in response to its operating mode.

(2) Memory Cell Array

Figure 6:
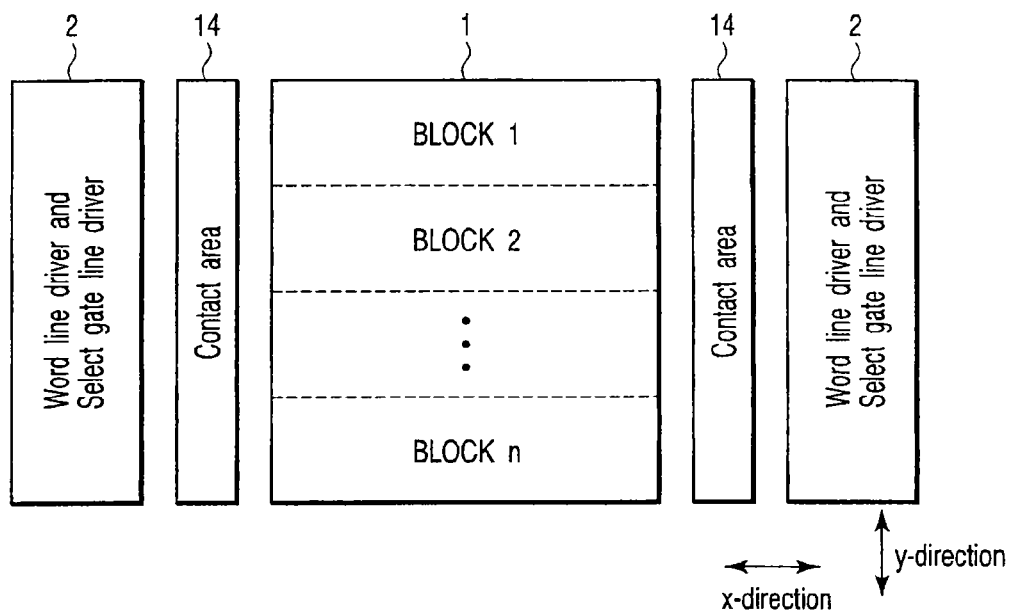
FIG. 6 is a view showing a layout in the vicinity of a memory cell array.
Figure 7:
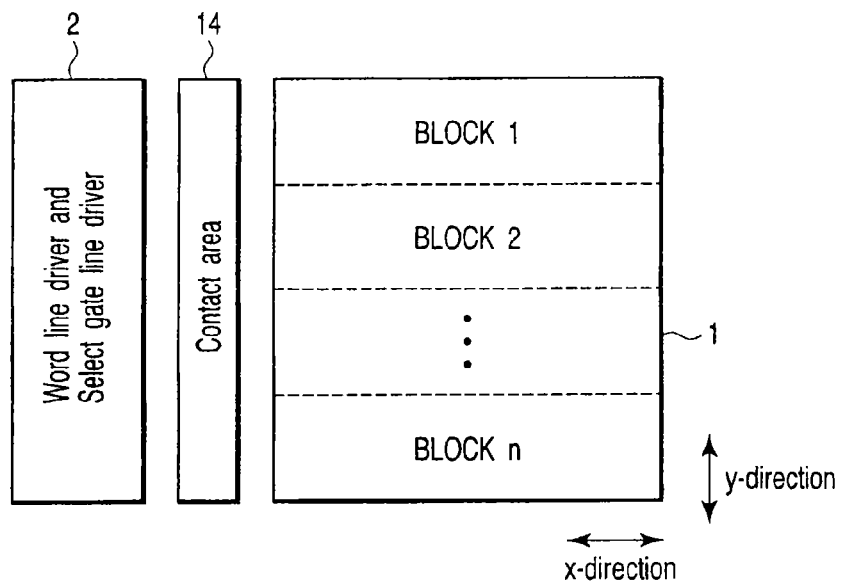
FIG. 7 is a view showing a layout in the vicinity of a memory cell array.

FIGS. 6 and 7 each show a positional relationship between a memory cell array or a word line/select gate line driver and a contact area.

In an example of FIG. 6, the word line/select gate line drivers 2 are disposed, respectively, at both ends of the memory cell array 1. In an example of FIG. 7, the word line/select gate line driver 2 is disposed at one end of the memory cell array 1. A contact area 14 for making interconnection is disposed between the memory cell array 1 and the word line/select gate line driver 2.

The memory cell array 1 is comprised a plurality (n in the present embodiment) of blocks BLOCK1 to BLOCKn. The blocks BLOCK1 to BLOCKn are disposed in line in the y-direction. The word "block" used here denotes a minimum unit of erase, i.e., a minimum number of memory cells that can be erased at one time.

FIG. 8 shows one block.

A block BLOCKi is comprised a plurality (m in the present embodiment) of cell units CU arranged in the x-direction. The cell units CU each are comprised: a NAND string made of eight memory cells M1, M2, . . . M8 connected in series; a select gate transistor ST1 connected to one end of the NAND string; and a select gate transistor ST2 connected to the other end of the NAND string.

In the present embodiment, while the NAND string is comprised eight memory cells M1, M2, . . . M8, it may be comprised two or more memory cells without being limited to eight in particular.

The select gate transistor ST1 is connected to a bit line BLq (q=0, 1, . . . m−2, m−1), and the select gate transistor ST2 is connected to a source line SL.

Word lines (control gate lines) WL1, WL2, . . . WL8 extend in the x-direction, and are connected in common to a plurality of memory cells in the x-direction. Select gate lines SGD extend in the x-direction, and are connected in common to a plurality of select gate transistors ST1 in the x-direction. The select gate lines SGS also extend in the x-direction and are connected in common to a plurality of select gate transistors ST2 in the x-direction.

Figure 9:
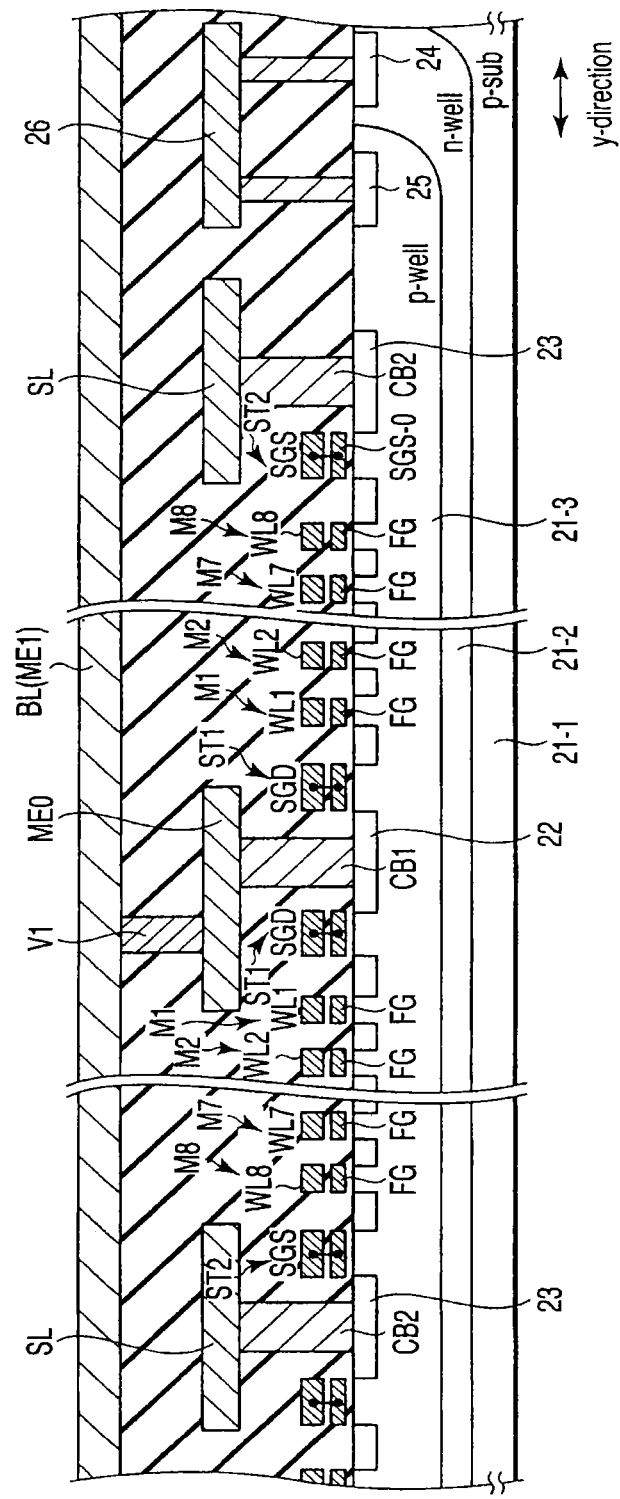
FIG. 9 is a view showing a sectional structure of a memory cell array.

FIG. 9 shows a sectional structure in the y-direction of a memory cell array.

A double-well region comprised an n-type well region 21-2 and a p-type well region 21-3 is formed in a p-type silicon substrate 21-1.

A plurality of memory cells M1, M2, . . . M8 connected in series are disposed in the p-type well region 21-3. Here, in the present embodiment as well, while the NAND string is comprised eight memory cells M1, M2, . . . M8, it may be comprised two or more memory cells without being limited to eight in particular.

The eight memory cells M1, M2, . . . M8 are comprised N-channel MOS transistors, respectively, and have a stacked gate structure made of a floating gate electrode FG and control gate electrodes (word lines) WL1, WL2, . . . WL8.

A select gate transistor ST1 is connected to one end of the NAND string made of the memory cells M1, M2, . . . M8 connected in series, and a select gate transistor ST2 is connected to the other end thereof.

The select gate transistors ST1 and ST2 each are comprised N-channel MOS transistors, and have select gate lines SGS and SGD each having a structure approximate to memory cells M1, M2, . . . M8, i.e., a stacked gate structure.

One end of the cell unit, i.e., a diffusion layer (drain diffusion layer) 22 of the select gate transistor ST1 is connected to a first metal layer ME0 via a contact plug CB1. In addition, the first metal layer ME0 is connected to a second metal layer ME1 serving as a bit line BL through a via plug V1. The bit line BL is connected to a bit line potential control circuit.

The other end of the cell unit, i.e., a diffusion layer (source diffusion layer) 23 of the select gate transistor ST2 is connected to a first metal layer ME0 serving as a source line SL via a contact plug CB2. The source line SL is connected to a source line potential control circuit.

The n-type well region 21-2 is connected to an electric potential setting line 26 via an n-type diffusion layer 24, and the p-type well region 21-3 is connected to the electric potential setting line 26 via a p-type diffusion layer 25. Namely, the n-type well region 21-2 and the p-type well region 21-3 are set to be equal to each other in electric potential. The electric potential setting line 26 is connected to a well potential control circuit.

The floating gate electrode FG is comprised, for example, electrically conductive poly-silicon including impurities, and the control gate electrodes WL1, WL2, . . . WL8 and the select gate lines SGS and SGD are comprised, for example, electrically conductive poly-silicon including impurities or a laminate made of this poly-silicon and silicide.

The first and second metal layers ME0 and ME1 are comprised aluminum, copper, or an alloy thereof, for example.

Although not shown here, a metal layer for interconnecting the control gate electrodes (word lines) WL1, WL2, WL8 and the word line drivers is comprised the first or second metal layer ME0 or ME1.

(3) First Example of Layout

Figure 10:
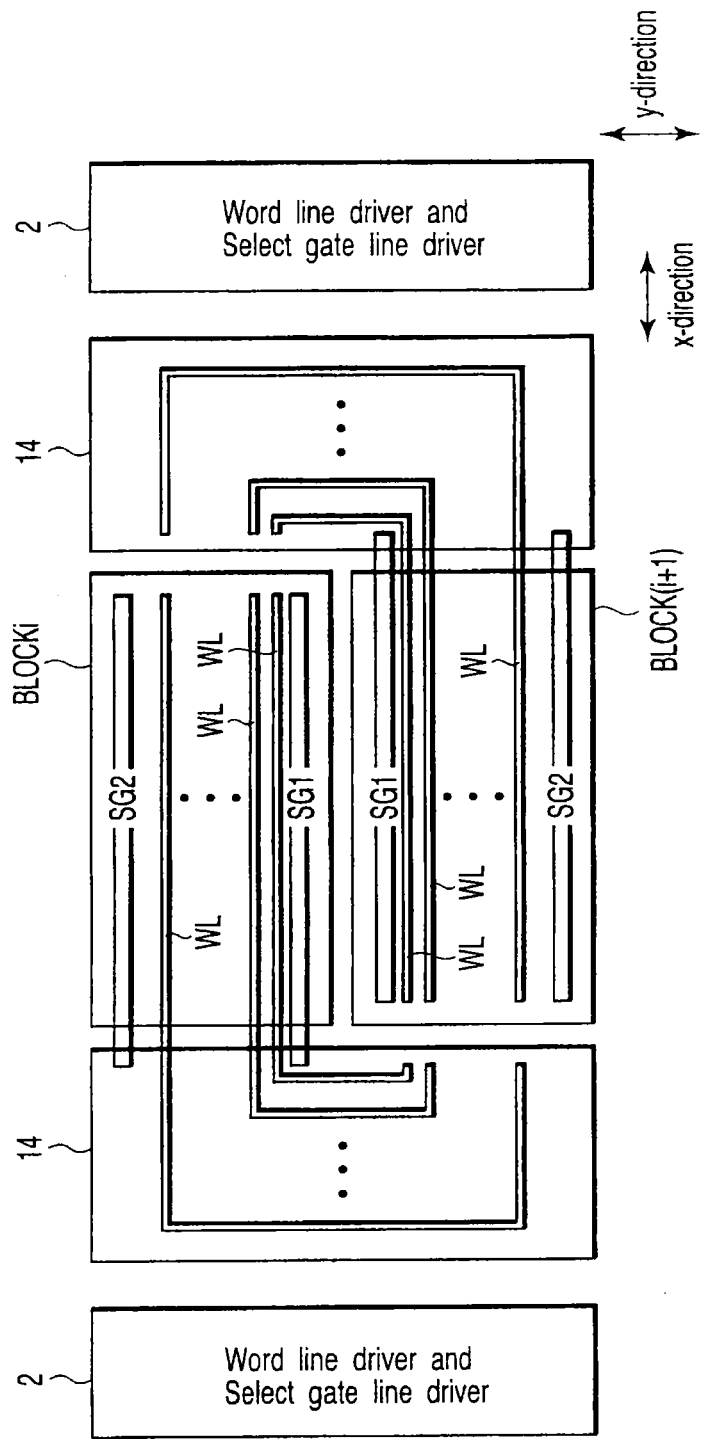
FIG. 10 is a view showing a first example of a word line layout.

FIG. 10 shows a first example of a word line layout.

Blocks BLOCKi and BLOCK (i+1) represent blocks of the memory cell arrays adjacent to each other.

A plurality of word lines WL and two select gate lines SG1 and SG2 sandwiching them therebetween are disposed, respectively, in the blocks BLOCKi and BLOCK (i+1).

One of the two select gate lines SG1 and SG2 is a select gate line SGS of a source line side select gate transistor, and the other one is a select gate line SGD of a bit line (drain) side select gate transistor (refer to FIGS. 8 and 9).

Word line/select gate line drivers 2 are disposed at a memory cell array, i.e., at both ends of the blocks BLOCKi and BLOCK (i+1).

A contact area 14 is disposed between each of the blocks BLOCKi and BLOCK (i+1) and the word line/select gate line driver 2. The contact area 14 is an area for interconnecting each of the blocks BLOCKi and BLOCK (i+1) and the word line/select gate line driver 2.

The word lines WL have a closed loop shape that multiply surrounds the two select gate lines SG1, SG2 that exist at the boundary side of the blocks BLOCK1 and BLOCK (i+1).

That is, in the contact area 14 at one end of each of the blocks BLOCKi and BLOCK (i+1), an end of each of a plurality of word lines WL in the block BLOCKi is bent to the select gate line SG1 side (in the y-direction and downwardly).

In addition, in the contact area 14 at the other end of each of the blocks BLOCKi and BLOCK (i+1), an end of each of a plurality of word lines WL in the block BLOCK (i+1) is bent to the select gate line SG1 side (in the y-direction and upwardly).

The word lines WL in the blocks BLOCKi and BLOCK (i+1) are separated from each other in an area other than the memory cell array, and their respective independencies are allocated.

Figure 11:
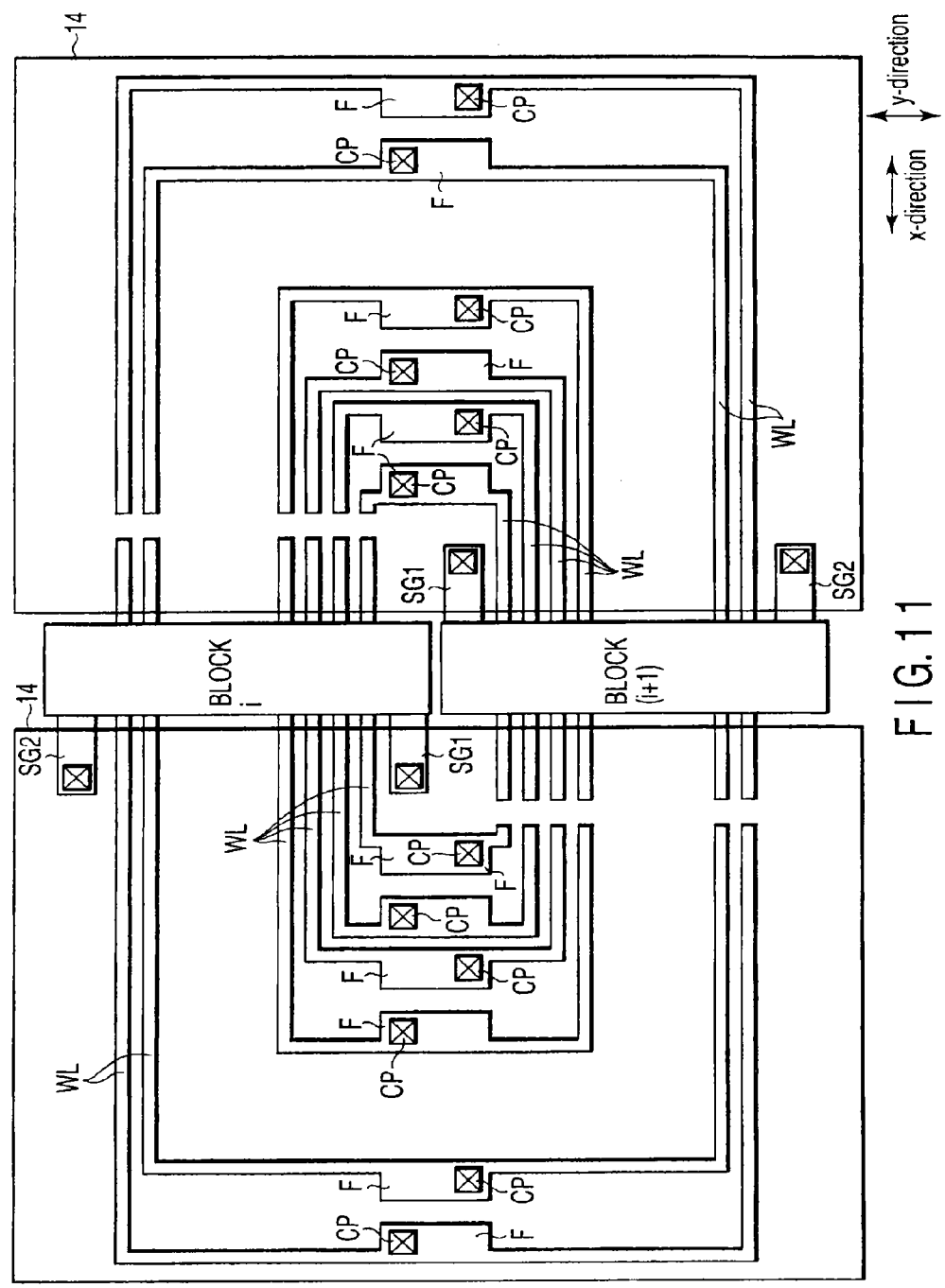
FIG. 11 is a detailed view showing a contact area.

FIG. 11 is a detailed view showing a layout of word lines in the contact area 14 of FIG. 10.

The positions, sizes, and further, mutual pitches of a fringe F and a contact plug (contact hole) CP are important in the contact area 14.

According to an example of the present invention, with respect to the fringe F and the contact plug CP, their positions, sizes, and further, mutual pitches can be freely adjusted in a two-dimensional manner (x-direction and y-direction) in the contact area 14.

That is, the positions, sizes, and pitches in the x-direction of the fringe F and the contact plug CP can be adjusted at a position of a bent point of the word line WL, and the positions, sizes, and pitches in the y-direction of the fringe F and the contact plug CP can be adjusted in the range from the bent point of the word line WL to its distal end.

Here, in the present example, the fringe F and contact plug CP connected to the word line WL are intensively disposed at the distal end of each of two select gate lines SG1 that exist at the boundary side of the blocks BLOCKi and BLOCK (i+1).

In addition, among the word lines WL in the blocks BLOCKi and BLOCK (i+1), the fringes F connected to an i-th (i is odd number) word line WL and an i+1-th word line WL that exist at the boundary side of the blocks BLOCKi and BLOCK (i+1) are disposed, respectively, between the i-th word line WL and the i+1-th word line WL.

Further, the fringe F of the i-th word line WL and the fringe F of the i+1-th word line from the select gate line SG1 that exists at the boundary side of the blocks BLOCKi and BLOCK (i+1) are separated from each other by means of slits in the vertical direction (y-direction).

According to such a layout, a downsizing processing technique of forming a finer pattern than a resolution limit of lithography can be applied to processing of word lines of a nonvolatile semiconductor memory without causing a problem such as an increase in contact resistance relevant to word lines WL or short-circuit of the adjacent word lines.

Figure 12:
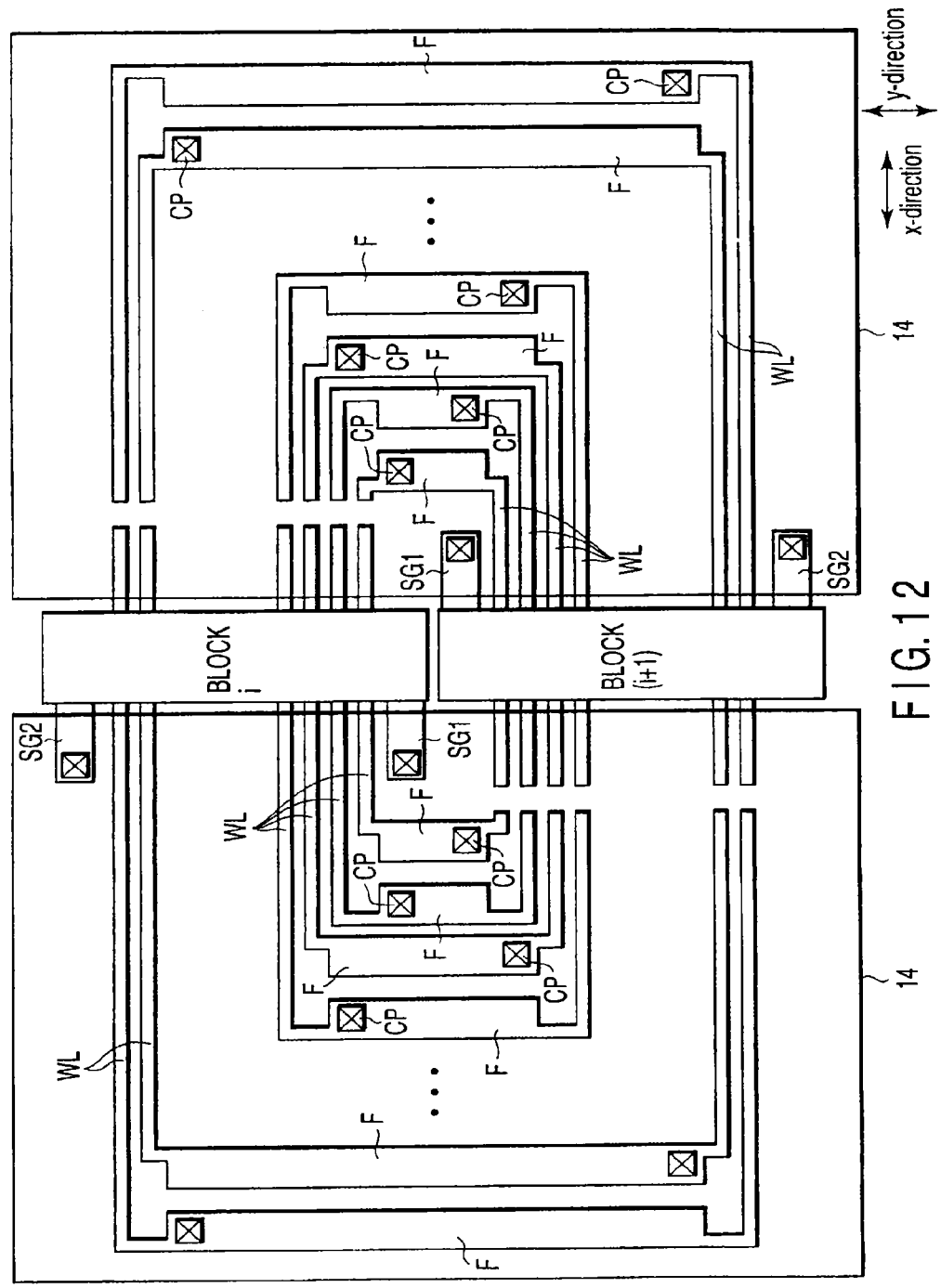
FIG. 12 is a detailed view showing a contact area.
Figure 13:
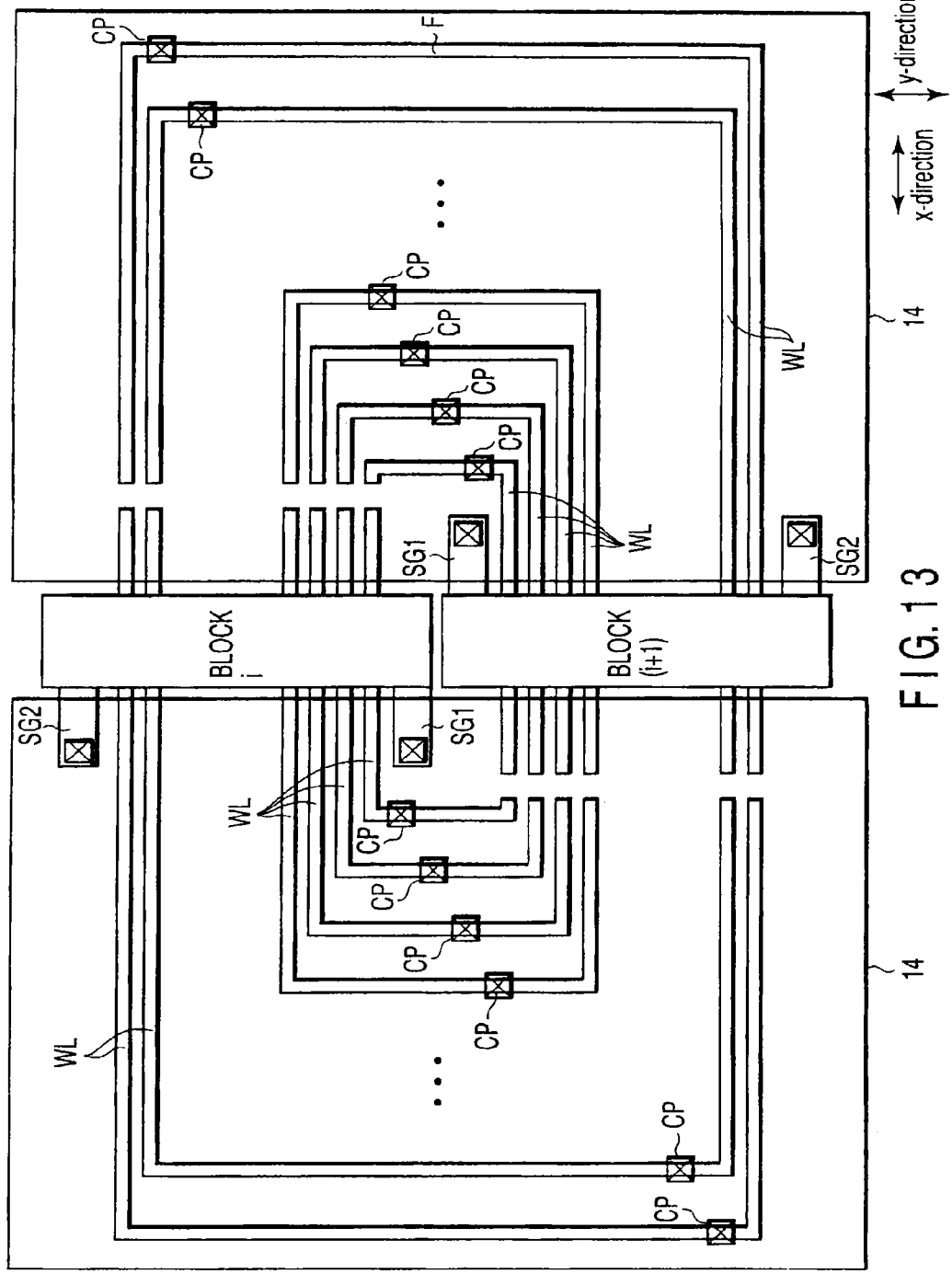
FIG. 13 is a detailed view showing a contact area.

FIGS. 12 and 13 each show a modification of the layout of FIG. 11.

In the example of FIG. 12, as the position of a word line WL is distant from a select gate line SG1 that exists at the boundary side of blocks BLOCK1 and BLOCK (i+1), the size (y-direction) of the fringe F connected to the word line WL is increased.

In this case, for example, as shown in the figure, the layout of a contact plug (contact hole) CP connected to a fringe F can be formed in a V shape while it is shifted in the y-direction by a predetermined pitch every time the word line WL is changed, thus simplifying a layout of a metal layer for interconnecting the word line WL and a word line driver.

In the example of FIG. 13, a fringe is not provided at an end of a word line WL. If no fringe is provided, the size in the x-direction of a contact area 14 can be reduced concurrently, thus making it possible to contribute to reduction of a chip area.

In spite of this situation, the position, size, and further, mutual pitches of a contact plug (contact hole) CP can be freely adjusted in the contact area 14, thus making it possible to provide a nonvolatile semiconductor memory having high reliability and high performance, without causing a problem such as an increase in contact resistance or short-circuit between the word lines.

In the examples of FIGS. 12 and 13 each, although the contact plugs CP have an oblique layout, shifted in the y-direction by a predetermined pitch for every change in the word line WL, the layout is not limited thereto in particular. For example, the contact plugs CP may be laid out in a zigzag manner.

(4) Second Example of Word Line Layout

Figure 14:
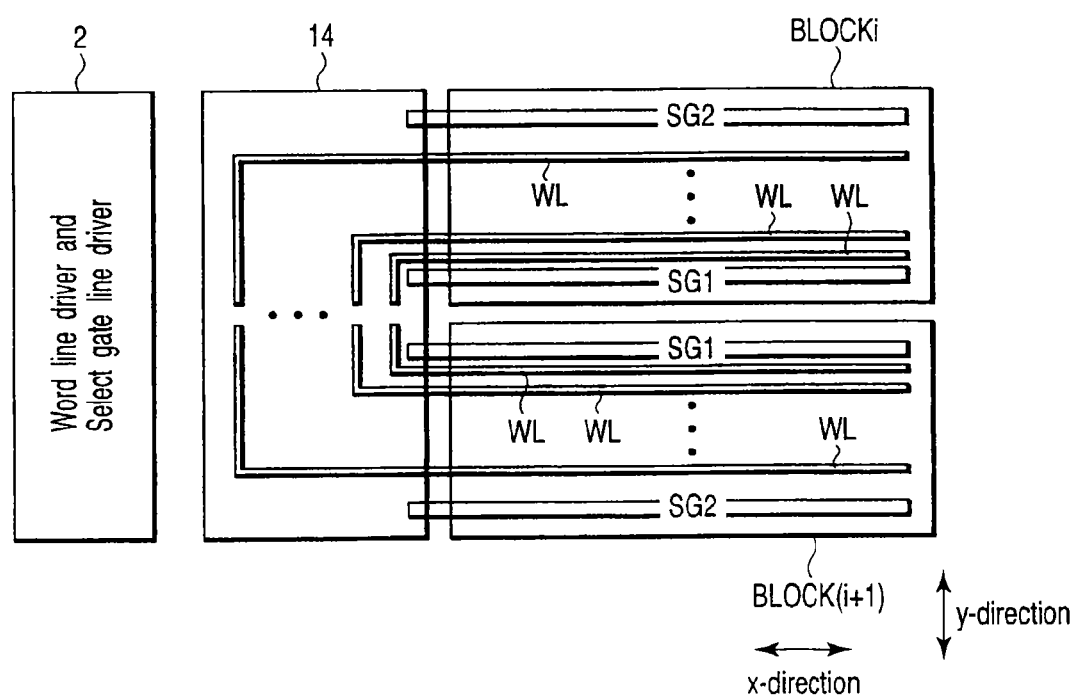
FIG. 14 is a view showing a second example of a word line layout.

FIG. 14 shows a second example of a word line layout.

Blocks BLOCKi and BLOCK (i+1) represent blocks of memory cell arrays adjacent to each other.

A plurality of word lines WL and two select gate lines SG1 and SG2 sandwiching them are disposed, respectively, in the blocks BLOCKi and BLOCK (i+1).

One of the two select gate lines SG1 and SG2 is a select gate line SGS of a source line side select gate transistor, and the other one is a select gate line SGD of a bit line (drain) side select gate transistor (refer to FIGS. 8 and 9).

In the second example, unlike the first example, a word line/select gate line driver 2 is disposed at a memory cell array, i.e., at only one end of each of the blocks BLOCK1 and BLOCK (i+1).

A contact area 14 is disposed between each of the blocks BLOCKi and BLOCK (i+1) and the word line/select gate line driver 2. The contact area 14 is an area for interconnecting each of the blocks BLOCKi and BLOCK (i+1) and the word line/select gate line driver 2.

The word lines WL have a partial loop shape that multiply surrounds the two select gate lines SG1, SG2 in part that exist at the boundary side of each of the blocks BLOCKi and BLOCK (i+1).

That is, in the contact area 14 at one end of each of the blocks BLOCKi and BLOCK (i+1), an end of each of a plurality of word lines WL in the blocks BLOCKi and BLOCK (i+1) is bent to the select gate line SG1 side (in the y-direction and upwardly/downwardly).

The word lines WL in the blocks BLOCKi and BLOCK (i+1) are separated from each other in an area other than the memory cell array, and their respective independencies are allocated.

FIG. 15 is a detailed view showing a layout of word lines in the contact area 14 of FIG. 14.

In the contact area 14, as in the first example, the positions, sizes, and further, mutual pitches of a fringe F and a contact plug (contact hole) CP can be adjusted in a two-dimensional manner (x-direction and y-direction).

That is, the positions, sizes, and pitches in the x-direction of the fringe F and the contact plug CP can be adjusted at a position of a bent point of a word line WL and the positions, sizes, pitches in the y-direction of the fringe F and the contact plug CP can be adjusted in the range from the bent point of the word line WL to its distal end.

Here, in the present example, as in the first example, the fringes F and contact plugs CP connected to the word lines WL are intensively disposed at a distal end of each of the two select gate lines SG1 that exist at the boundary side of the blocks BLOCKi and BLOCK (i+1).

In addition, among the word lines WL in the blocks BLOCKi and BLOCK (i+1), the fringes F connected to an i-th (i is an odd number) word line WL and an i+1-th word line from the select gate line SG1 that exists at the boundary side of the blocks BLOCKi and BLOCK (i+1) are disposed, respectively, between the i-th word line WL and the i+1-th word line WL.

Further, the fringe F of the i-th word line WL and the fringe F of the i+1-th word line WL from the select gate line SG1 that exists at the boundary side of the blocks BLOCKi and BLOCK (i+1) are separated from each other by means of cross slits in the horizontal direction (x-direction) and in the vertical direction (y-direction).

According to such a layout, a downsizing processing technique of forming a finer pattern than a resolution limit of lithography can be applied to processing of word lines of a nonvolatile semiconductor memory without causing a problem such as an increase in contact resistance relevant to word lines WL or short-circuit of the adjacent word lines.

Figure 16:
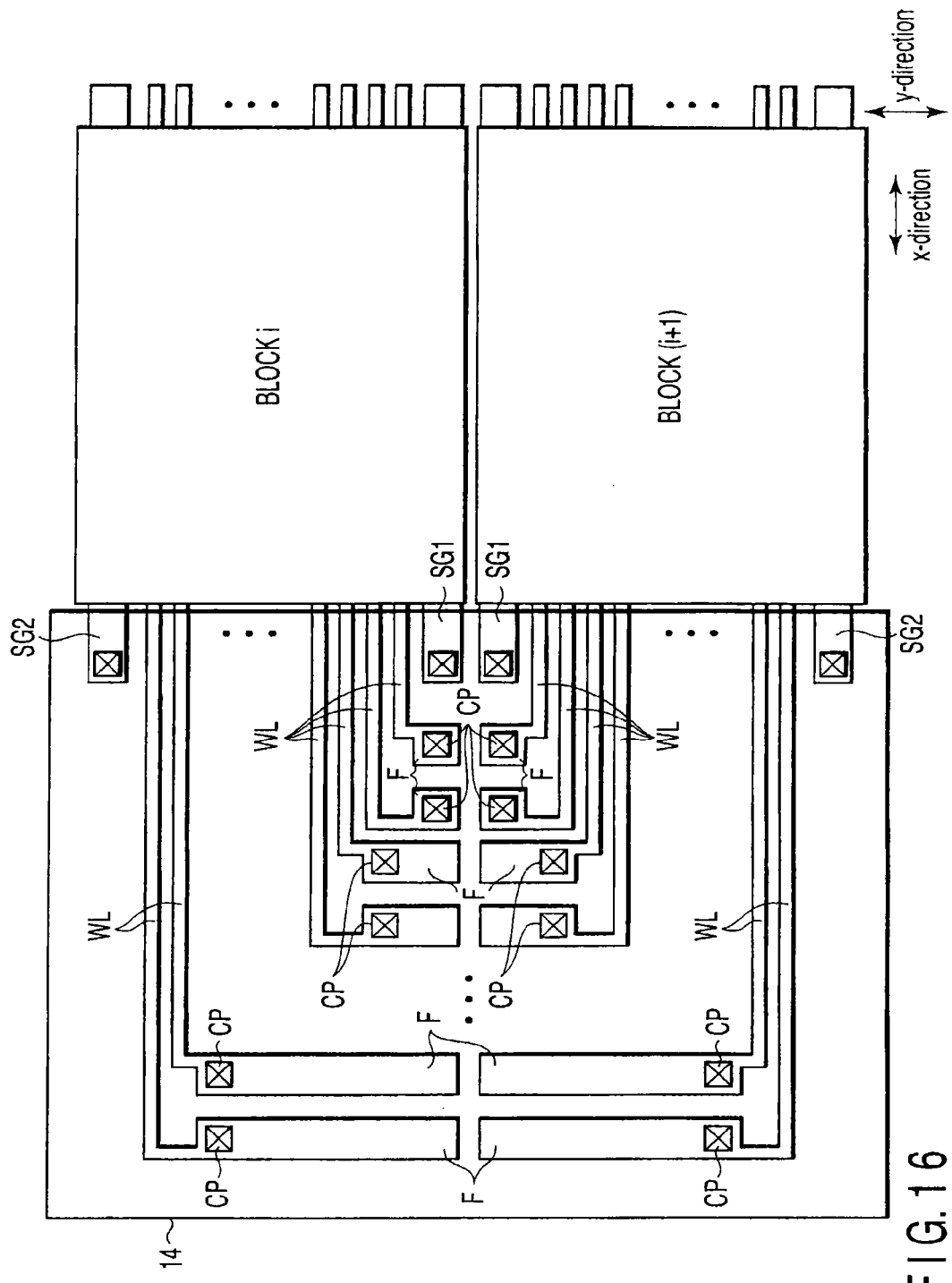
FIG. 16 is a detailed view showing a contact area.
Figure 17:
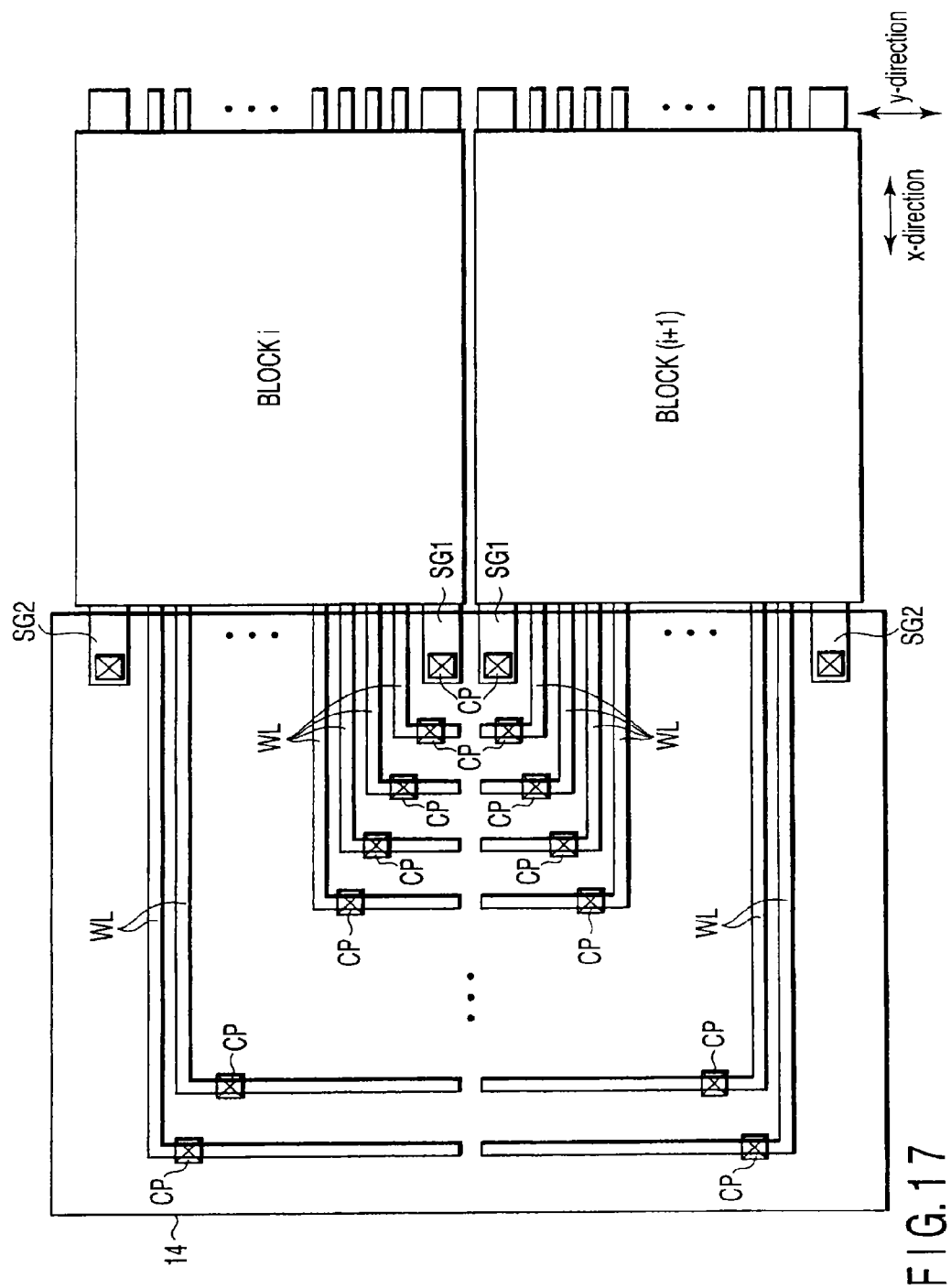
FIG. 17 is a detailed view showing a contact area.

FIGS. 16 and 17 each show a modification of the layout of FIG. 11.

In the example of FIG. 16, as the position of a word line WL is distant from a select gate line SG1 that exists at the boundary side of blocks BLOCK1 and BLOCK (i+1), the size (y-direction) of the fringe F connected to the word line WL is increased.

In this case, for example, as shown in the figure, the layout of a contact plug (contact hole) CP connected to a fringe F can be formed in a V shape while it is shifted in the y-direction by a predetermined pitch every time the word line WL is changed, thus simplifying a layout of a metal layer for interconnecting the word line WL and a word line driver.

In the example of FIG. 17, a fringe is not provided at an end of a word line WL. If no fringe is provided, the size in the x-direction of a contact area 14 can be reduced concurrently, thus making it possible to contribute to reduction of a chip area.

In spite of this situation, the position, size, and further, mutual pitches of a contact plug (contact hole) CP can be freely adjusted in the contact area 14, thus making it possible to provide a nonvolatile semiconductor memory having high reliability and high performance without causing a problem such as an increase in contact resistance or short-circuit between the word lines.

In the examples of FIGS. 16 and 17 each, although the contact plugs CP have an oblique layout shifted in the y-direction by a predetermined pitch for every change in the word line WL, the layout is not limited thereto in particular. For example, the contact plugs CP may be laid out in a zigzag manner.

(5) First Example of Manufacturing Method

A description will be given with respect to a first example of a method for manufacturing a nonvolatile semiconductor memory having a word line layout according to an example of the present invention.

First, as shown in FIGS. 18 to 22, an element isolation insulation layer 31 having an STI (shallow trench isolation) structure is formed in a semiconductor substrate 30. In addition, a gate insulation layer 32 is formed on an element area surrounded by the element isolation insulation layer 31. The gate insulation layer 32 is comprised of silicon oxide or a laminate structure including silicon oxide, for example.

Then, a floating gate electrode member 33, an inter-gate insulation film (for example, IPD (inter-poly dielectric)) 34, and a word line (floating gate electrode) member 35 are sequentially formed on the gate insulation layer 32.

Although the floating gate electrode member 33 may be made of any electrically conductive material, electrically conductive poly-silicon is mainly used. The inter-gate insulation film 34 is provided as a three-layered structure of ONO (oxide/nitride/oxide), for example. Although a word line member 35 may also be made of any electrically conductive material, a laminate structure of electrically conductive poly-silicon and silicide is mainly used.

While the inter-gate insulation film 34 is disposed entirely between the floating gate electrode member 33 and the word line member 35 in a memory cell area MA in which memory cells are formed, part of the inter-gate insulation film 34 between the floating gate electrode member 33 and the word line member 35 is removed in a select gate transistor area SA in which a select gate transistor is formed.

Then, mask members 36 and 37 are sequentially formed on the word line member 35. The mask members 36 and 37 are comprised materials different from each other.

Then, a photoresist 38 is formed on the mask member 37.

The photoresist 38 is processed in a predetermined pattern in accordance with a photolithography process. For example, a line & space resist pattern is formed in the select gate transistor area SA and a closed loop shaped resist pattern that surrounds a resist pattern of the select gate transistor area SA is formed in the memory cell area MA.

Here, the closed loop shaped photoresist 38 is formed in a line & space pattern in a memory cell array 1, for example, and is formed in a size (width in the x-direction) and pitches considering a layout of fringes and contact holes in a contact area 14.

The pitches of the line & space of the photoresist 38 are set to 120 nm (line=60 nm and space=60 nm).

Figure 18:
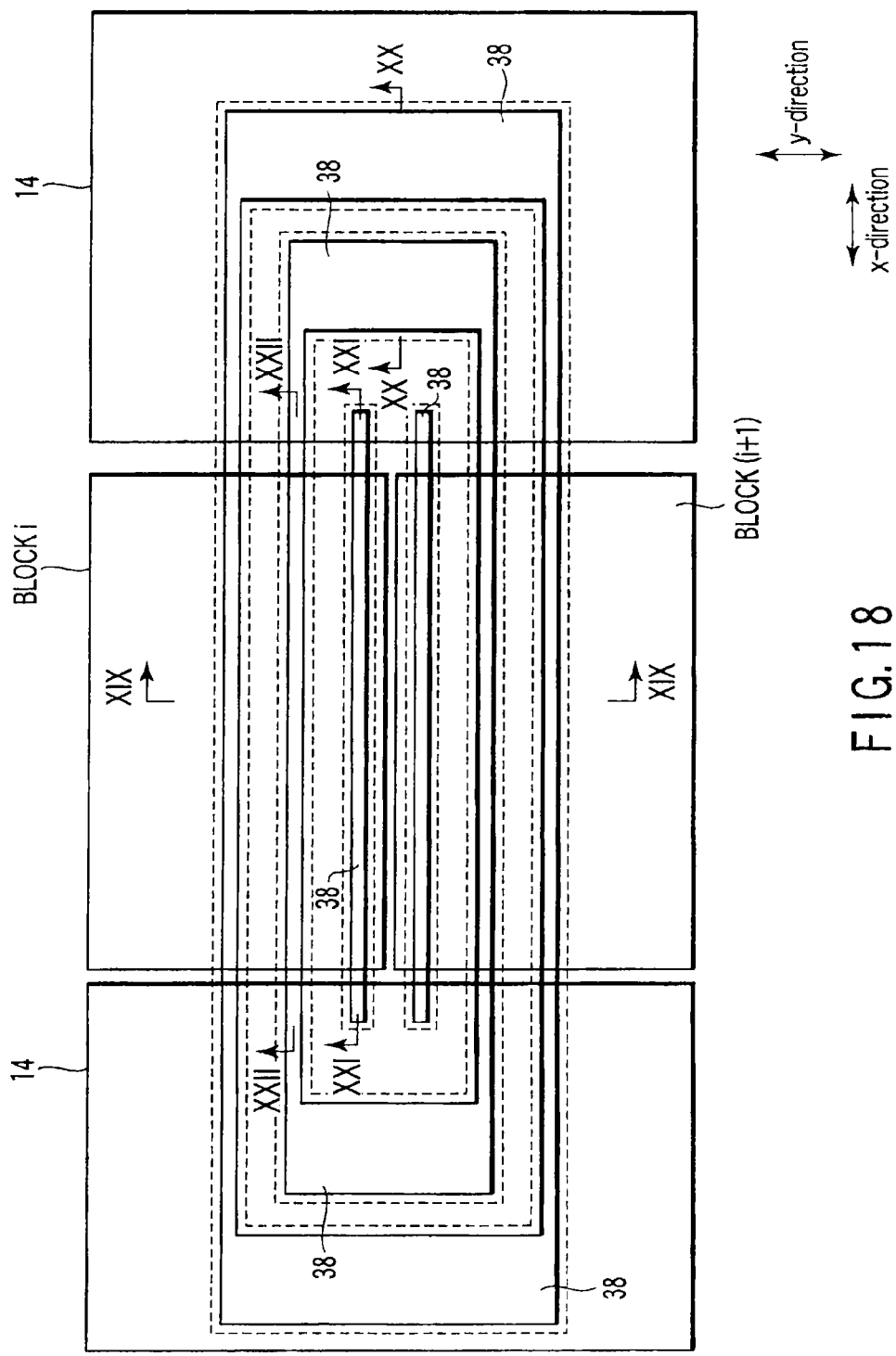
FIG. 18 is a plan view showing one process in a method for manufacturing a nonvolatile semiconductor memory.
Figure 19:
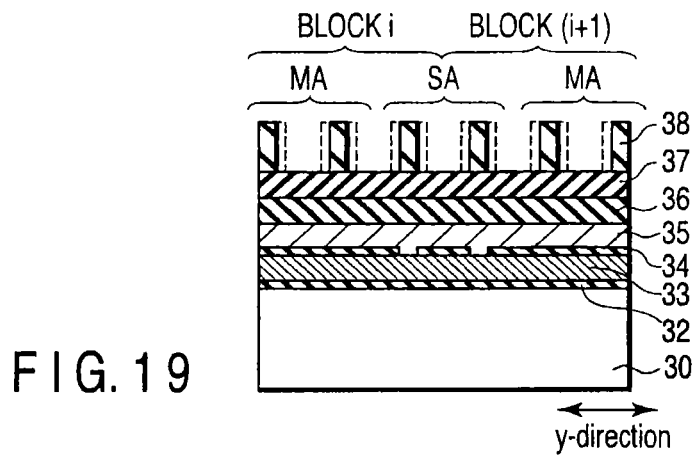
FIG. 19 is a sectional view taken along the line XIX-XIX of FIG. 18.
Figure 20:
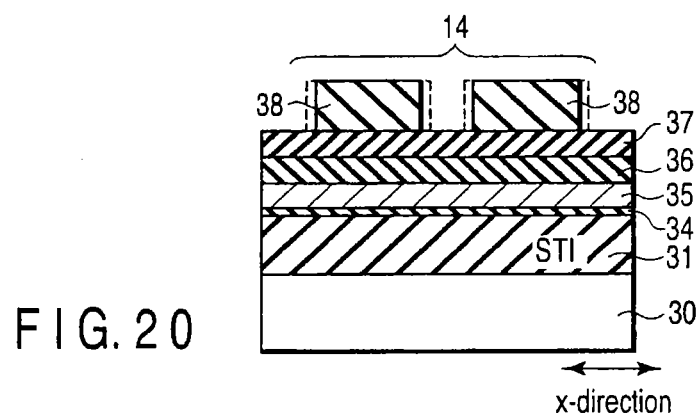
FIG. 20 is a sectional view taken along the line XX-XX of FIG. 18.
Figure 23:
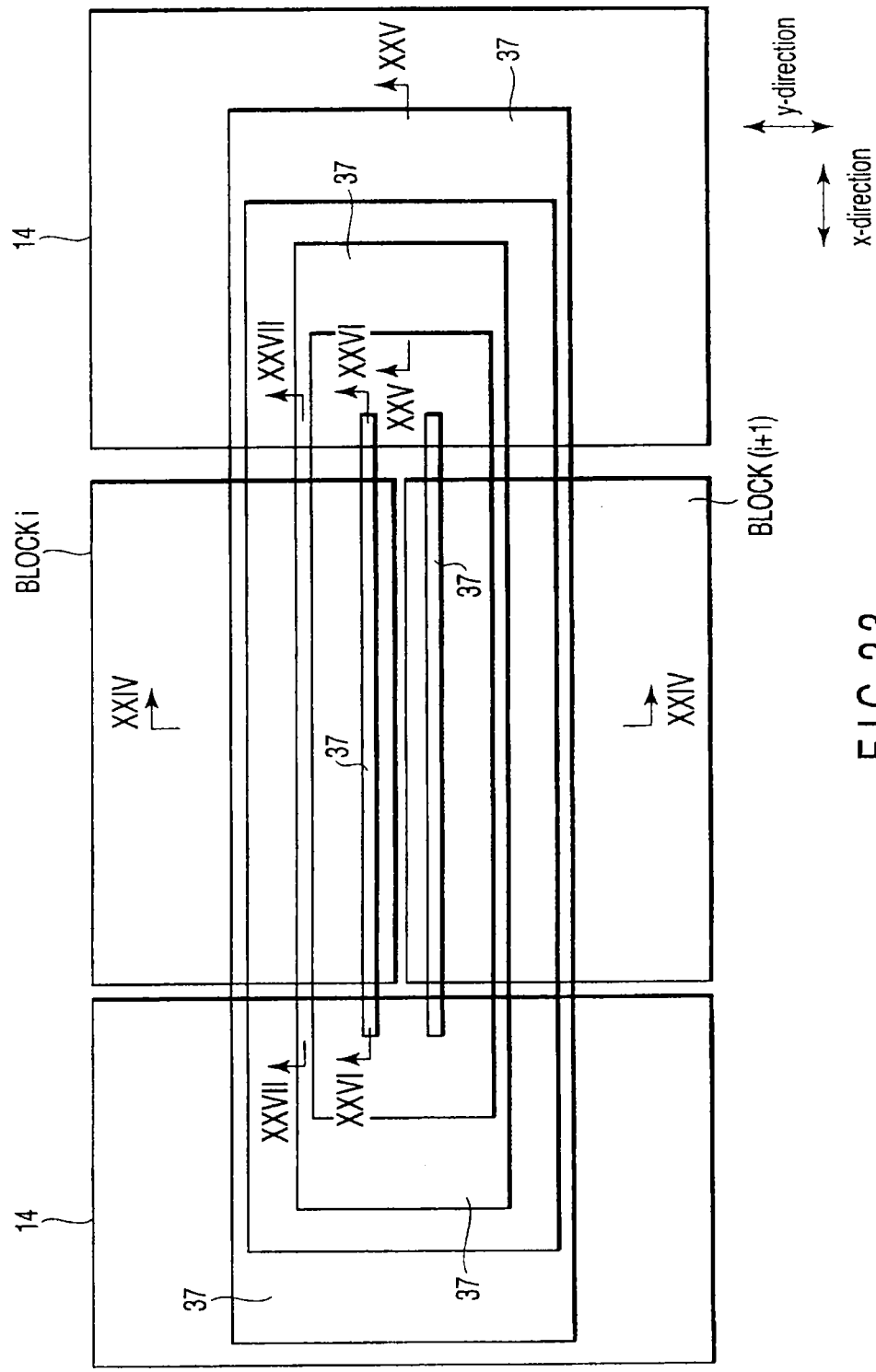
FIG. 23 is a plan view showing one process in a method for manufacturing a nonvolatile semiconductor memory.
Figure 24:
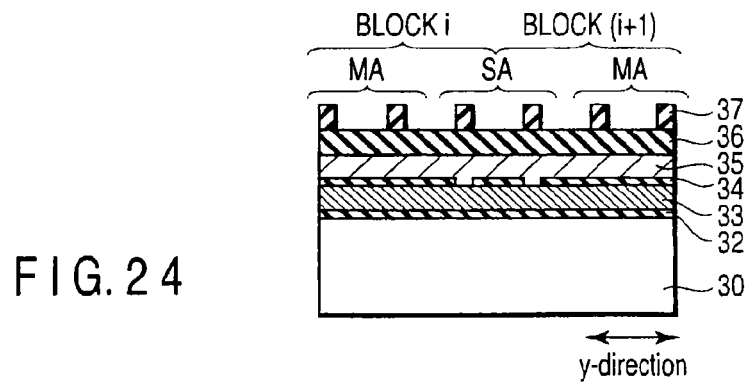
FIG. 24 is a sectional view taken along the line XXIV-XXIV of FIG. 23.
Figure 25:
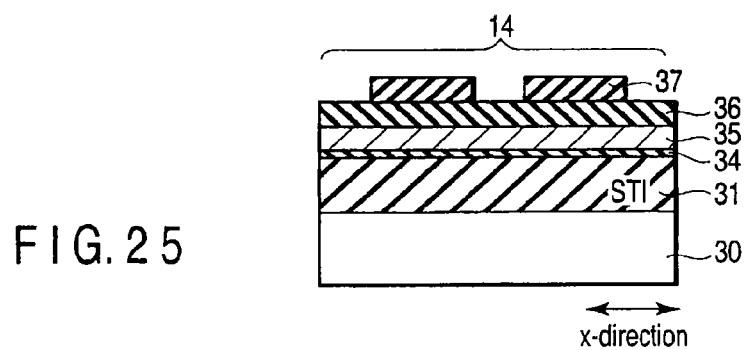
FIG. 25 is a sectional view taken along the line XXV-XXV of FIG. 23.
Figure 26:
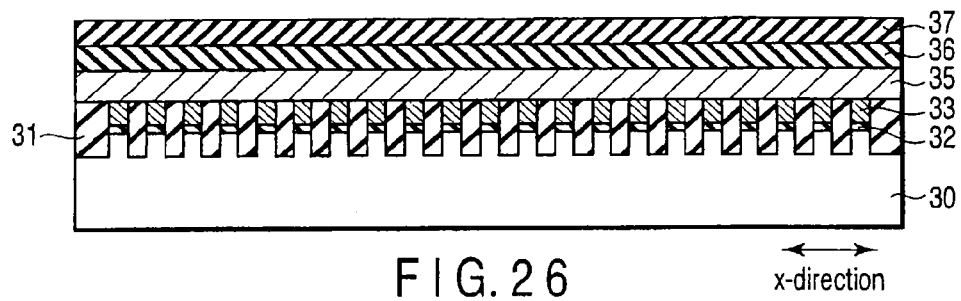
FIG. 26 is a sectional view taken along the line XXVI-XXVI of FIG. 23.
Figure 27:
FIG. 27 is a sectional view taken along the line XXVII-XXVII of FIG. 23.
Figure 28:
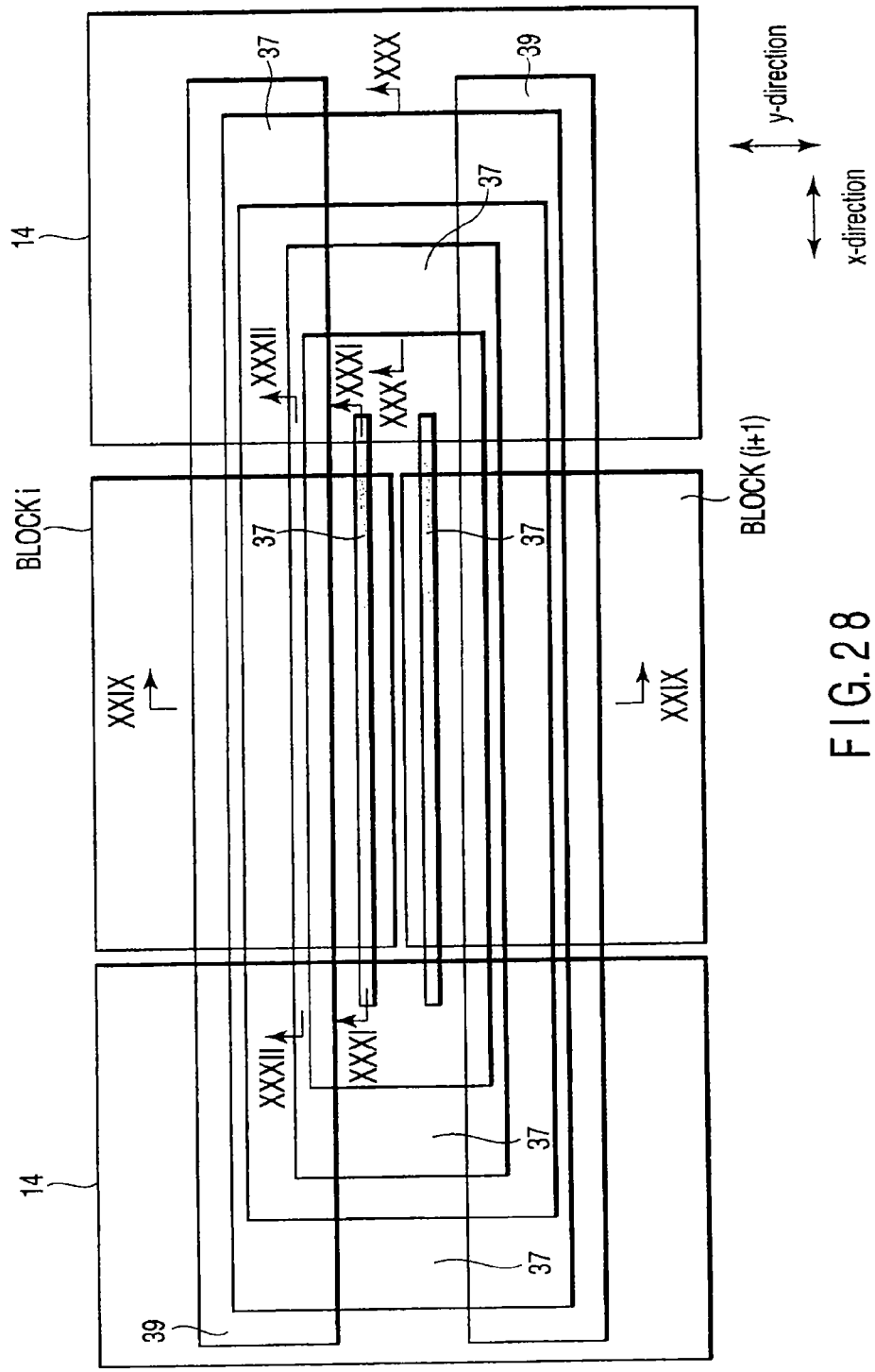
FIG. 28 is a plan view showing one process in a method for manufacturing a nonvolatile semiconductor memory.
Figure 33:
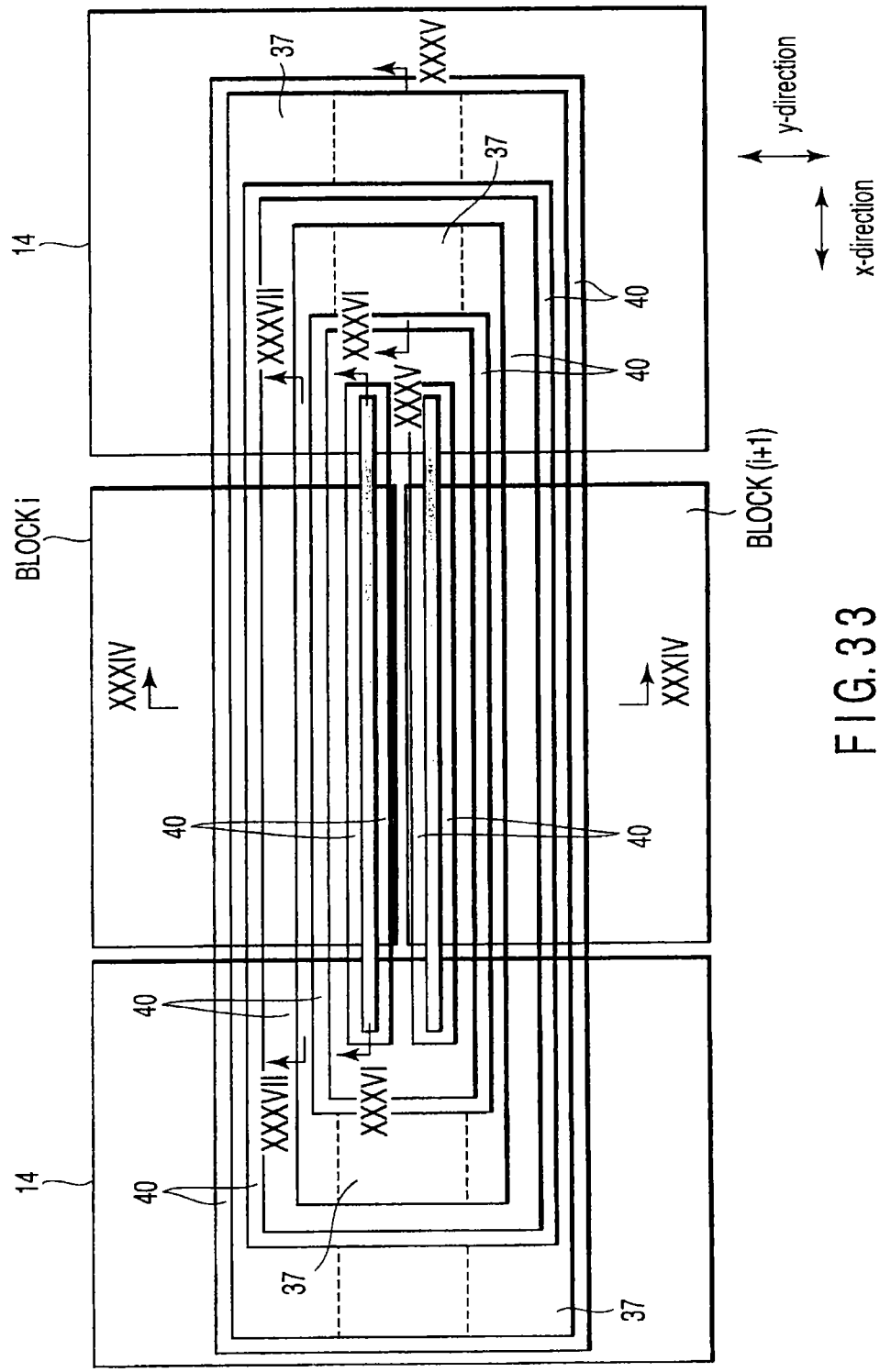
FIG. 33 is a plan view showing one process in a method for manufacturing a nonvolatile semiconductor memory.
Figure 34:
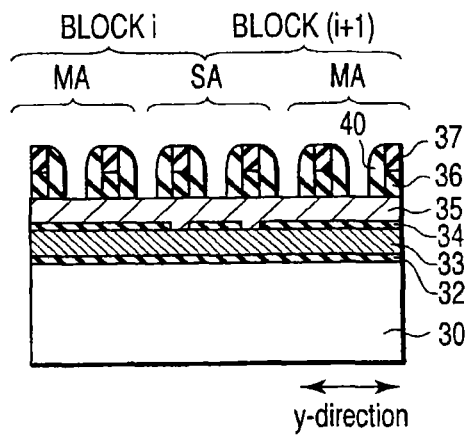
FIG. 34 is a sectional view taken along the line XXXIV-XXXIV of FIG. 33.
Figure 35:
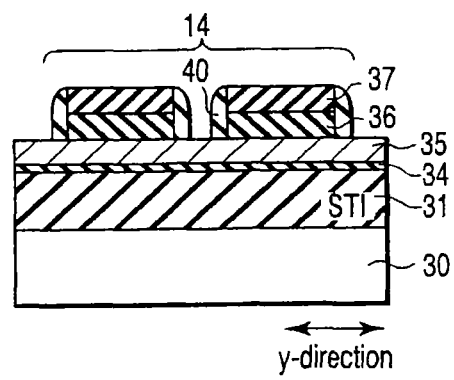
FIG. 35 is a sectional view taken along the line XXXV-XXXV of FIG. 33.
Figure 36:
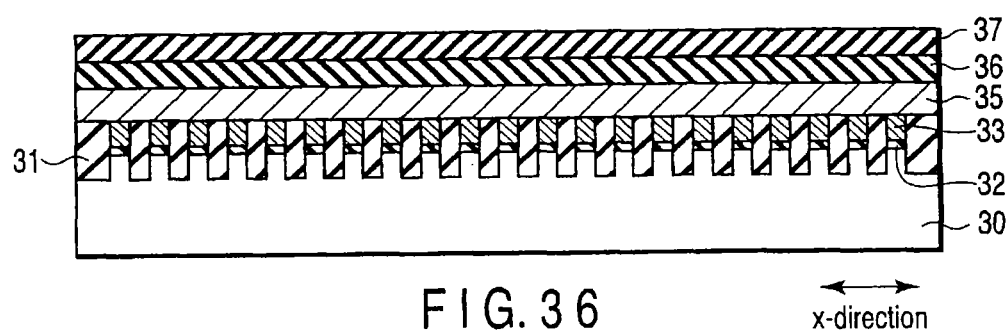
FIG. 36 is a sectional view taken along the line XXXVI-XXXVI of FIG. 33.
Figure 37:
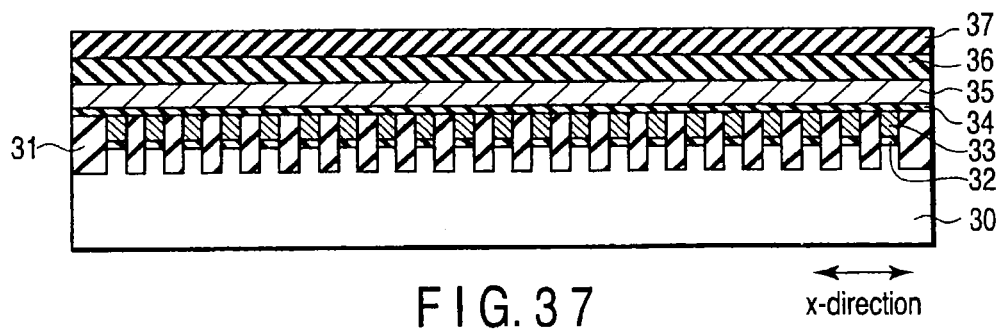
FIG. 37 is a sectional view taken along the line XXXVII-XXXVII of FIG. 33.

In addition, the width of the photoresist 38 can be reduced more remarkably than a resolution limit of photolithography in accordance with a slimming technique. In FIGS. 18 to 20, the dotted line represents a pattern of the photoresist 38 before being slimmed, and the solid line represents a pattern of the photoresist 38 after being slimmed.

For example, in accordance with the slimming technique, the width (line) of the photoresist 38 is set to 30 nm and the space is set to 90 nm.

Then, using the photoresist as a mask, the photoresist 38 is removed after the mask member 37 is etched in accordance with RIE.

As a result, as shown in FIGS. 23 to 27 each, the pattern of the photoresist 38 shown in each of FIGS. 18 to 22 is transferred to the mask member 37.

Next, as shown in FIGS. 28 to 32, a photoresist 39 is formed again on each of the mask members 36 and 37.

The photoresist 39 is formed to be a pattern having a slit (aperture) extending in the x-direction from the top of the select gate transistor area SA to the top of the contact area 14 in accordance with a photolithography process, the pattern fully covering the top of the memory cell area MA.

Then, only a portion of the mask member 37 that is not covered with the photoresist 39 is selectively solidified. In the same etching condition, an etching selection ratio of the solidified mask member 37 is reduced to be smaller than that of the mask member 37 that is covered with the photoresist 39 and not solidified.

Here, the solidified portions are designated by gray.

Then, the photoresist 39 is removed.

Next, as shown in FIGS. 33 to 37, using the mask member (including solidified portion) 37 as a mask, the mask member 36 is etched in accordance with RIE, and then, a pattern of the mask member 37 is transferred onto the mask member 36.

In addition, on the mask members 36 and 37, a mask member 40 fully covering them is formed. The mask member 40 is assumed to have an etching selection ratio equal to or almost equal to that of the solidified mask member 37 in the same etching condition.

Then, the mask member 40 is etched in accordance with RIE, and then, the mask member 40 is left on only the side wall of each of the mask members 36 and 37. The width in the horizontal direction of the mask member 40 on the side wall of each of the mask members 36 and 37 is set to 30 nm, for example.

Figure 38:
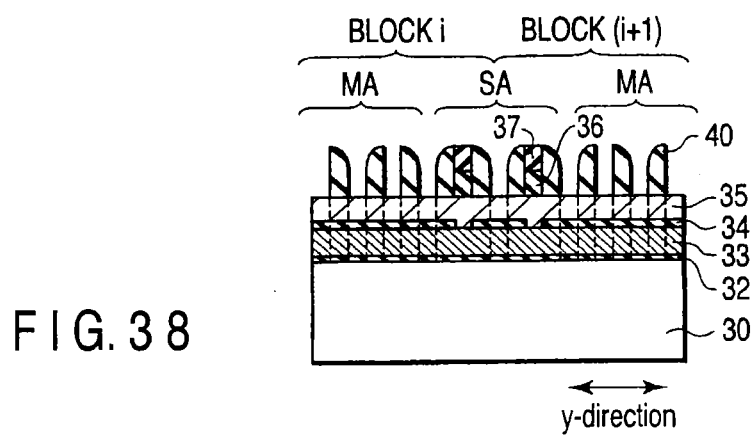
FIG. 38 is a sectional view taken along the line XXXIV-XXXIV of FIG. 33.
Figure 39:
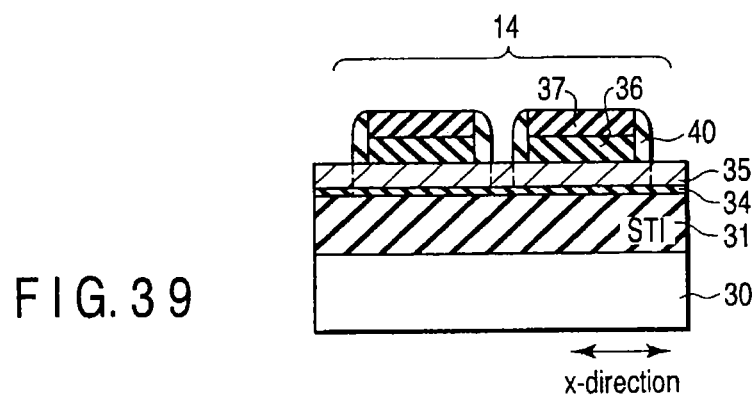
FIG. 39 is a sectional view taken along the line XXXV-XXXV of FIG. 33.
Figure 40:
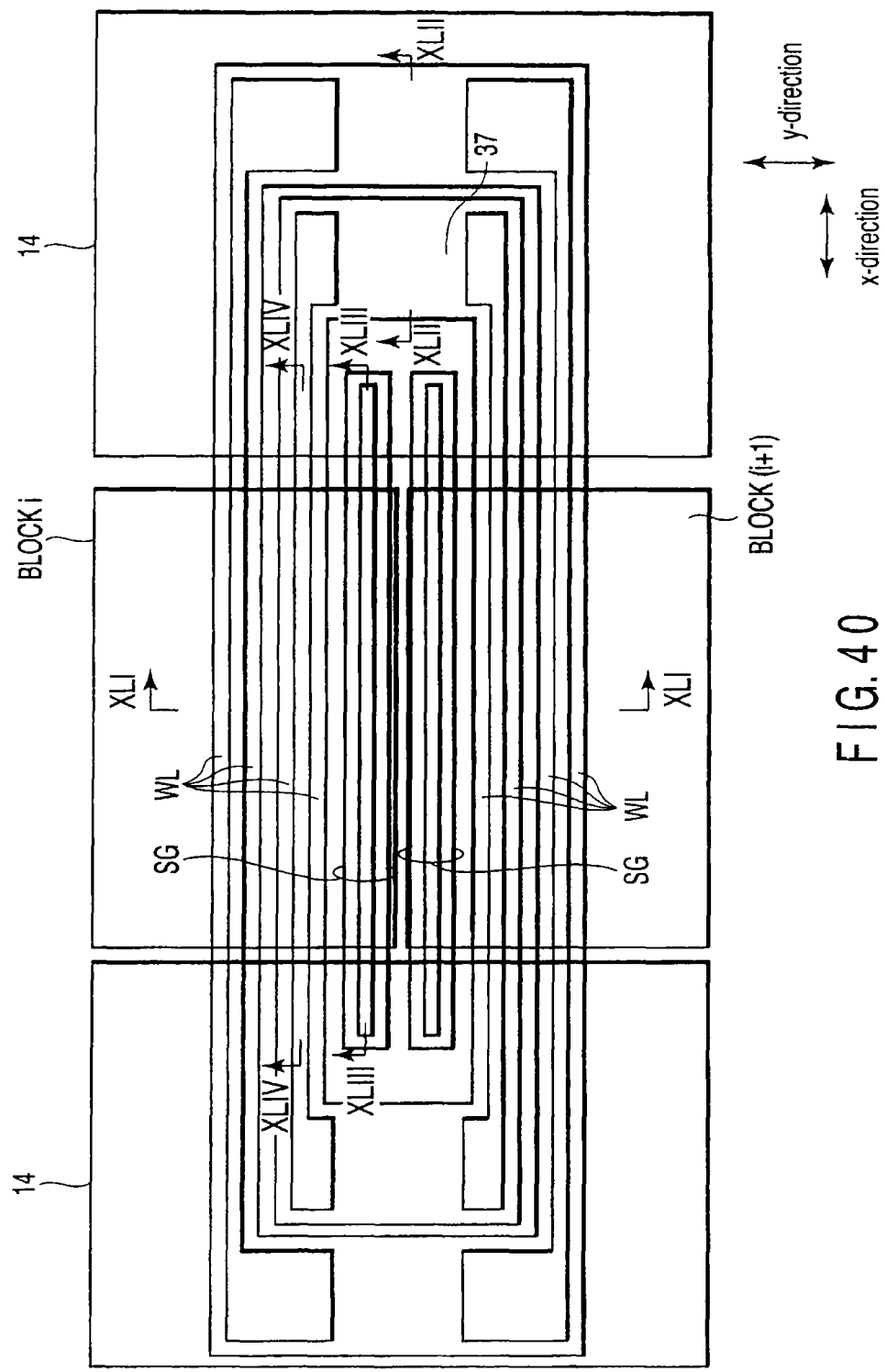
FIG. 40 is a plan view showing one process in a method for manufacturing a nonvolatile semiconductor memory.
Figure 41:
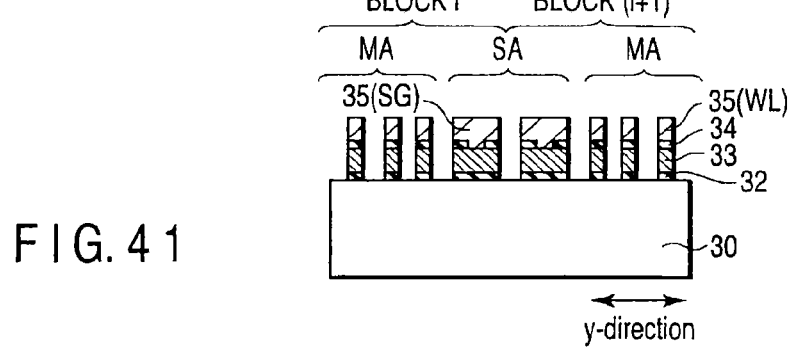
FIG. 41 is a sectional view taken along the line XLI-XLI of FIG. 40.
Figure 42:
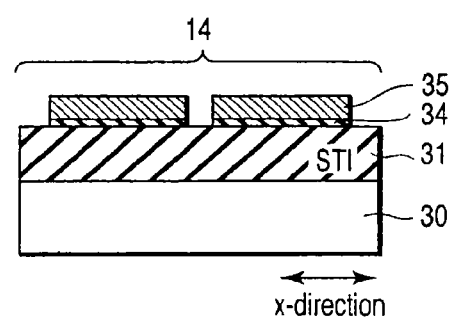
FIG. 42 is a sectional view taken along the line XLII-XLII of FIG. 40.
Figure 43:
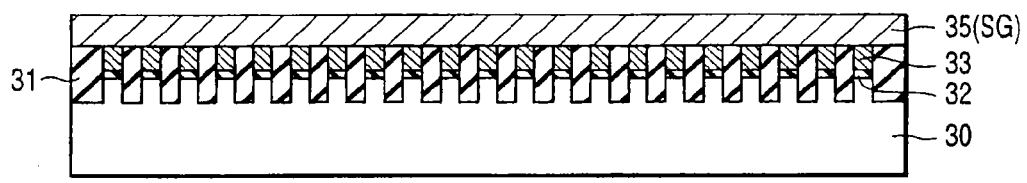
FIG. 43 is a sectional view taken along the line XLIII-XLIII of FIG. 40.
Figure 44:
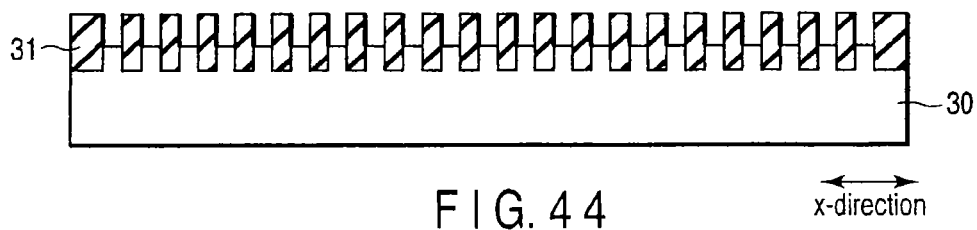
FIG. 44 is a sectional view taken along the line XLIV-XLIV of FIG. 40.
Figure 46:
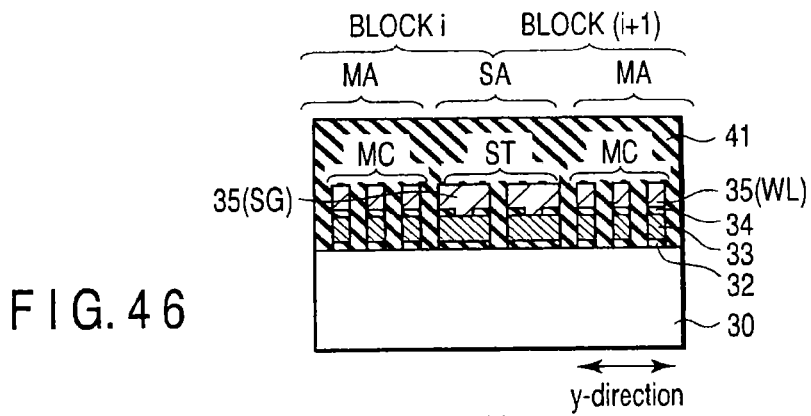
FIG. 46 is a sectional view taken along the line XLVI-XLVI of FIG. 45.
Figure 47:
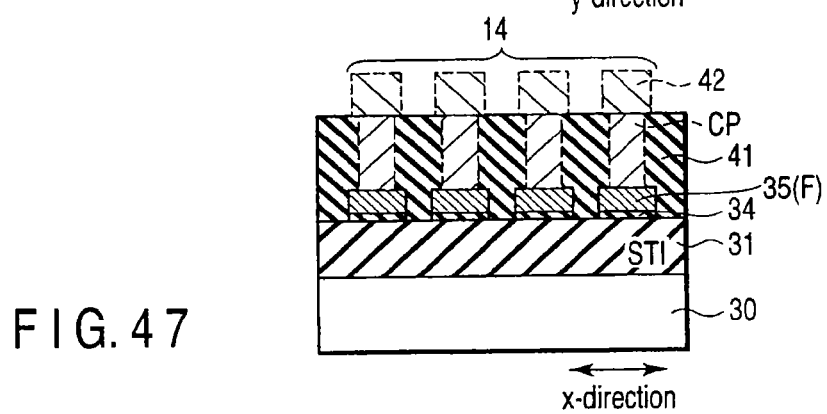
FIG. 47 is a sectional view taken along the line XLVII-XLVII of FIG. 45.
Figure 48:
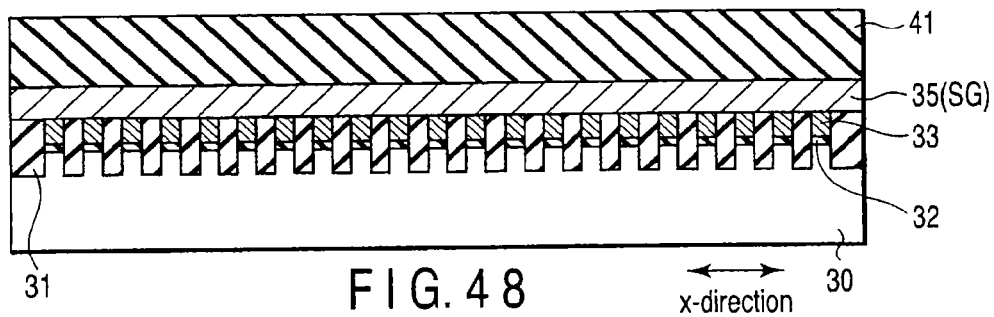
FIG. 48 is a sectional view taken along the line XLVIII-XLVIII of FIG. 45.
Figure 49:
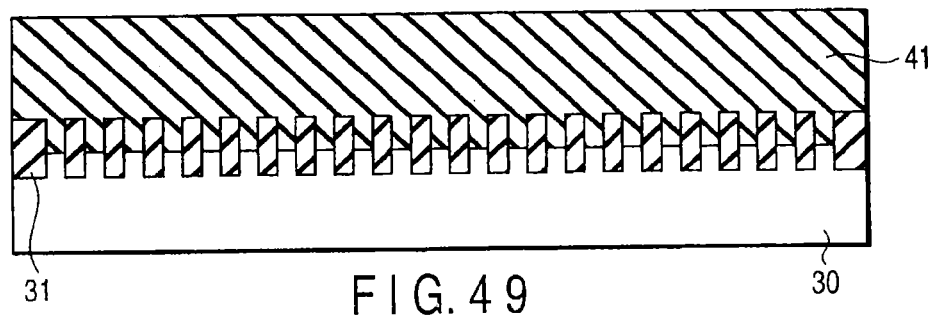
FIG. 49 is a sectional view taken along the line XLIX-XLIX of FIG. 45.

Then, if the mask members 36 and 37 are selectively etched, a fine mask pattern (for example, line=30 nm and space=30 nm) using the mask member 40 is formed as shown in FIGS. 38 and 39.

Here, when the mask members 36 and 37 are etched, the solidified mask member 37 is left together with the mask member 40 without being etched. Thus, the width of each of the mask members 36, 37, and 40 in the select gate transistor area SA is larger than that of the mask member 40 in the memory cell area MA.

For example, the width of each of the mask members 36, 37, and 40 in the select gate transistor area SA is obtained at 90 nm.

The mask members 36, 37, and 40 remain at a portion at which a fringe in the contact area 14 is formed.

Next, using the mask members 36, 37, and 40 as masks, a word line member 35, an inter-gate insulation film 34, a floating gate electrode member 33, and a gate insulation layer 32 are sequentially etched by RIE.

As a result, as shown in FIGS. 40 to 44, a word line WL is formed in a finer pattern (for example, line=30 nm and space=30 nm) than a limit (minimum processing dimension)

of resolution of photolithography in the memory cell area MA. In addition, a select gate line (select gate electrode) SG having a large width (channel length), for example, a width of 90 nm, is formed in the select gate transistor area SA.

In addition, in the contact area 14, a pattern of the word line member 35 for forming a fringe is formed at a distal end of a select gate line SG Lastly, as shown in FIGS. 45 to 49, by utilizing photolithography and RIE, the word lines WL in blocks BLOCKi and BLOCK (i+1) are separated from each other and the independency of the word lines WL is allocated.

In the separation method, as shown in FIG. 45, part of the word line WL and part of the fringe F are removed using slits in the vertical direction (y-direction).

Then, an inter-layered insulation layer 41 covering a memory cell MC and a select gate transistor ST is formed on a semiconductor substrate 30. In addition, a contact hole reaching the fringe F is formed in the inter-layered insulation layer 41.

Then, contact plugs CP are filled in the contact hole and a metal layer 42 is formed on the inter-layered insulation layer 41. The metal layer 42 connects a word line WL to a word line driver.

The contact plugs CP may be formed separately from the metal layer 42 or may be formed at the same time. These members may be formed in accordance with metal sputtering and RIB or may be formed in accordance with a Damascene technique or a dual Damascene technique.

In the above processes, as a result, a nonvolatile semiconductor memory having a word line layout of FIG. 11 is formed, whereas another layout can be provided by changing patterns of the photoresists 38 and 39 or a resist pattern obtained when separating word lines WL.

In addition, while a resist solidifying process has been utilized in the present example, the layout according to the example of the present invention can be provided even if the solidifying process is not utilized.

For example, instead of the solidifying process, the fringe position or size can be adjusted by, for example, performing one PEP (photo engraving process). In this case, a portion that is undesirable for etching is covered with a photoresist, and, in this state, the mask members 36 and 37 of FIGS. 33 to 37 may be etched.

In accordance with the manufacturing method described above, there can be provided a nonvolatile semiconductor memory having a layout according to the example of the present invention.

(6) Third Example of Layout

A third example is a modification of the first example.

The third example is significantly different from the first example in that a plurality of word lines are not formed in a closed loop shape. Thus, with respect to the plurality of word lines, and particularly to a word line that is the closest to a select gate line SG1, a length from a bent point to a distal end thereof is large as compared with that in the layout of FIG. 1.

Figure 50:
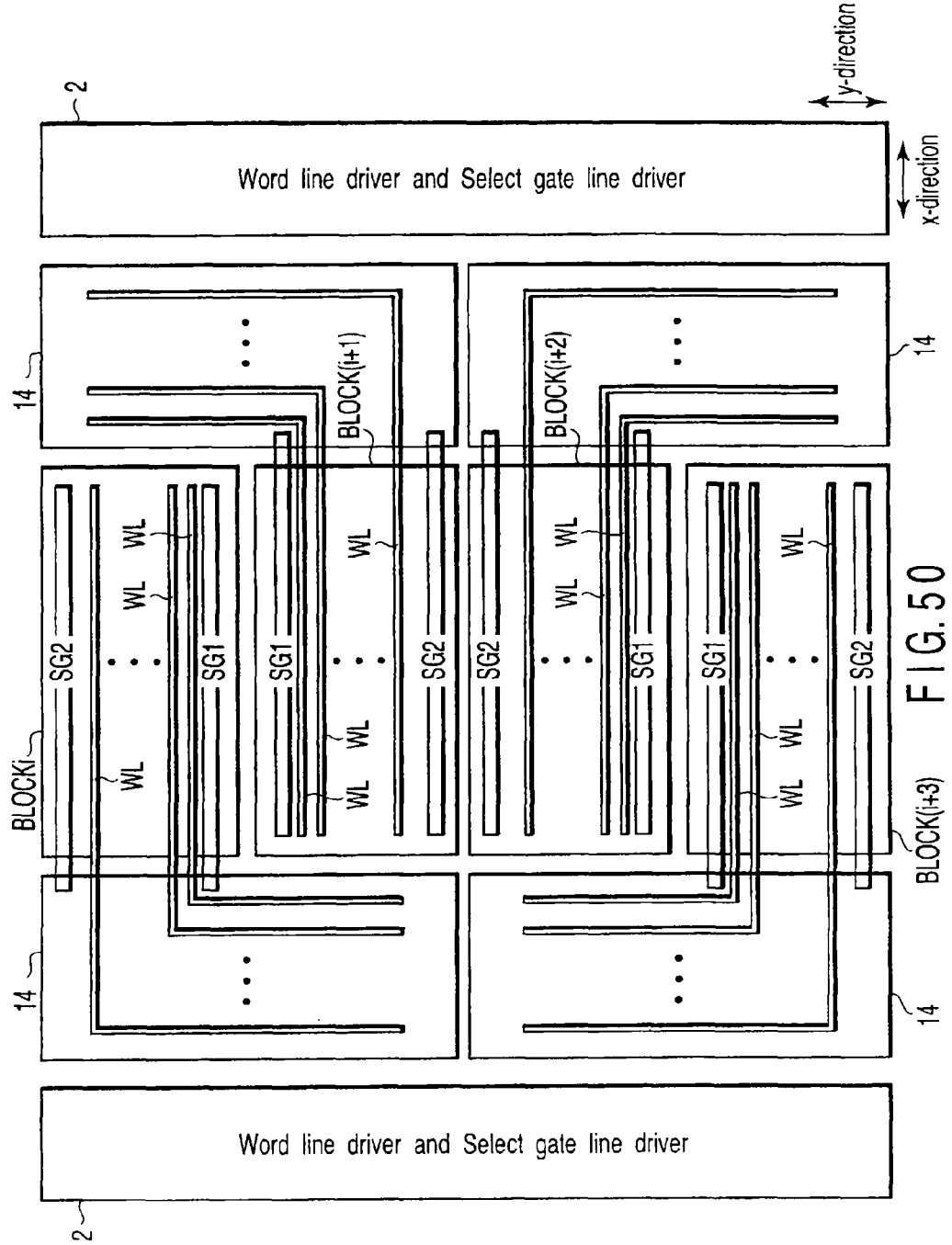
FIG. 50 is a view showing a third example of a word line layout.

FIG. 50 shows a third example of a layout of word lines.

Blocks BLOCKi, BLOCK (i+1), BLOCK (i+2), and BLOCK (i+3) represent blocks of memory cell arrays adjacent to each other.

A plurality of word lines WL and two select gate lines SG1 and SG2 sandwiching them are disposed, respectively, in the blocks BLOCKi, BLOCK (i+1), BLOCK (i+2), and BLOCK (i+3).

One of the two select gate lines SG1 and SG2 is a select gate line SGS of a source line side select gate transistor, and the other one is a select gate line SGD of a bit line (drain) side select gate transistor (refer to FIGS. 8 and 9).

Word line/select gate line drivers 2 are disposed at the memory cell arrays, i.e., at both ends of the blocks BLOCKi, BLOCK (i+1), BLOCK (i+2), and BLOCK (i+3).

A contact area 14 is disposed between each of the blocks BLOCKi, BLOCK (i+1), BLOCK, (i+2), and BLOCK (i+3) and the word line/select gate line driver 2.

The contact area 14 is an area for interconnecting each of the blocks BLOCKi and BLOCK (i+1) and the word line/select gate line driver 2.

In the contact area 14 at one end of each of the blocks BLOCKi and BLOCK (i+1), an end of each of a plurality of word lines WL in the block BLOCKi is bent to the select gate line SG1 side (in the y-direction and downwardly).

In addition, in the contact area 14 at the other end of each of the blocks BLOCK1 and BLOCK (i+1), an end of each of a plurality of word lines WL in the block BLOCK (i+1) is bent to the select gate line SG1 side (in the y-direction and upwardly).

A distal end of each of the plurality of word lines WL in the block BLOCKi can be maximally extended to an end of the block BLOCK (i+1) at the opposite side to a side at which the select gate line SG1 is disposed (at a side at which a select gate line SG2 is disposed).

In addition, a distal end of each of the plurality of word lines WL in the block BLOCK (i+1) can be maximally extended to an end of the block BLOCKi at the opposite side to a site at which the select gate line SG1 is disposed (at a side at which the select gate line SG2 is disposed).

Similarly, in the contact area 14 at one end of each of the blocks BLOCK (i+2) and BLOCK (i+3), an end of each of a plurality of word lines WL in the block BLOCK (i+3) is bent to the select gate line SG1 side (in the y-direction and upwardly).

In addition, in the contact area 14 at the other end of each of the blocks BLOCK (i+2) and BLOCK (i+3), an end of each of a plurality of word lines WL in the block BLOCK (i+2) is bent to the select gate line SG1 side (in the y-direction and downwardly).

A distal end of each of a plurality of word lines WL in the block BLOCK (i+2) can be maximally extended to an end of the block BLOCK (i+3) at the opposite side to a site at which the select gate line SG1 is disposed (at a side at which the select gate line SG2 is disposed).

In addition, a distal end of each of a plurality of word lines WL in the block BLOCK (i+3) can be maximally extended to an end of the block BLOCK (i+2) at the opposite side to a site at which the select gate line SG1 is disposed (at a side at which the select gate line SG2 is disposed).

Here, as is evident from comparison with FIG. 10 (first example) and FIG. 50 (third example), it is found that, among the plurality of word lines WL in the blocks BLOCKi, BLOCK (i+1), BLOCK (i+3), and BLOCK (i+4), a length from a bent point of a word line that is the closest to the select gate line SG1 to a distal end thereof in example 3 is larger than that in example 1.

Thus, in the third example, the size in the y-direction of the fringe can be increased, and the degree of freedom of a contact plug position can be improved.

However, the position of the distal end of each of a plurality of word lines WL can be freely set. That is, the position of the distal end may not extend to an end of another block, and the positions of the distal ends of all the word lines WL may not be identical to one another.

The word lines WL in the blocks BLOCKi, BLOCK (i+1), BLOCK (i+2), and BLOCK (i+3) are separated from each other in an area other than the memory cell array, and their respective independencies are allocated.

Figure 51:
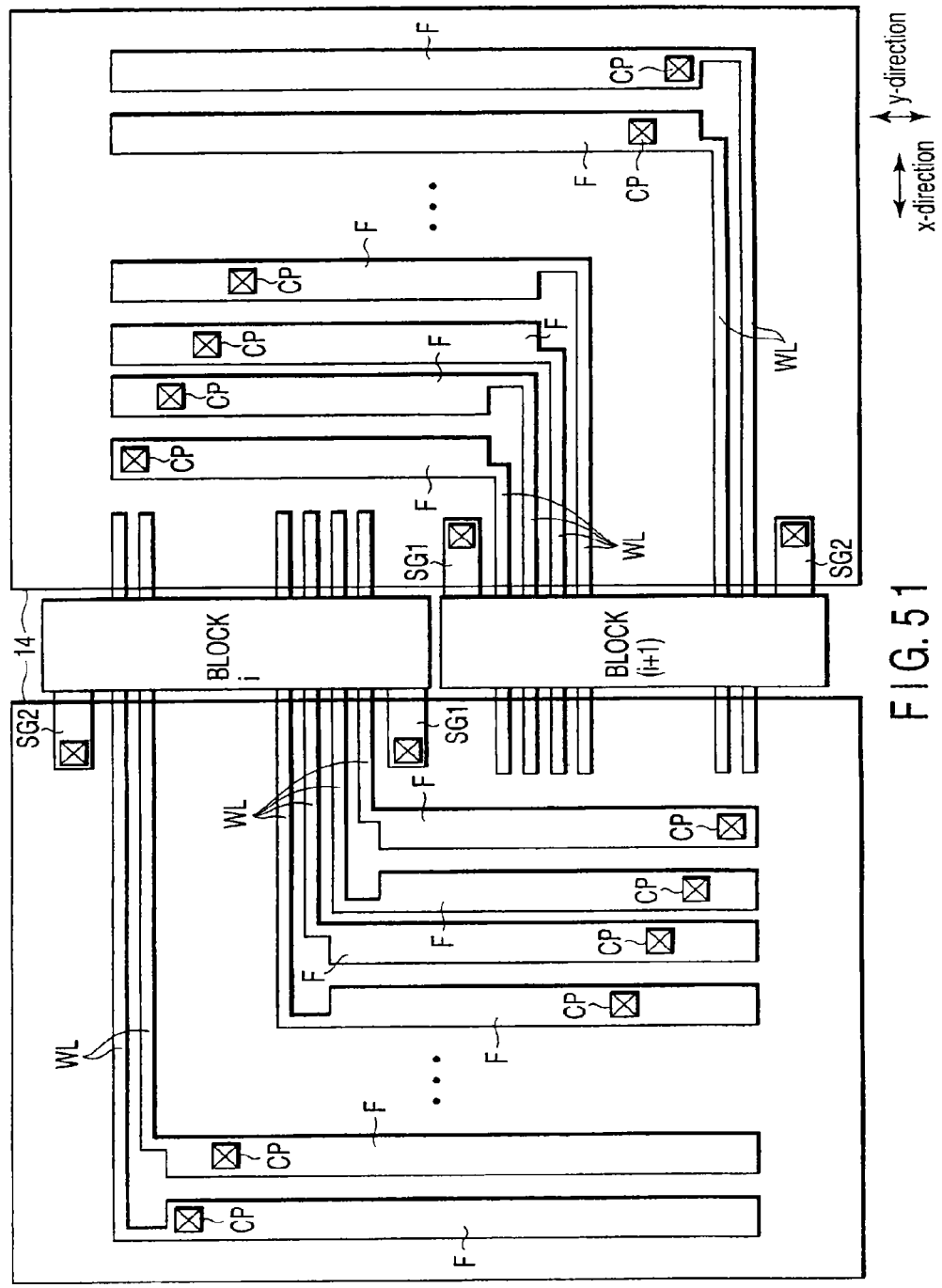
FIG. 51 is a detailed view showing a contact area.

FIG. 51 is a detailed view showing a layout of word lines in a contact area 14 of FIG. 50.

The positions, sizes, and further, mutual pitches of a fringe F and a contact plug (contact hole) CP are important in the contact area 14.

According to a third example of the present invention, with respect to the fringe F and the contact plug CP, their positions, size, and further, mutual pitches can be freely adjusted in a two-dimensional manner (x-direction and y-direction) in the contact area 14.

That is, the positions, sizes, and pitches in the x-direction of the fringe F and the contact plug CP can be adjusted at a position of a bent point of the word line WL, and the positions, sizes, and pitches in the y-direction of the fringe F and the contact plug CP can be adjusted in the range from the bent point of the word line WL to its distal end.

Here, in the present example, all the distal ends of a plurality of word lines WL extend to an end of each of the blocks BLOCKi and BLOCK (i+1) at the select gate line SG2 side.

In addition, the contact plugs CP are obliquely laid out in the range from an end of the block BLOCKi at the select gate line SG2 side to an end of the block BLOCK (i+1) at the select gate line SG2 side.

In this case, the position of the contact plug CP can be freely set in the range from one end to another end of each of the two blocks BLOCKi and BLOCK (i+1).

In addition, among the word lines WL in the blocks BLOCKi and BLOCK (i+1), fringes F connected to an i-th (i is an odd number) word line WL and an i+1-th word line WL from the select gate line SG1 that exists at the boundary side of the blocks BLOCKi and BLOCK (i+1) are disposed between the i-th word line WL and the i+1-th word line WL, respectively.

Further, the fringe F of the i-th word line WL and the fringe F of the i+1-th word line WL from the select gate line SG1 that exists at the boundary side of the blocks BLOCKi and BLOCK (i+1) are separated from each other by means of slits in the vertical direction (y-direction).

According to such a layout, a downsizing processing technique of forming a finer pattern than a resolution limit of lithography can be applied to processing of word lines of a nonvolatile semiconductor memory without causing a problem such as an increase in contact resistance relevant to word lines WL or short-circuit of the adjacent word lines.

FIGS. 52 to 55 each show a modification of the layout of FIG. 51.

Figure 52:
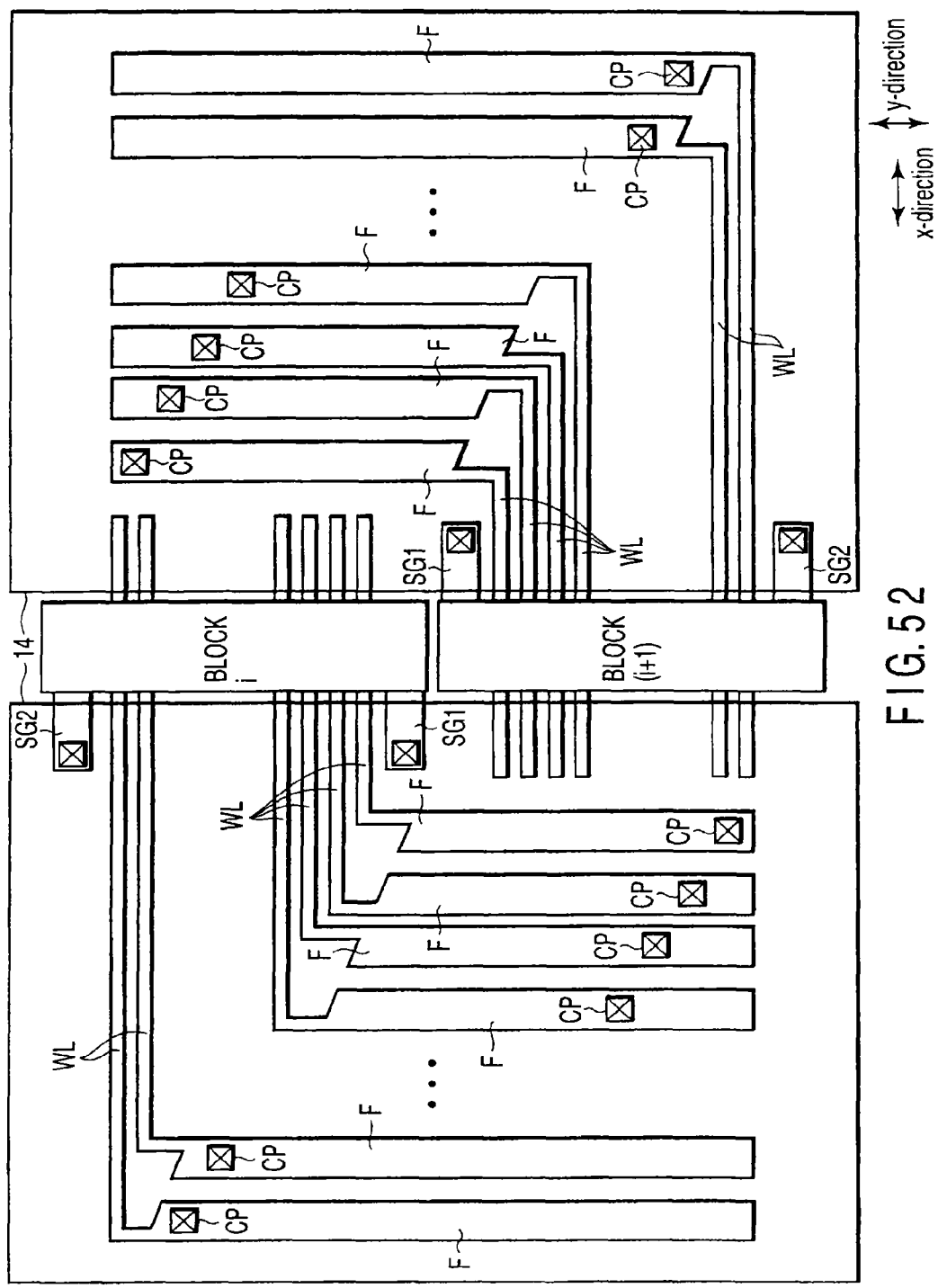
FIG. 52 is a detailed view showing a contact area.

In the example of FIG. 52, as compared with the layout of FIG. 51, there is a difference therebetween in that the corner portions of a fringe F close to a bent point of a plurality of word lines WL are cut out, and part of the fringe F is formed in a tapered shape. In this case, a mask can be formed in a simple shape in a mask process for forming the fringe F.

Figure 53:
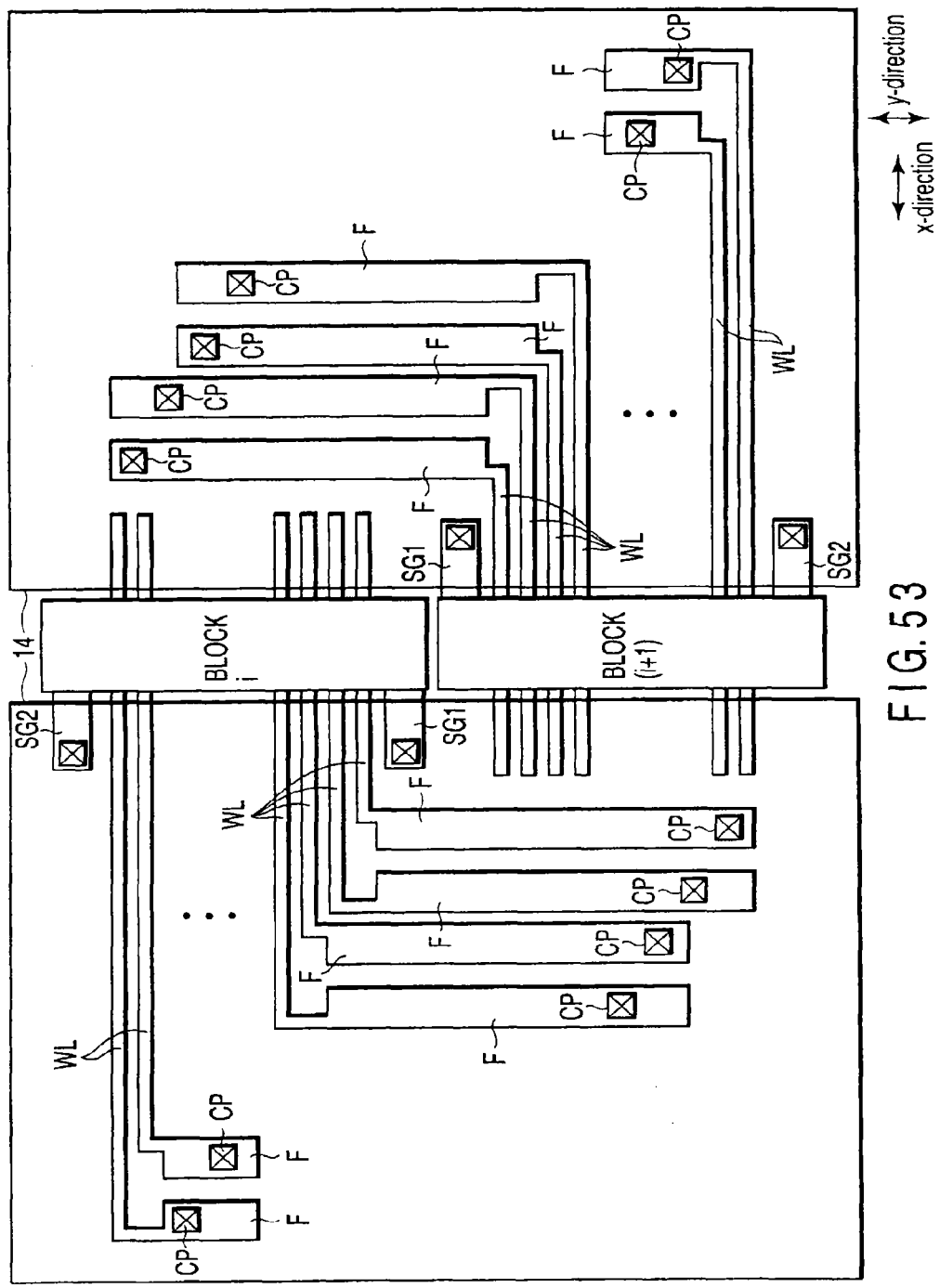
FIG. 53 is a detailed view showing a contact area.

In the example of FIG. 53, the positions of the distal ends of a plurality of word lines WL are differentiated from each other by two word lines WL. In this layout, the shape of a fringe F is adjusted to the layout of a contact plug CP.

A dummy pattern may be disposed in a free space provided in the contact area 14 (space in which no fringe F is formed).

Figure 54:
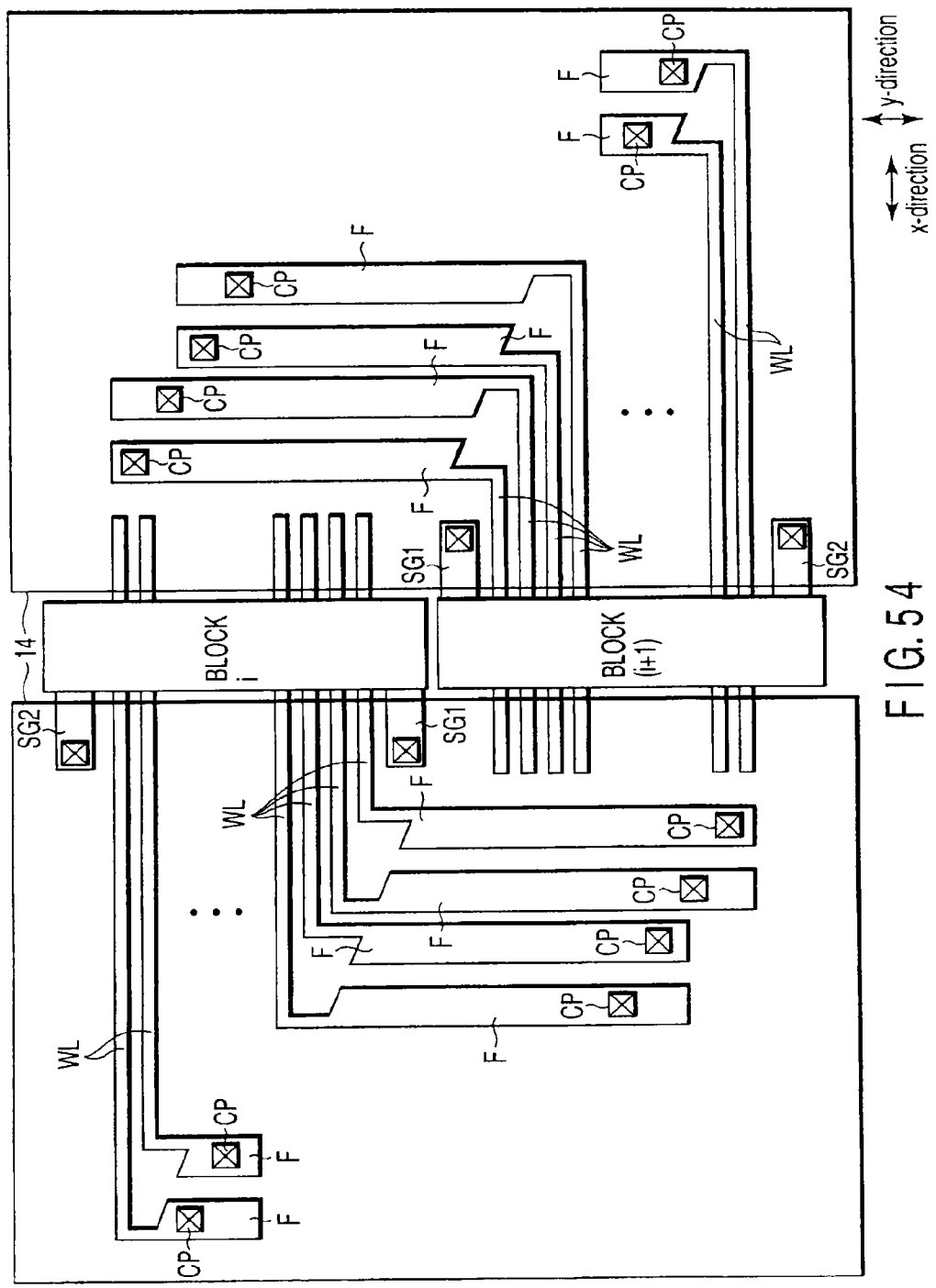
FIG. 54 is a detailed view showing a contact area.

In the example of FIG. 54, as compared with the layout of FIG. 53, there is a difference therebetween in that the corner portions of a fringe F close to a bent point of a plurality of word lines WL are cut out, and part of the fringe F is formed in a tapered shape. In this case, a mask can be formed in a simple shape in a mask process for forming the fringe F.

Figure 55:
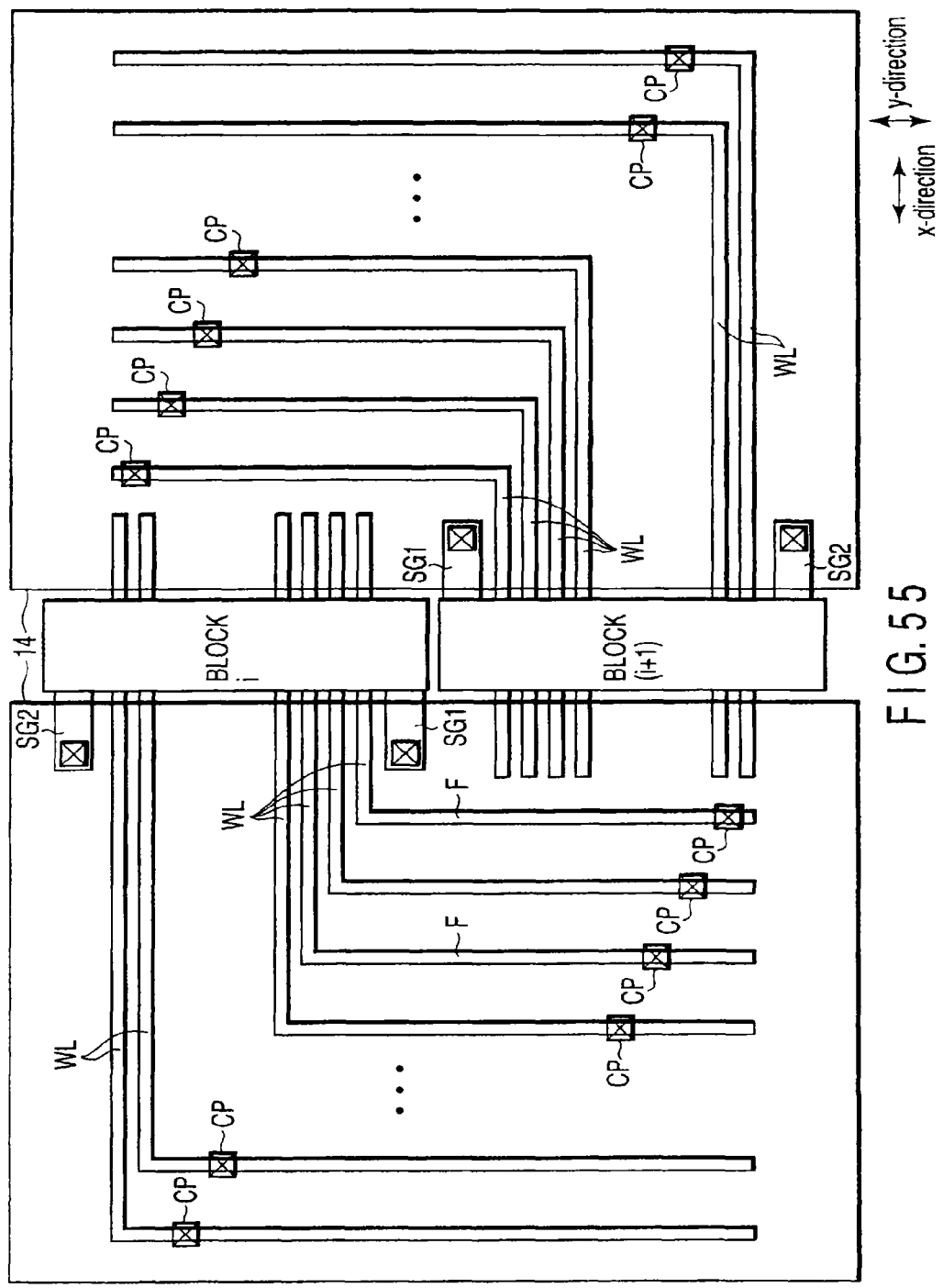
FIG. 55 is a detailed view showing a contact area.

In the example of FIG. 55, no fringe is provided at an end of each of a plurality of word lines WL. If no fringe is provided, the size in the x-direction of the contact area 14 can be reduced concurrently, thus making it possible to contribute to reduction of a chip area.

In spite of this situation, the position, size, and further, mutual pitches of a contact plug (contact hole) CP can be freely adjusted in the contact area 14, thus making it possible to provide a nonvolatile semiconductor memory having high reliability and high performance without causing a problem such as an increase in contact resistance or short-circuit between the word lines.

In the examples of FIGS. 51 to 55 each, although the contact plugs CP have an oblique layout, shifted in the y-direction by a predetermined pitch for every change in the word line WL, the layout is not limited thereto in particular. For example, the contact plugs CP may be laid out in a zigzag manner.

(7) Fourth Example of Word Line Layout

A fourth example is a modification of the first example.

The fourth example is significantly different from the first example in that, as in the third example, a plurality of word lines are not formed in a closed loop shape. In addition, in the fourth example, unlike the third example, a plurality of word lines in one block are divided into two groups, and thus, the directions in which the word lines are bent are different between these two groups.

Thus, with respect to a plurality of word lines, and particularly to a word line that is the closest to a select gate line SG1, a length from the bent point to its distal end is large as compared with that in the layout of FIG. 10, and the size in the x-direction of a contact area is small as compared with that in the layout of FIG. 50.

Figure 56:
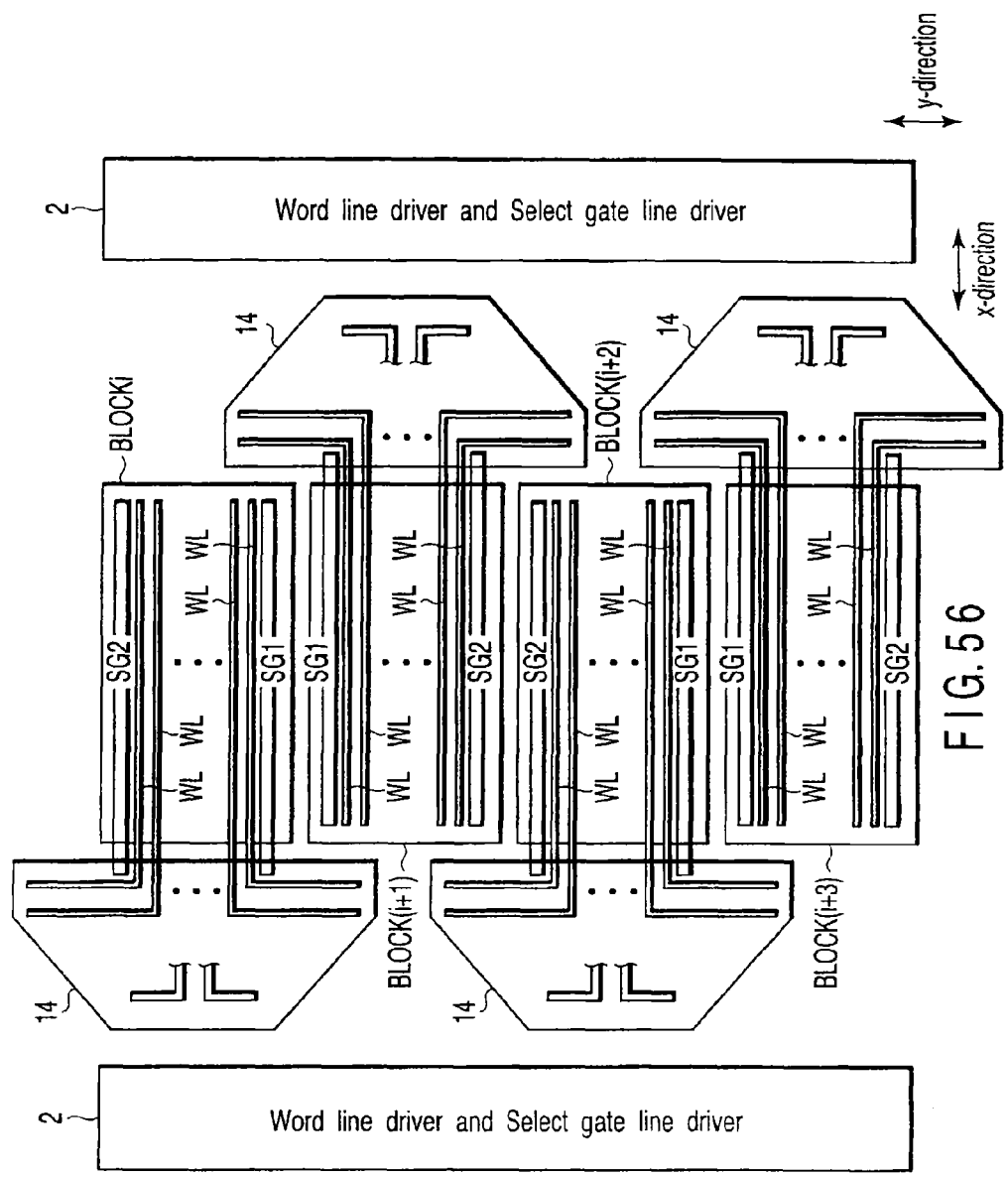
FIG. 56 is a view showing a fourth example of a word line layout.

FIG. 56 shows the fourth example of a word line layout.

Blocks BLOCKi, BLOCK (i+1), BLOCK (i+2), and BLOCK (i+3) represent blocks of memory cell arrays adjacent to each other.

A plurality of word lines WL and two select gate lines SG1 and SG2 sandwiching them are disposed, respectively, in the blocks BLOCKi, BLOCK (i+1), BLOCK (i+2), and BLOCK (i+3).

One of the two select gate lines SG1 and SG2 is a select gate line SGS of a source line side select gate transistor and the other one is a select gate line SGD of a bit line (drain) side select gate transistor (refer to FIGS. 8 and 9).

Word line/select gate line drivers 2 are disposed at the memory cell arrays, i.e., at both ends of the blocks BLOCKi, BLOCK (i+1), BLOCK (i+2), and BLOCK (i+3).

A contact area 14 is disposed between each of the blocks BLOCKi, BLOCK (i+1), BLOCK, (i+2), and BLOCK (i+3) and the word line/select gate line driver 2.

In the contact area 14 at one end of the block BLOCKi, an end of at least one word line at the select gate line SG1 side among a plurality of word lines WL in the block BLOCKi (for example, a half word line at the select gate line SG1 side) is bent to the select gate line SG1 side (in the y-direction and downwardly). An end of at least one word line at the selected gate line SG2 side among a plurality of word lines WL in the block BLOCKi (for example, a half word line at the select gate line SG2 side) is bent to the select gate line SG2 side (in the y-direction and upwardly).

Then, a fringe is provided between the bent point and its distal end, and a contact plug is connected to that fringe.

A distal end of at least one word line at the select gate line SG1 among a plurality of word lines WL in the block BLOCKi can be maximally extended to the center part in the y-direction of the block BLOCK (i+1).

In addition, in the contact area 14 at the other end of the block BLOCK (i+1), an end of at least one word line at the select gate line SG1 side among a plurality of word lines WL in the block BLOCK (i+1) (half word line at the select gate line SG1 side, for example) is bent to the select gate line SG1 side (in the y-direction and upwardly). An end of at least one word line at the select gate line SG2 side among a plurality of word lines WL in the block BLOCK (i+1) (half word line at the select gate line SG2 side, for example) is bent to the select gate line SG2 side (in the y-direction and downwardly).

Then, a fringe is provided between the bent point and its distal end, and then, a contact plug is connected to that fringe.

A distal end of at least one word line at the select gate line SG1 side among a plurality of word lines WL in the block BLOCK (i+1) can be maximally extended to the center part in the y-direction of the block BLOCKi. In addition, a distal end of at least one word line at the select gate line SG2 side among a plurality of word lines WL in the block BLOCK (i+1) can be maximally extended to the center part in the y-direction of the block BLOCK (i+2).

Similarly, in a contact area 14 at one end of the block BLOCK (i+2), an end of at least one word line at the select gate line SG1 side among a plurality of word lines WL in the block BLOCK (i+2) (for example, a half word line at the select gate line SG1 side) is bent to the select gate line SG1 side (in the y-direction and downwardly). An end of at least one word line at the select gate line SG2 side among a plurality of word lines WL in the block BLOCK (i+2) (for example, a half word line at the select gate line SG2 side) is bent to the select gate line SG2 side (in the y-direction and upwardly).

Then, a fringe is provided between the bent point and its distal end, and a contact plug is connected to that fringe.

A distal end of at least one word line at the select gate line SG1 side among a plurality of word lines WL in the block BLOCK (i+2) can be maximally extended to the center part in the y-direction of the block BLOCK (i+3). In addition, a distal end of at least one word line at the select gate line SG2 side among a plurality of word lines WL in the block BLOCK (i+2) can be maximally extended to the center part in the y-direction of the block BLOCK (i+1).

In addition, in the contact area 14 at the other end of the block BLOCK (i+3), an end of at least one word line at the select gate line SG1 side among a plurality of word lines WL in the block (i+3) (for example, a half word line at the select gate line SG1 side) is bent to the select gate line SG1 side (in the y-direction and upwardly). An end of at least one word line at the select gate line SG2 side among a plurality of word lines WL in the block BLOCK (i+3) (for example, a half word line at the select gate line 2 side) is bent to the select gate line SG2 side (in the y-direction and downwardly).

Then, a fringe is provided between the bent point and its distal end, and a contact plug is connected to that fringe.

A distal end of at least one word line at the select gate line SG1 side among a plurality of word lines WL in the block BLOCK (i+3) can be maximally extended to the center part in the y-direction of the block BLOCK (i+2).

Here, as is evident from comparison with FIG. 10 (first example) and FIG. 56 (fourth example), it is found that, among a plurality of word lines WL in the blocks BLOCKi, BLOCK (i+1), BLOCK (i+3), and BLOCK (i+4), a length from the bent point to the distal end of a word line that is the closest to the select gate lines SG1 and SG2 in the fourth example is larger than that in the first example.

Thus, in the fourth example, as in the third example, the size in the y-direction of the fringe can be increased, and the degree of freedom of a position of a contact plug can be improved.

However, the position of a distal end of each of a plurality of word lines WL can be freely set. That is, the position of the distal end may not extend to the center part of another block or the positions of distal ends of all the word lines WL may not be identical to one another.

In addition, a method for dividing a plurality of word lines in one block into two groups is not limited. That is, the numbers of word lines in the two groups may be different from each other.

The word lines WL in the blocks BLOCKi, BLOCK (i+1), BLOCK (i+2), and BLOCK (i+3) are separated from each other in an area other than the memory cell array, and their respective independencies are allocated.

Figure 57:
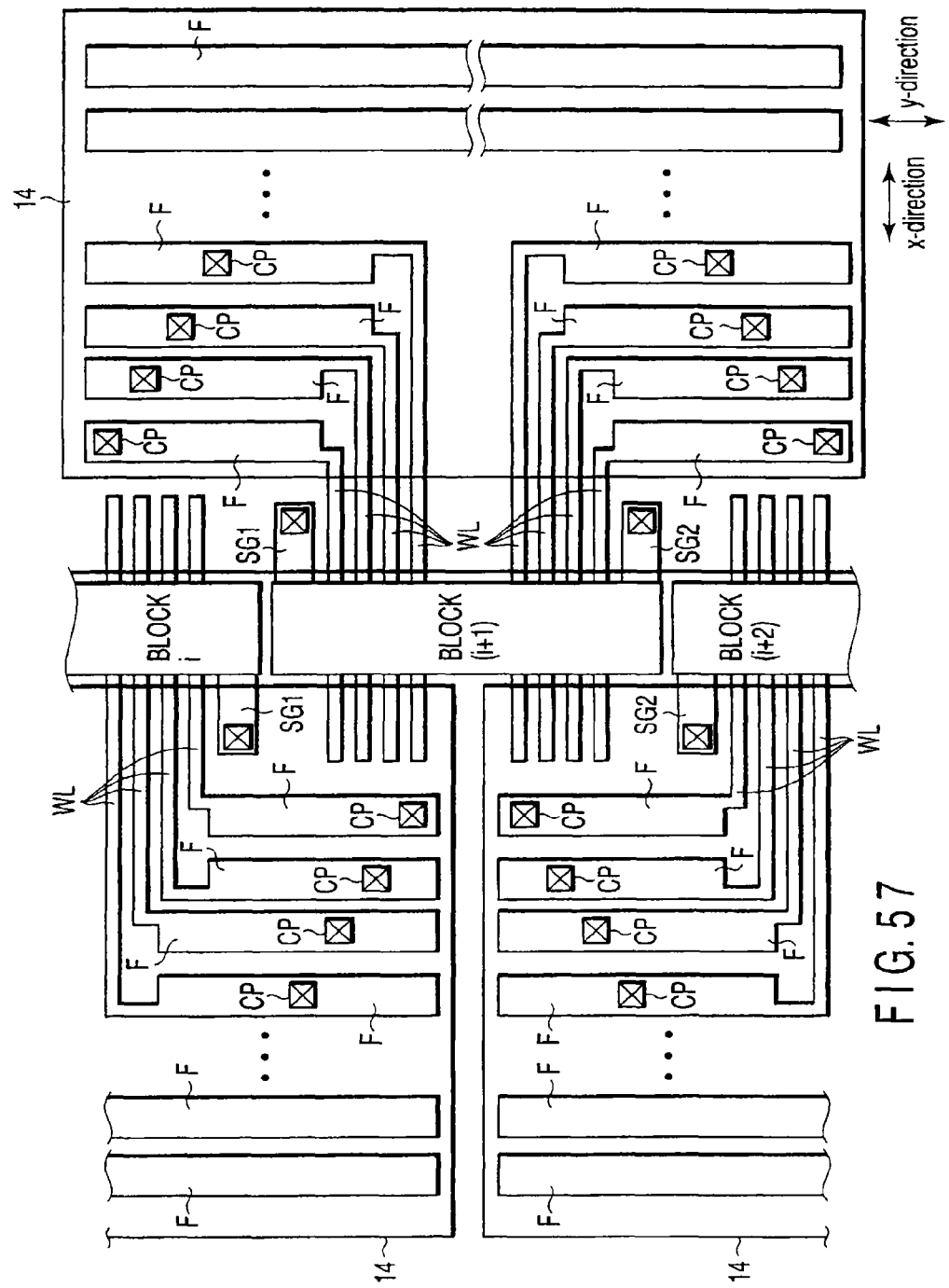
FIG. 57 is a detailed view showing a contact area.

FIG. 57 is a detailed view showing a layout of word lines in the contact area 14 of FIG. 56.

According to the fourth example, as in the third example, with respect to a fringe F and a contact plug CP, their positions, sizes, and further, mutual pitches can be freely adjusted in a two dimensional manner (x-direction and y-direction) in the contact area 14.

That is, the positions, sizes, and pitches in the x-direction of the fringe F and the contact plug CP can be adjusted at a position of the bent point of a word line WL, and the positions, size, and pitches in the y-direction of the fringe F and the contact plug CP can be adjusted in the range from the bent point of the word line WL to its distal end.

Here, in the present example, all of the distal ends of half of the select gate line SG1 side among a plurality of word lines WL of the block BLOCK (i+1), for example, extend to the center part in the y-direction of the block BLOCKi. All of the distal ends of half of the select gate line SG2 side among a plurality of word lines WL of the block BLOCK (i+1) extend to the center part in the y-direction of the block BLOCK (i+2).

In addition, the contact plug CP relevant to half of the select gate line SG1 side among a plurality of word lines WL is obliquely laid out in the range from the center part of the block BLOCKi to the center part of the block BLOCK (i+1). The contact plug CP relevant to half of the select gate line SG2 side among a plurality of word lines WL is obliquely laid out in the range from the center part of the block BLOCK (i+1) to the center part of the block BLOCK (i+2).

In addition, among the word lines WL in the blocks BLOCKi and BLOCK (i+1), the fringes F connected to an i-th (i is an odd number) word line WL and an i+1-th word line from the select gate line SG1 that exists at the boundary side of the blocks BLOCKi and BLOCK (i+1) are disposed between the i-th word line WL and the i+1-th word line WL, respectively.

Further, the fringe F of the i-th word line WL and the fringe F of the i+1-th word line WL from the select gate line SG1 that exists at the boundary side of the blocks BLOCK1 and BLOCK (i+1) are separated from each other by means of slits in the vertical direction (y-direction).

Similarly, among the word lines WL in the blocks BLOCK (i+1) and BLOCK (i+2), the fringes F connected to an i-th (i is an odd number) word line WL and an i+1-th word line WL from the select gate line SG2 that exists at the boundary side of the blocks BLOCK (i+1) and BLOCK (i+2) are disposed between the i-th word line WL and the i+1-th word line WL, respectively.

Further, the fringe F of the i-th word line WL and the fringe F of the i+1-th word line WL from the select gate line SG2 that exists at the boundary side of the blocks BLOCKi and BLOCK (i+1) are separated from each other by means of slits in the vertical direction (y-direction).

According to such a layout, a downsizing processing technique of forming a finer pattern than a resolution limit of lithography can be applied to processing of word lines of a nonvolatile semiconductor memory without causing a problem such as an increase in contact resistance relevant to word lines WL or short-circuit of the adjacent word lines.

FIGS. 58 to 61 each show a modification of a layout of FIG. 57.

Figure 58:
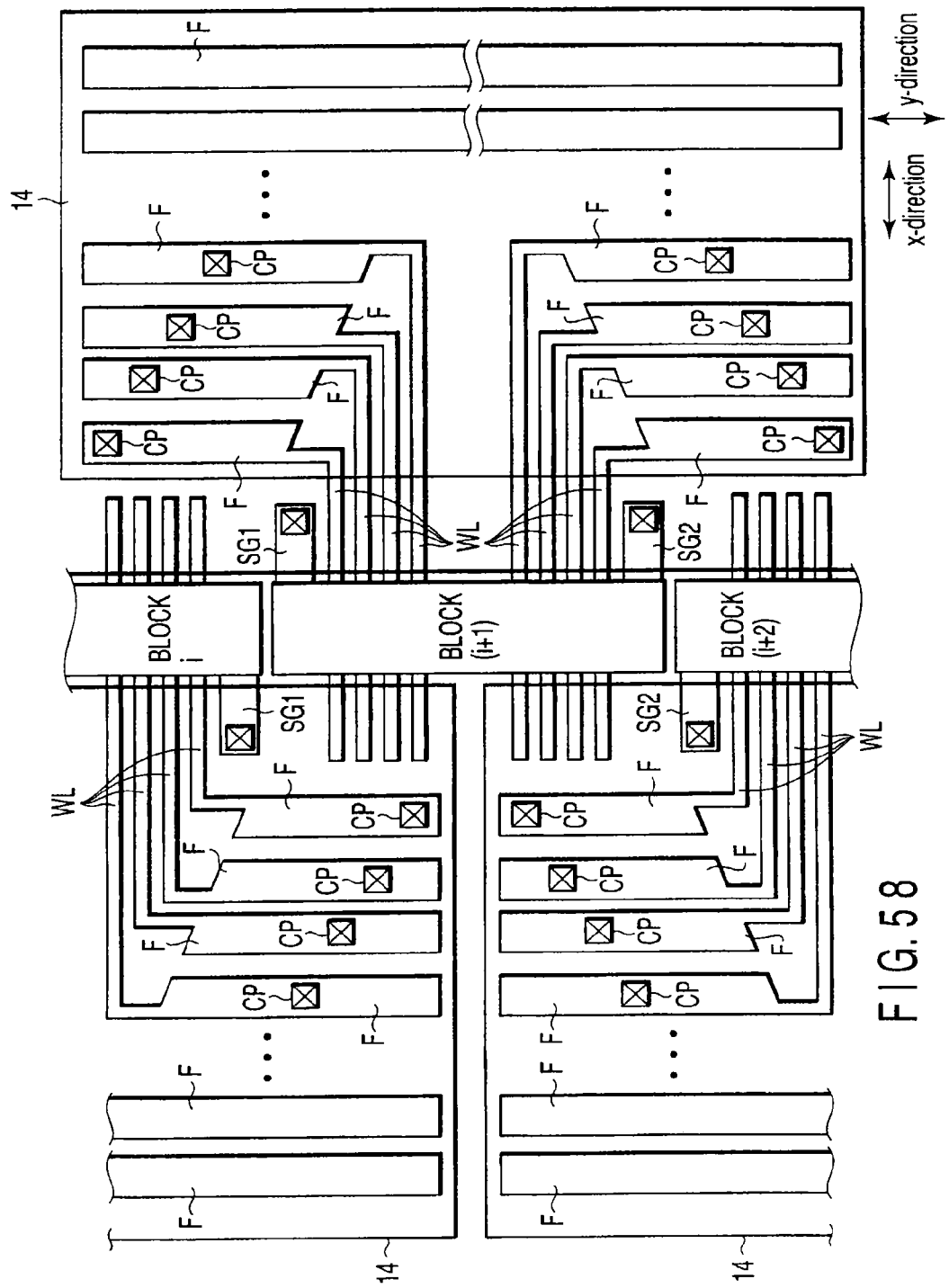
FIG. 58 is a detailed view showing a contact area.

In the example of FIG. 58, as compared with the layout of FIG. 57, there is a difference therebetween in that the corner portions of a fringe F close to a bent point of a plurality of word lines WL are cut out, and part of the fringe F is formed in a tapered shape. In this case, a mask can be formed in a simple shape in a mask process for forming the fringe F.

In the example of FIG. 59, the positions of distal ends of a plurality of word lines WL are different from each other by two word lines WL. In this layout, the shape of the fringe F is adjusted to the layout of a contact plug CP.

A dummy pattern may be disposed in a free space provided in the contact area 14 (in a space in which the fringe F is not formed).

Figure 60:
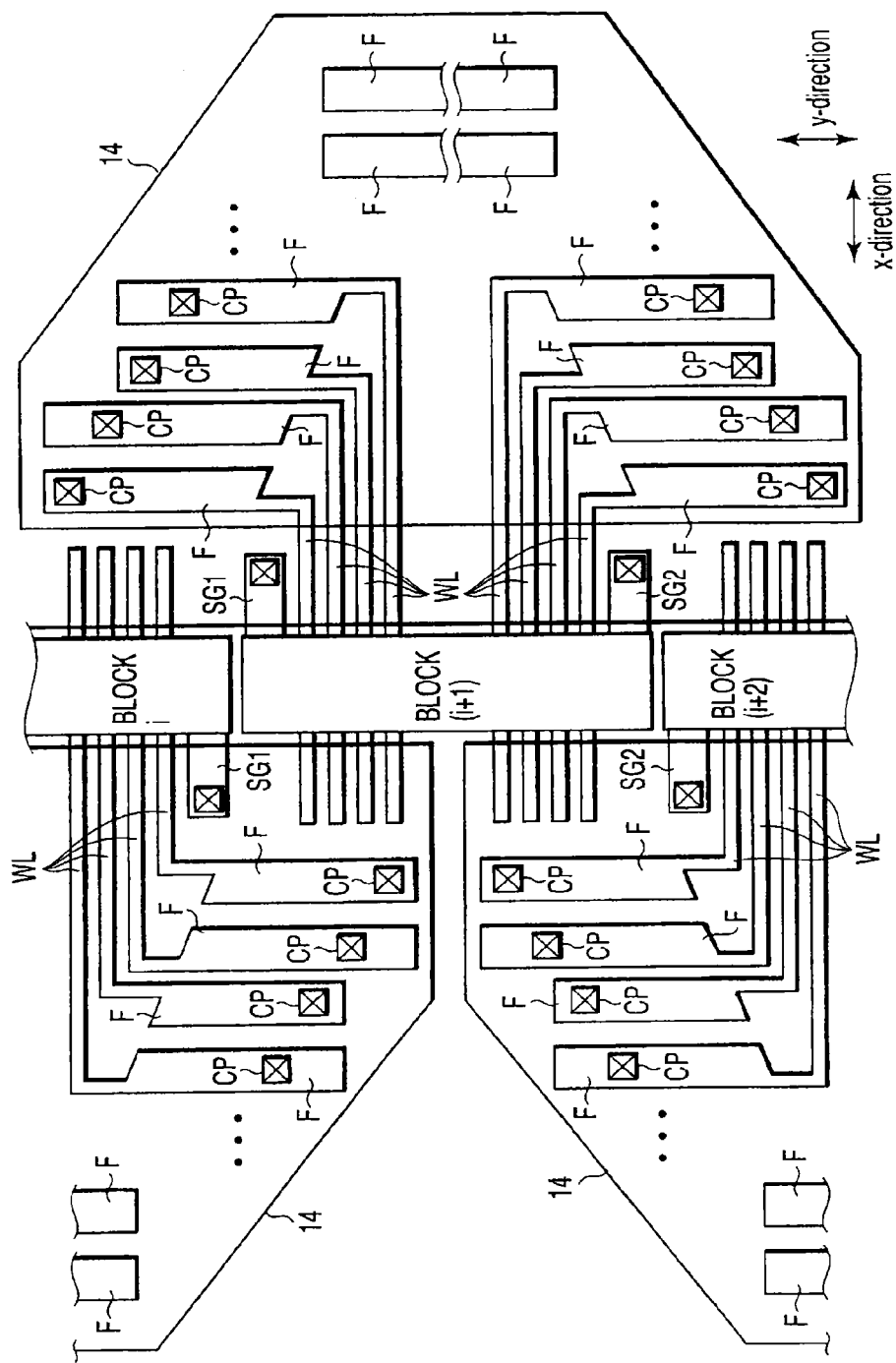
FIG. 60 is a detailed view showing a contact area.

In the example of FIG. 60, as compared with the layout of FIG. 59, there is a difference therebetween in that the corner portions of a fringe F close to a bent point of a plurality of word lines WL are cut out, and part of the fringe F is formed in a tapered shape. In this case, a mask can be formed in a simple shape in a mask process for forming the fringe F.

Figure 61:
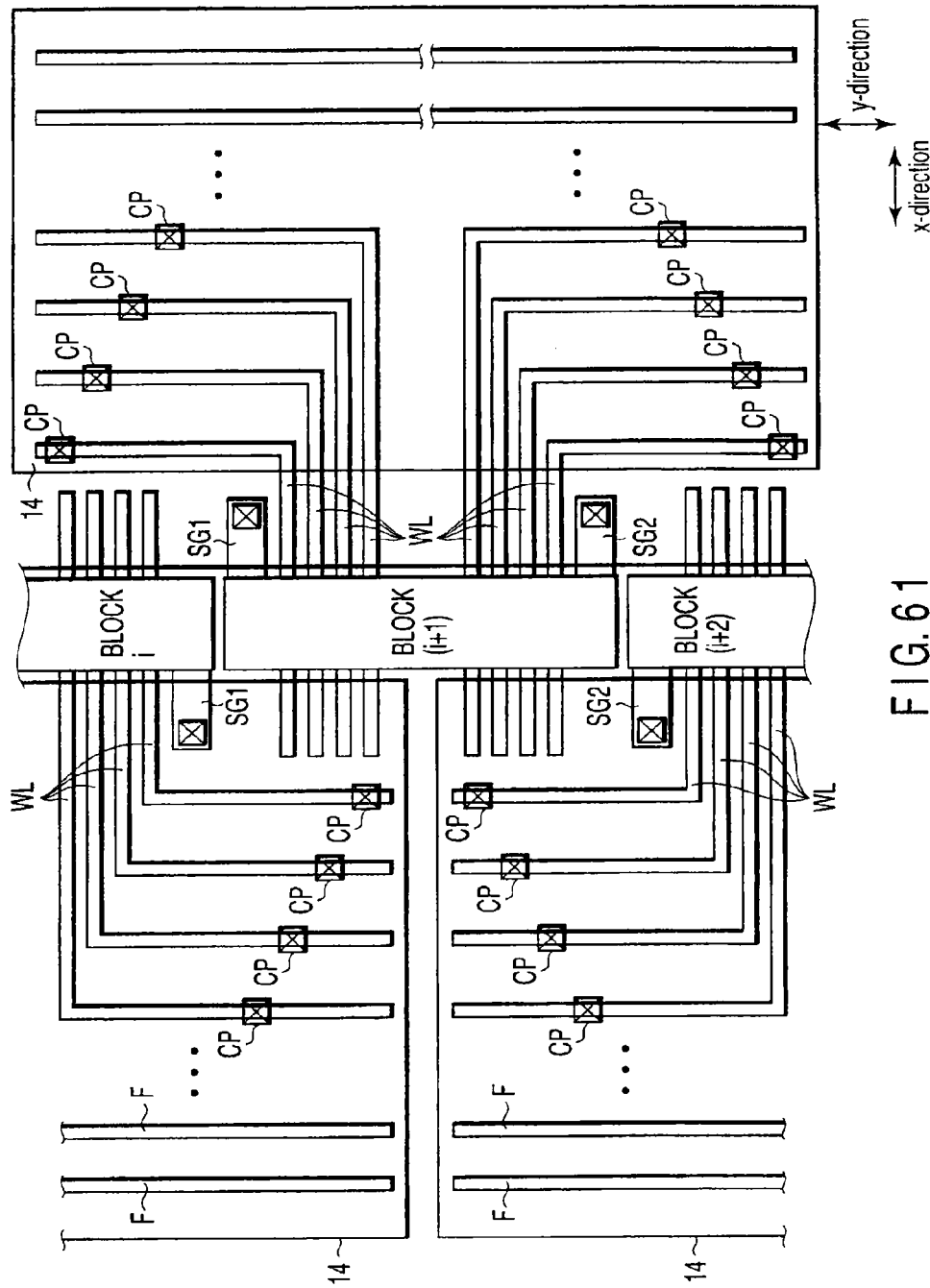
FIG. 61 is a detailed view showing a contact area.

In the example of FIG. 61, no fringe is provided at an end of each of a plurality of word lines WL. If no fringe is provided, the size in the x-direction of the contact area 14 can be reduced concurrently, thus making it possible to contribute to reduction of a chip area.

In spite of this situation, the position, size, and further, mutual pitches of a contact plug (contact hole) CP can be freely adjusted in the contact area 14, thus making it possible to provide a nonvolatile semiconductor memory having high reliability and high performance without causing a problem such as an increase in contact resistance or short-circuit between the word lines.

In the examples of FIGS. 57 to 61 each, although the contact plugs CP have an oblique layout, shifted in the y-direction by a predetermined pitch for every change in the word line WL, the layout is not limited thereto in particular. For example, the contact plugs CP may be laid out in a zigzag manner.

(8) Second Example of Manufacturing Method

Now, a description will be given below with respect to a second example of a method for manufacturing a nonvolatile semiconductor memory having a word line layout according to an example of the present invention.

First, as shown in FIGS. 62 to 66, an element isolation insulation layer 31 having an STI (shallow trench isolation) structure is formed in a semiconductor substrate 30. In addition, a gate insulation layer 32 is formed on an element area surrounded by the element isolation insulation layer 31. The gate insulation layer 32 is made of silicon oxide or a laminate structure including the silicon oxide, for example.

Then, a floating gate electrode member 33, an inter-gate insulation film 34, and a word line (floating gate electrode) member 35 are sequentially formed on the gate insulation layer 32.

Although the floating gate electrode member 33 may be made of any electrically conductive material, electrically conductive poly-silicon is mainly used. The inter-gate insulation film 34 is provided as a three-layered structure of ONO, for example. Although the word line member 35 may also be made of any electrically conductive material, a laminate structure of electrically conductive poly-silicon and silicide is mainly used.

While the inter-gate insulation film 34 is disposed entirely between the floating gate electrode member 33 and the word line member 35 in a memory cell area MA in which memory cells are formed, part of the inter-gate insulation film 34 between the floating gate electrode member 33 and the word line member 35 is removed in a select gate transistor area SA in which a select gate transistor is formed.

Then, mask members 36 and 37 are sequentially formed on the word line member 35. The mask members 36 and 37 are comprised materials different from each other.

Then, a photoresist 38 is formed on the mask member 37.

The photoresist 38 is processed in a predetermined pattern in accordance with a photolithography process. For example, a line & space resist pattern is formed in the select gate transistor area SA and an L-shaped resist pattern that surrounds a resist pattern of the select gate transistor area SA is formed in the memory cell area MA.

Here, the L-shaped photoresist 38 is formed in a line & space pattern in a memory cell array 1, for example, and is formed in a size (width in the x-direction) and pitches considering a layout of fringes or contact holes in a contact area 14.

The pitches of the line & space of the photoresist 38 are set to 120 nm (line=60 nm and space=60 nm).

Figure 62:
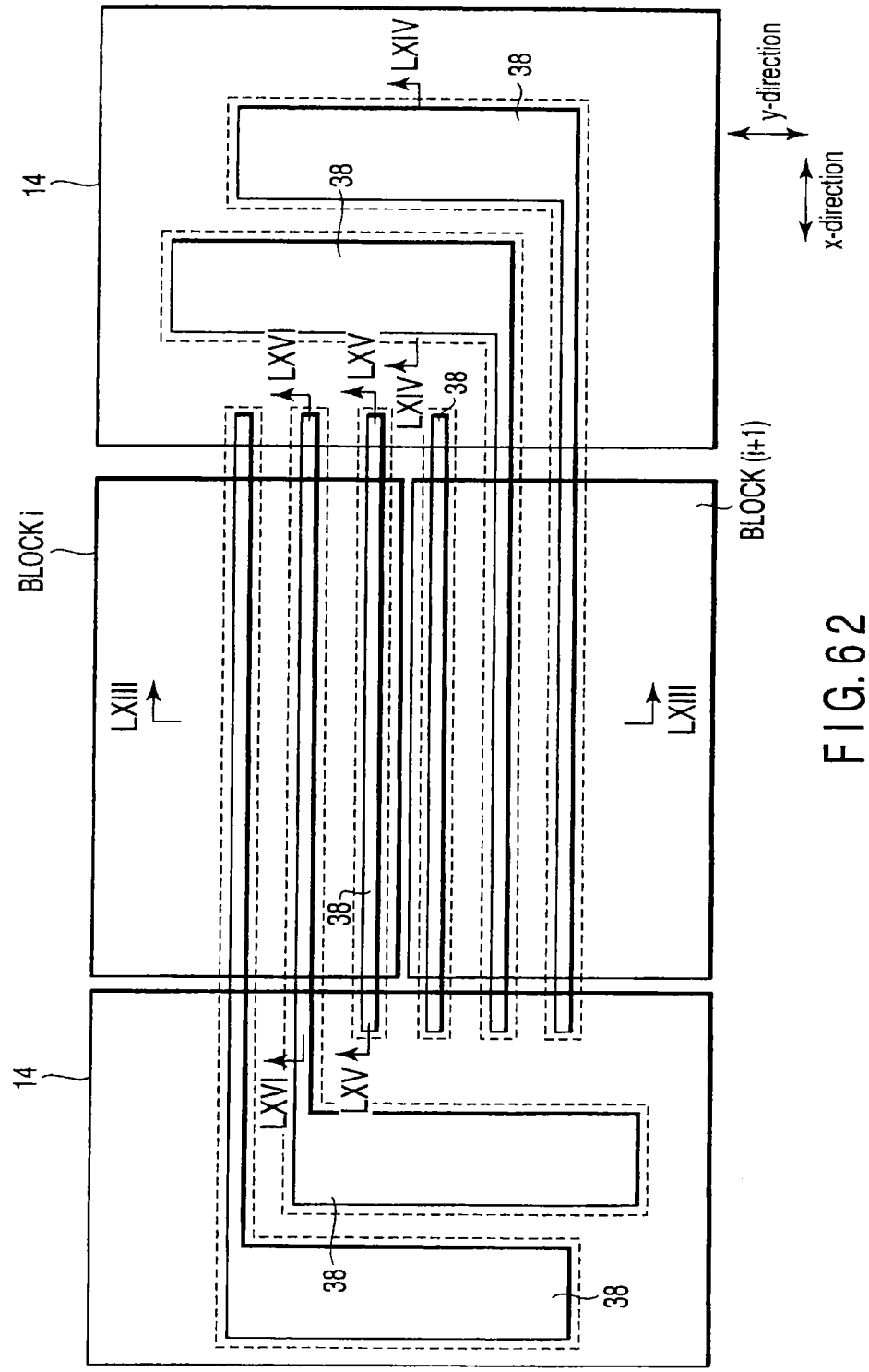
FIG. 62 is a plan view showing one process in a method for manufacturing a nonvolatile semiconductor memory.
Figure 63:
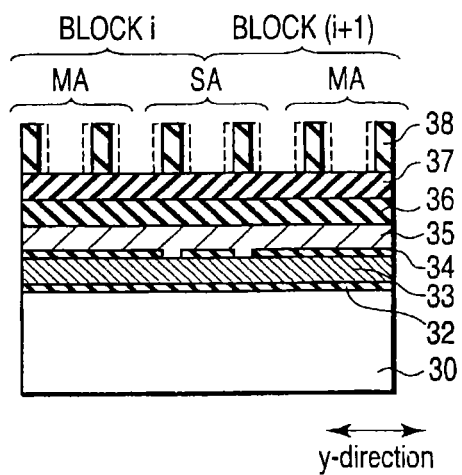
FIG. 63 is a sectional view taken along the line LXIII-LXIII of FIG. 62.
Figure 64:
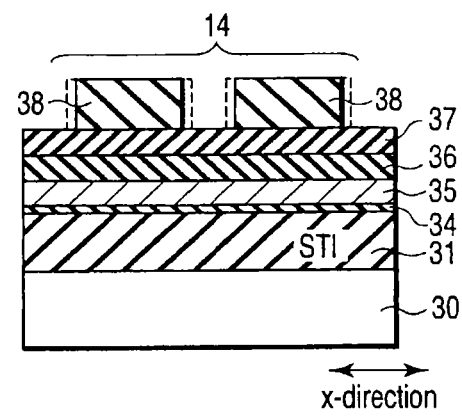
FIG. 64 is a sectional view taken along the line LXIV-LXIV of FIG. 62.
Figure 65:
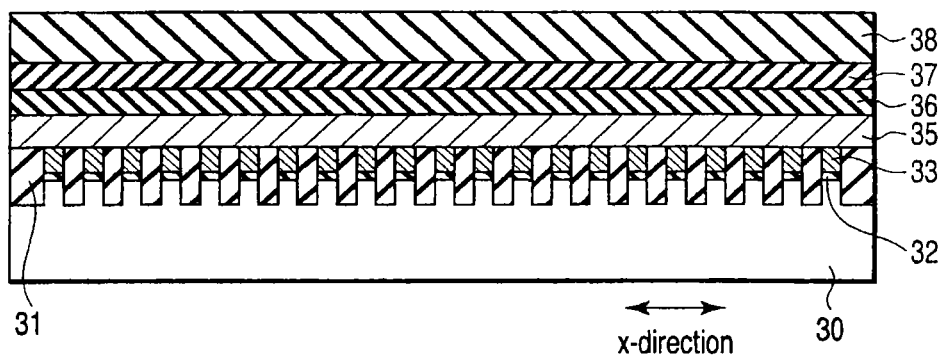
FIG. 65 is a sectional view taken along the line LXV-LXV of FIG. 62.
Figure 66:
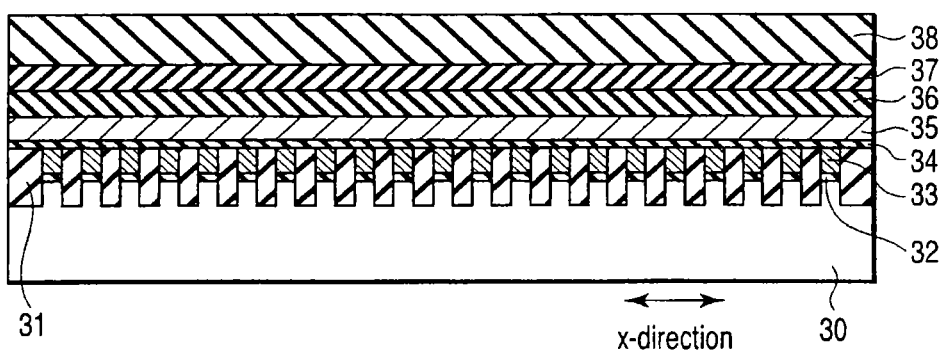
FIG. 66 is a sectional view taken along the line LXVI-LXVI of FIG. 62.
Figure 67:
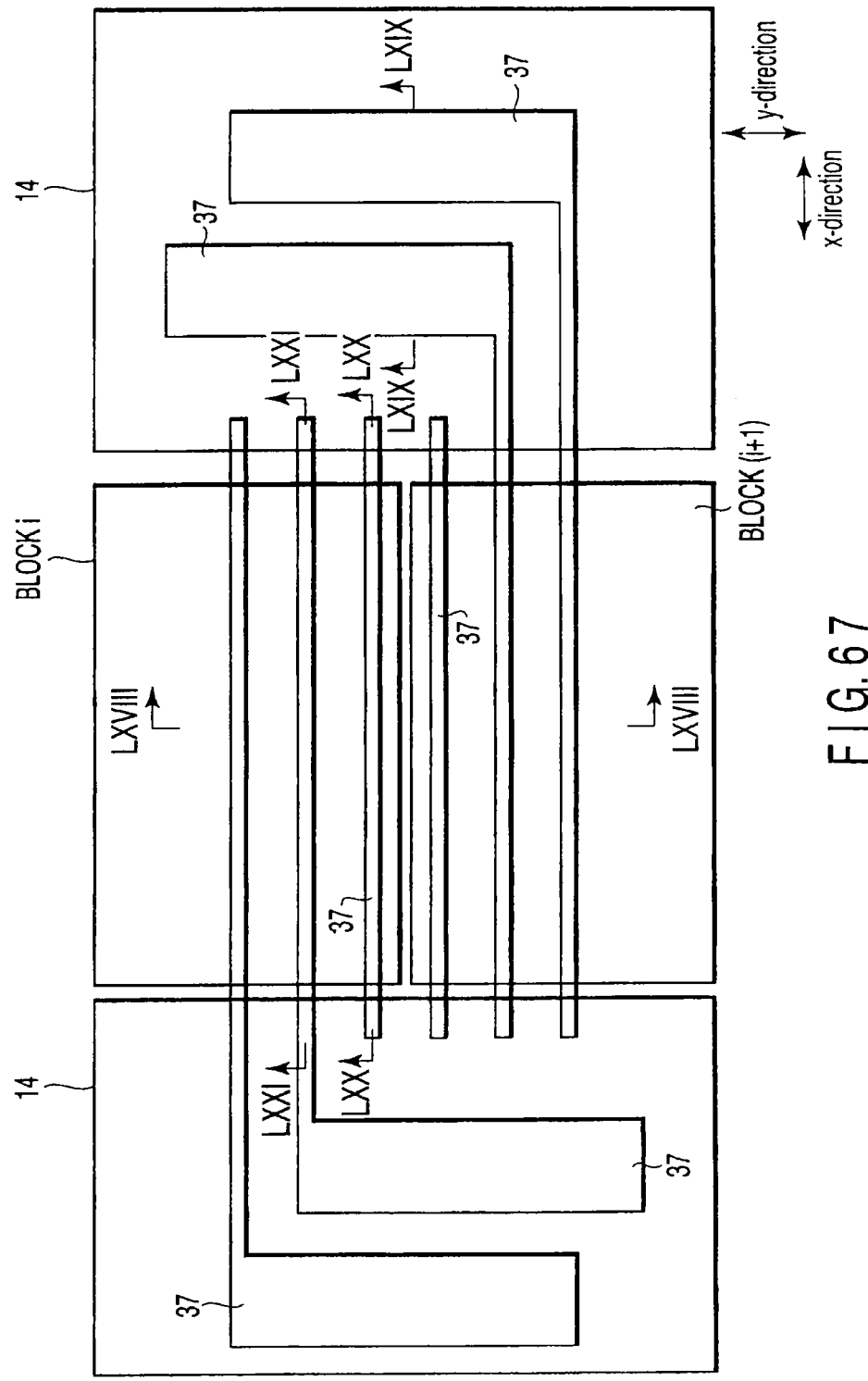
FIG. 67 is a plan view showing one process in a method for manufacturing a nonvolatile semiconductor memory.
Figure 72:
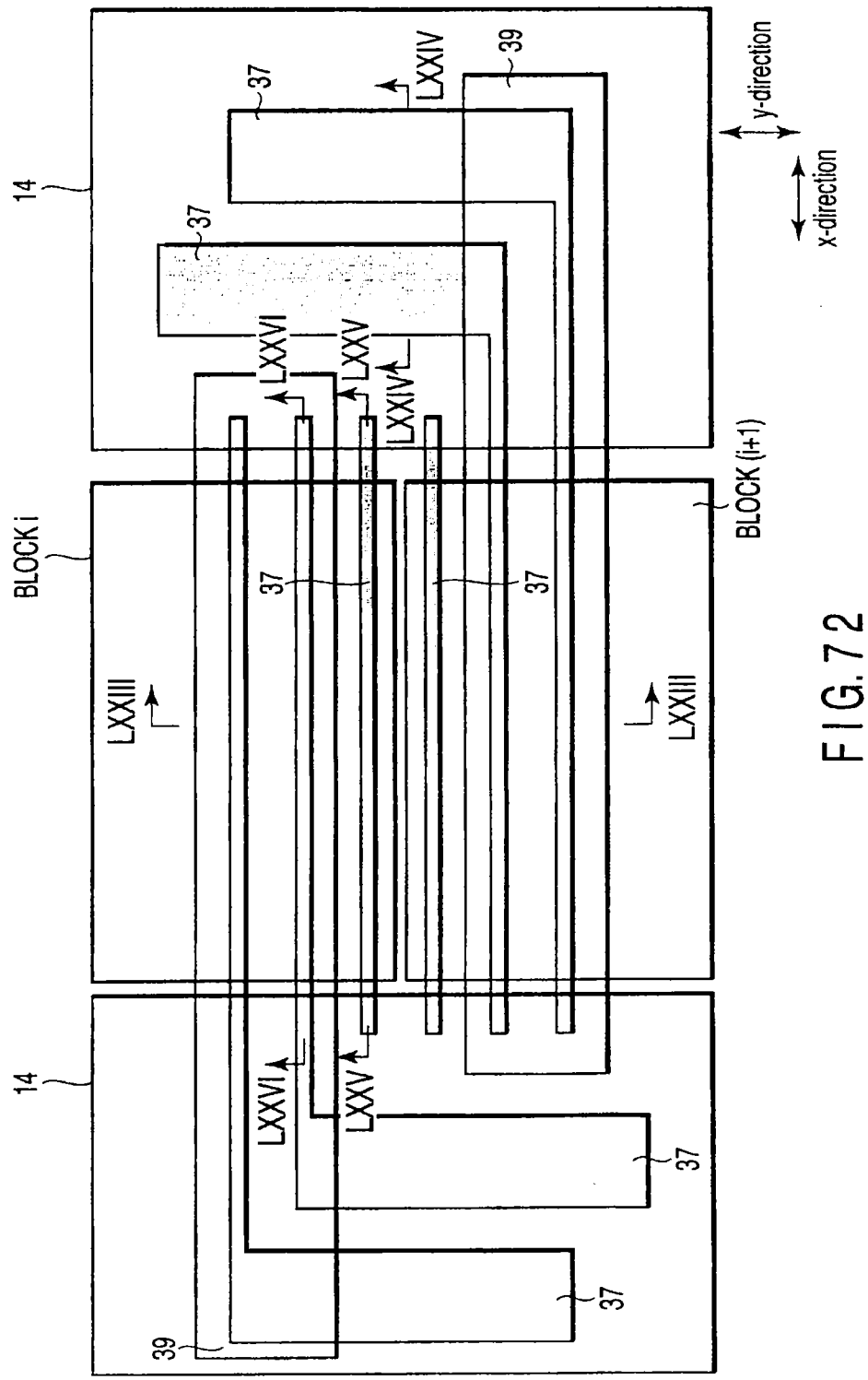
FIG. 72 is a plan view showing one process in a method for manufacturing a nonvolatile semiconductor memory.
Figure 73:
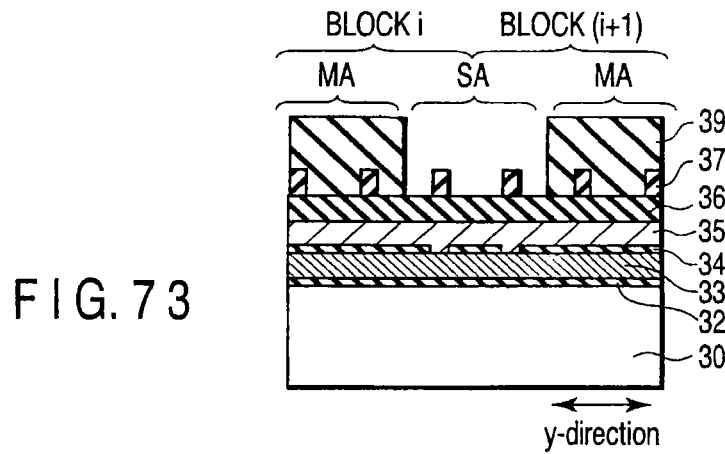
FIG. 73 is a sectional view taken along the line LXXIII-LXXIII of FIG. 72.
Figure 74:
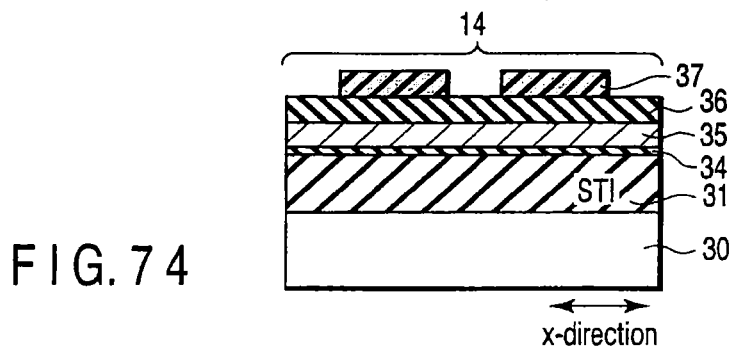
FIG. 74 is a sectional view taken along the line LXXIV-LXXIV of FIG. 72.
Figure 75:
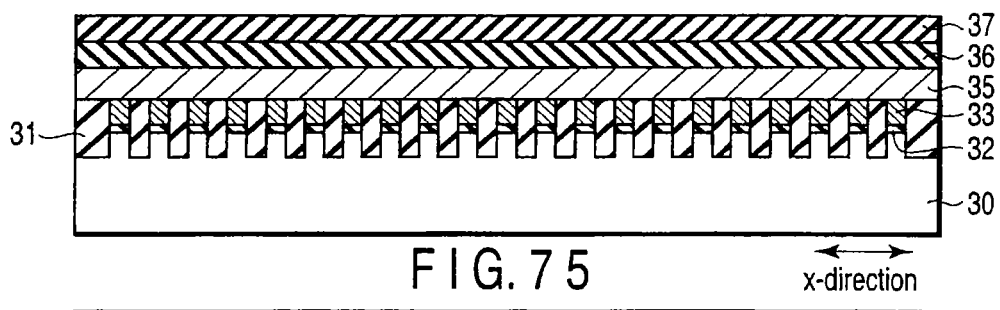
FIG. 75 is a sectional view taken along the line LXXV-LXXV of FIG. 72.
Figure 76:
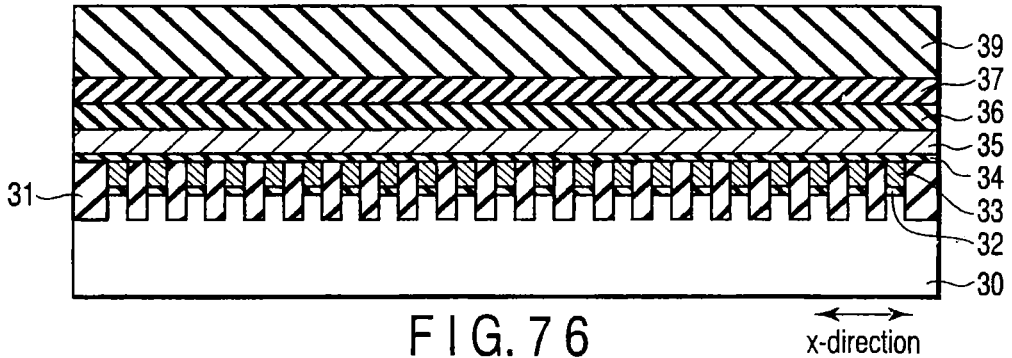
FIG. 76 is a sectional view taken along the line LXXVI-LXXVI of FIG. 72.

In addition, the width of the photoresist 38 can be reduced more remarkably than a limit of resolution of photolithography in accordance with a slimming technique. In FIGS. 62 to 64, the dotted line represents a pattern of the photoresist 38 before being slimmed and the solid line represents a pattern of the photoresist 38 after being slimmed.

For example, in accordance with the slimming technique, the width (line) of the photoresist 38 is set to 30 nm and the space is set to 90 nm.

Then, using the photoresist 38 as a mask, the photoresist 38 is removed after the mask member 37 is etched in accordance with RIE.

As a result, as shown in FIGS. 67 to 71, a pattern of the photoresist 38 shown in each of FIGS. 62 to 66 is transferred onto the mask member 37.

Next, as shown in FIGS. 72 to 76, a photoresist 39 is formed on each of the mask members 36 and 37 again.

The photoresist 39 is formed to be a pattern having a slit (aperture) extending in the x-direction from the top of the select gate transistor area SA to the top of the contact area 14 in accordance with a photolithography process, the pattern fully covering the top of the memory cell area MA.

Then, only a portion of the mask member 37 that is not covered with the photoresist 39 is selectively solidified. In the same etching condition, an etching selection ratio of the solidified mask member 37 is reduced to be smaller than that of the mask member 37 that is covered with the photoresist 39 and not solidified.

Here, the solidified portions are designated by gray.

Then, the photoresist 39 is removed.

Next, as shown in FIGS. 77 to 81, using the mask member (including solidified portion) 37 as a mask, a mask, the mask member 36 is etched in accordance with RIE, and then, a pattern of the mask member 37 is transferred onto the mask member 36.

In addition, on the mask members 36 and 37, a mask member 40 fully covering them is formed. The mask member 40 is assumed to have an etching selection ratio equal to or almost equal to that of the solidified mask member 37 in the same etching condition.

Then, the mask member 40 is etched in accordance with RIE, and then, the mask member 40 is left on only the side wall of each of the mask members 36 and 37. The width in the horizontal direction of the mask member 40 on the side wall of each of the mask members 36 and 37 is set to 30 nm, for example.

Then, if the mask members 36 and 37 are selectively etched, a fine mask pattern (for example, line=30 nm and space=30 nm) using the mask member 40 is formed as shown in FIGS. 82 and 83.

Here, when the mask members 36 and 37 are etched, the solidified mask member 37 is left together with the mask member 40 without being etched. Thus, the width of each of the mask members 36, 37, and 40 in the select gate transistor area SA is larger than that of the mask member 40 in the memory cell area MA.

For example, the width of each of the mask members 36, 37, and 40 in the select gate transistor area SA is obtained at 90 nm.

The mask members 36, 37, and 40 remain at a portion at which a fringe in the contact area 14 is formed.

Note that, with respect to etching of the mask members 36 and 37, one of dry etching (anisotropic etching) and wet etching (isotropic etching) is used.

Although dry etching is advantageous in improvement of processing precision, the mask member (side wall) 40 that is a fine pattern may be damaged.

In contrast, wet etching does not damage the mask member (side wall) 40.

A problem associated with processing precision caused by wet etching occurs at a portion at which the fringe in the contact area 14 is formed.

Figure 77:
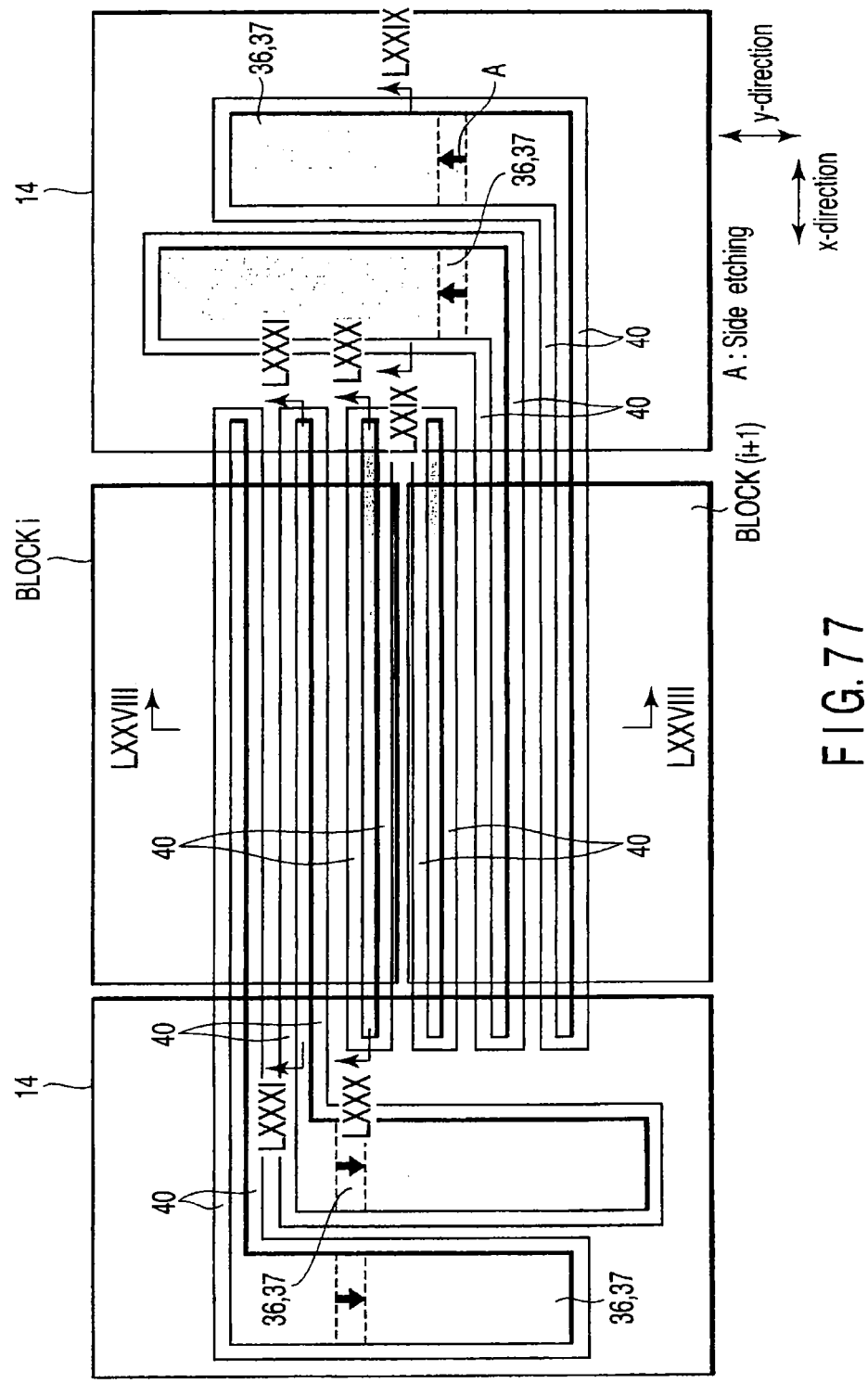
FIG. 77 is a plan view showing one process in a method for manufacturing a nonvolatile semiconductor memory.
Figure 78:
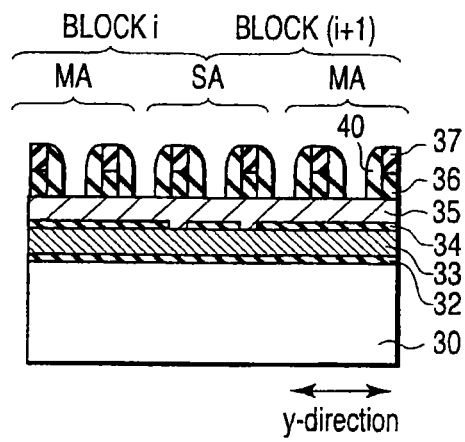
FIG. 78 is a sectional view taken along the line LXXVIII-LXXVIII of FIG. 77.
Figure 79:
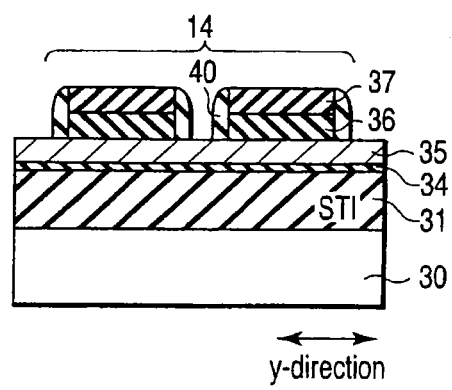
FIG. 79 is a sectional view taken along the line LXXIX-LXXIX of FIG. 77.
Figure 80:
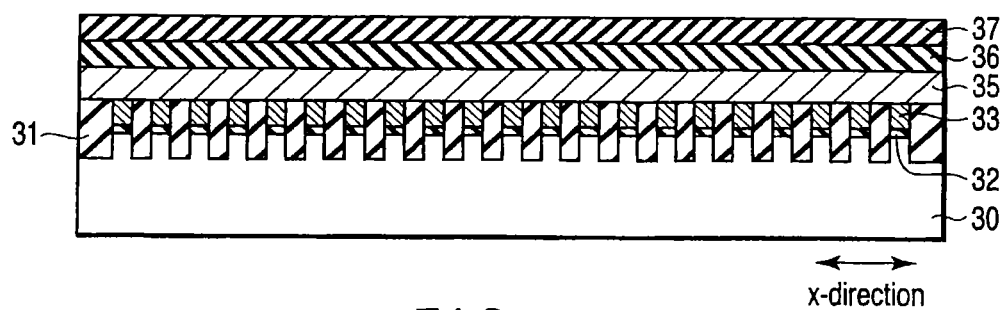
FIG. 80 is a sectional view taken along the line LXXX-LXXX of FIG. 77.
Figure 84:
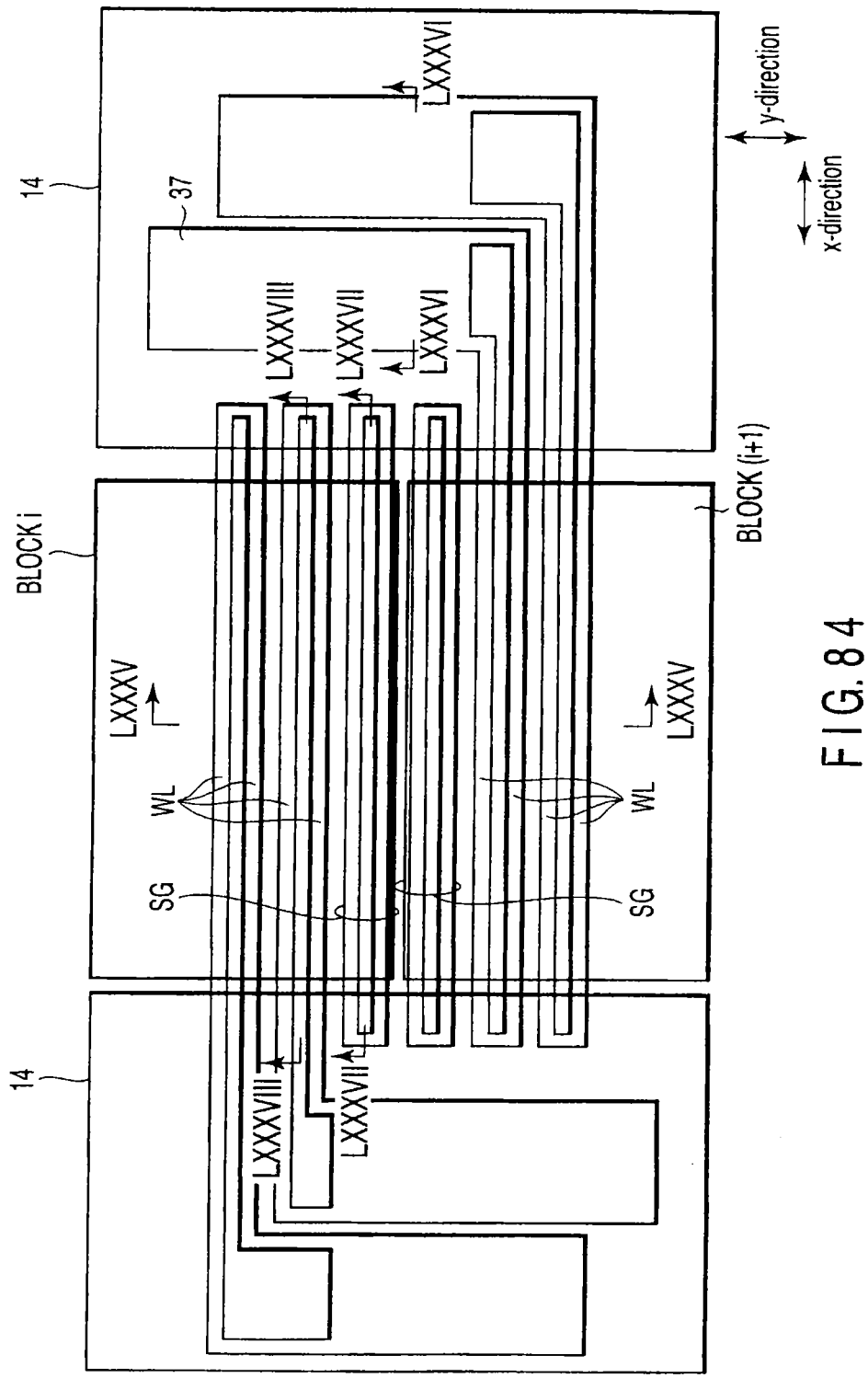
FIG. 84 is a plan view showing one process in a method for manufacturing a nonvolatile semiconductor memory.
Figure 85:
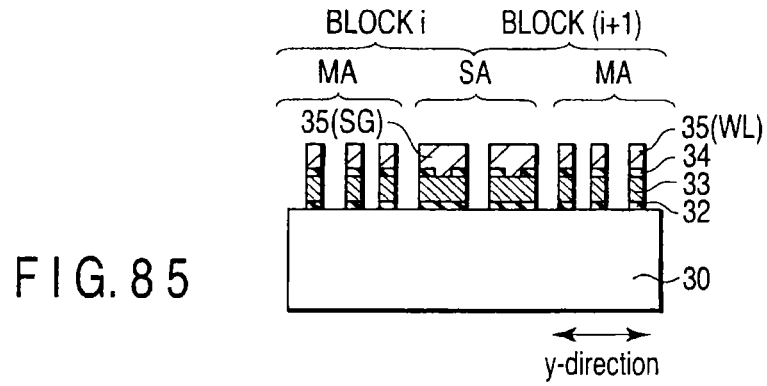
FIG. 85 is a sectional view taken along the line LXXXV-LXXXV of FIG. 84.
Figure 86:
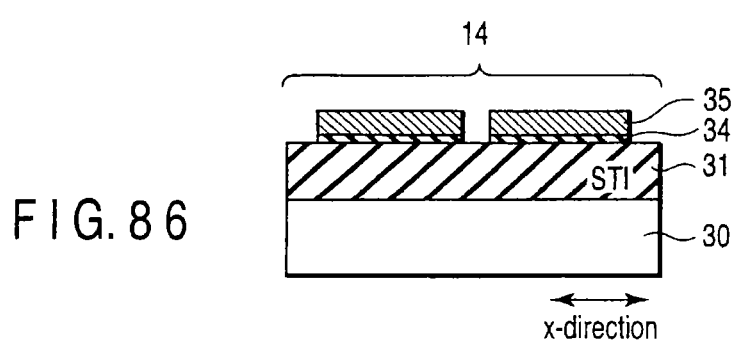
FIG. 86 is a sectional view taken along the line LXXXVI-LXXXVI of FIG. 84.
Figure 87:
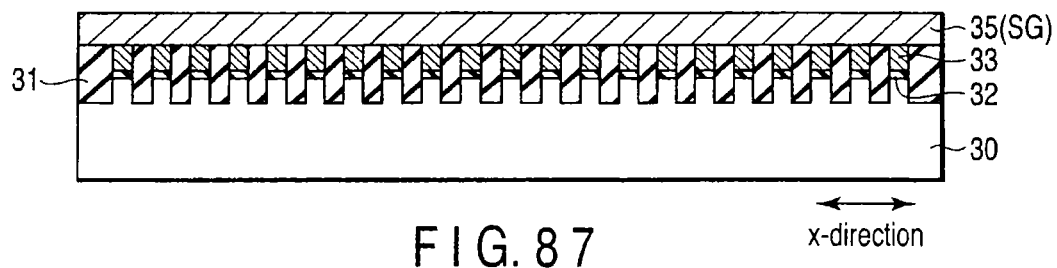
FIG. 87 is a sectional view taken along the line LXXXVII-LXXXVII of FIG. 84.
Figure 88:
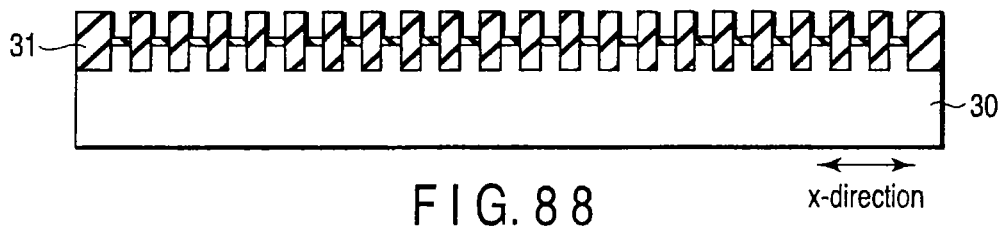
FIG. 88 is a sectional view taken along the line LXXXVIII-LXXXVIII of FIG. 84.

For example, as shown in FIG. 77, in the case where the mask members 36 and 37 are etched by means of wet etching, a portion at which the fringe in the contact area 14 is formed (the mask member 36 situated immediately beneath the solidified mask member 37) is etched on an exposed side face, and thus, the portion at which the fringe is formed (indicated by the arrow) may be reduced in size.

However, according to the third example and the fourth example of a word line layout of the present invention, a sufficiently wide portion at which a fringe is formed is allocated in advance.

Therefore, even if wet etching is employed, a problem caused by the processing precision does not occur.

Next, using the mask members 36, 37, and 40 as masks, a word line member 35, an inter-gate insulation film 34, a floating gate electrode member 33, and a gate insulation layer 32 are sequentially etched in accordance with RIE.

As a result, as shown in FIGS. 84 to 88, in the memory cell area MA, a word line WL having a finer pattern (for example, line=30 nm and space=30 nm) than a limit (minimum processing dimension) of resolution of photolithography is formed. In addition, in the select gate transistor area SA, a select gate line (select gate electrode) SG having a large width (channel length), for example, a width of 90 nm is formed.

In addition, in the contact area 14, a pattern of the word line member 35 for forming a fringe is formed at a distal end of the select gate line SG Lastly, as shown in FIGS. 89 to 93, by utilizing photolithography and RIE, the word lines WL in blocks BLOCKi and BLOCK (i+1) are separated from each other and the independency of the word lines WL is allocated.

Figure 89:
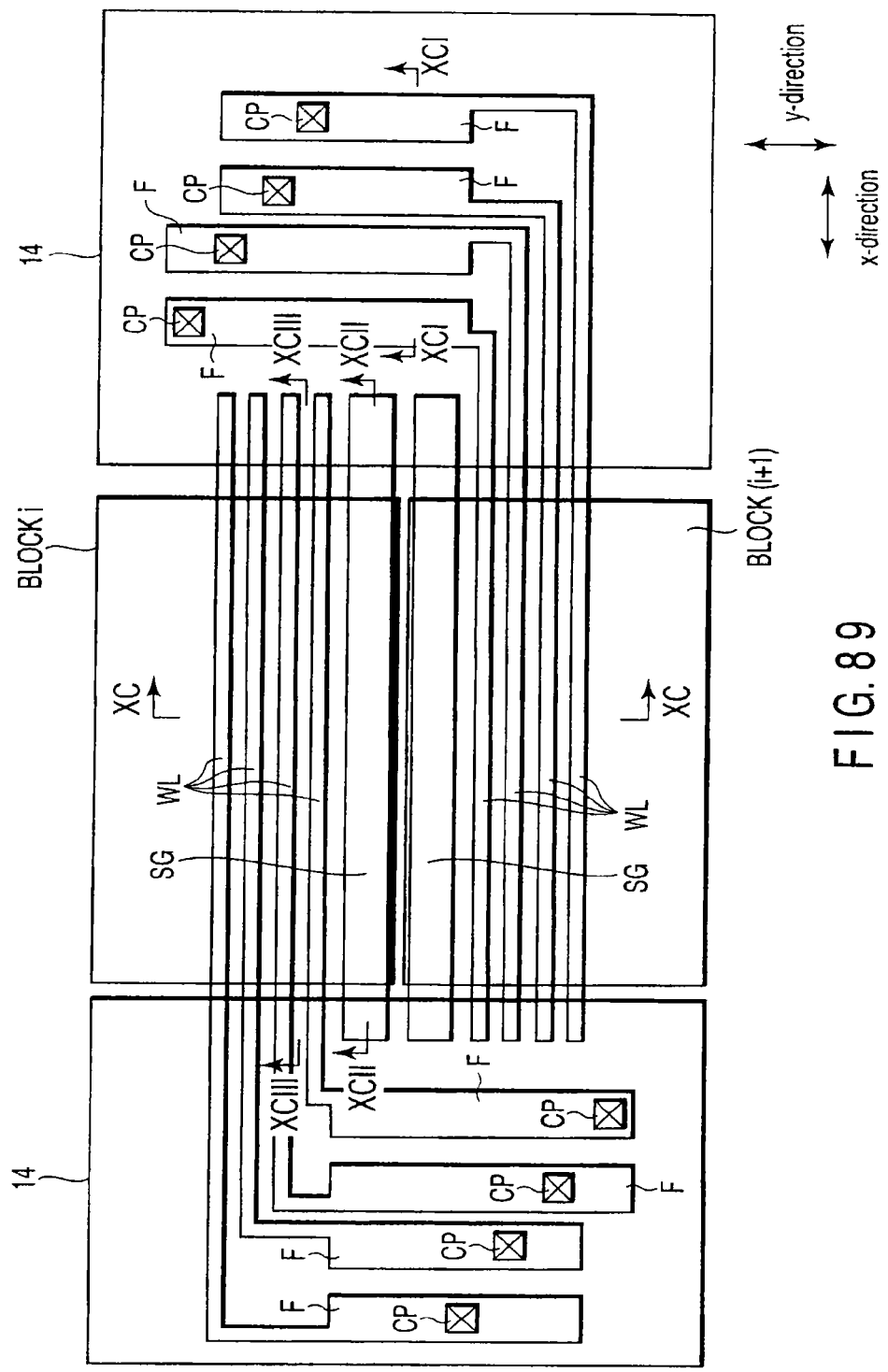
FIG. 89 is a plan view showing one process in a method for manufacturing a nonvolatile semiconductor memory.
Figure 90:
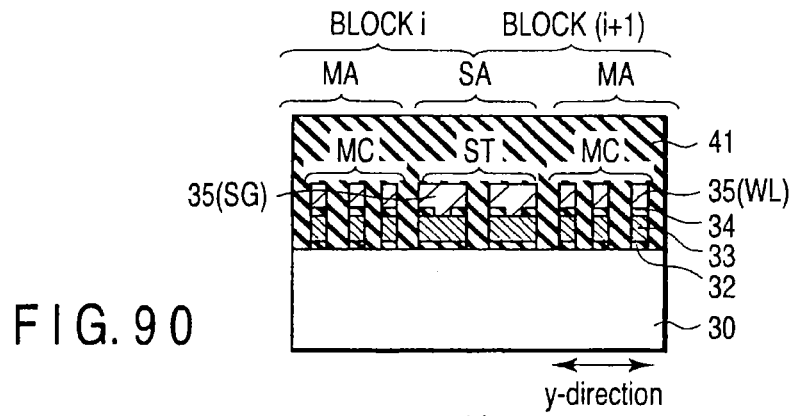
FIG. 90 is a sectional view taken along the line XC-XC of FIG. 89.
Figure 91:
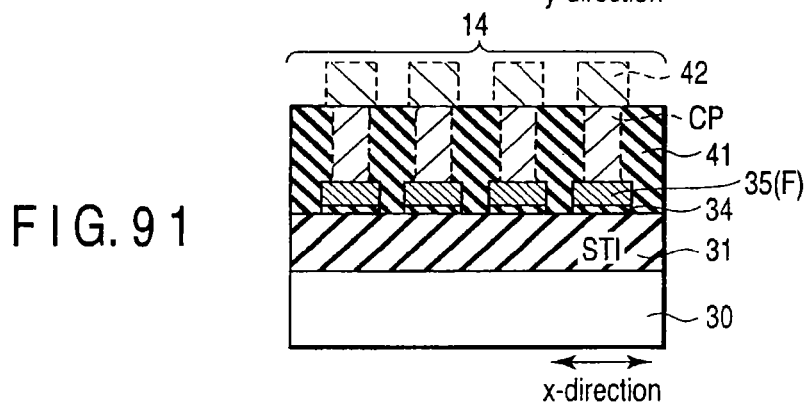
FIG. 91 is a sectional view taken along the line XCI-XCI of FIG. 89.
Figure 92:
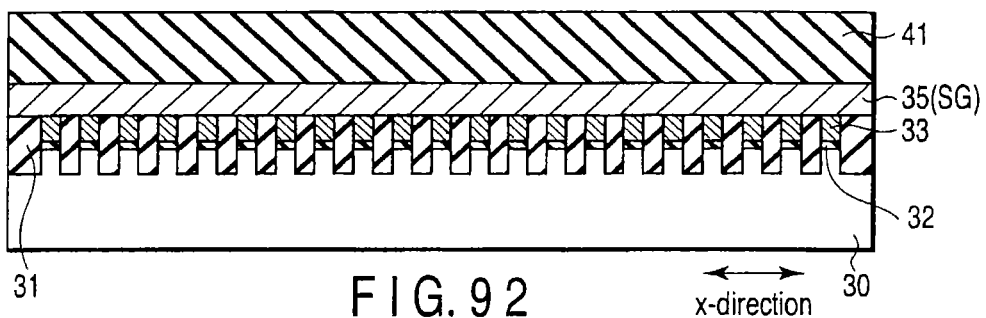
FIG. 92 is a sectional view taken along the line XCII-XCII of FIG. 89.
Figure 93:
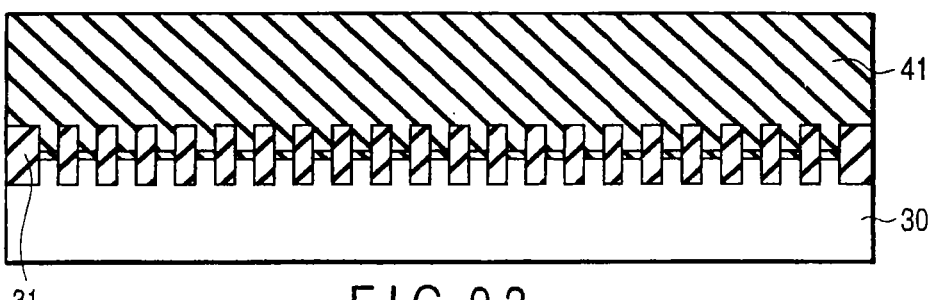
FIG. 93 is a sectional view taken along the line XCIII-XCIII of FIG. 89.

In the separation method, as shown in FIG. 89, part of the word line WL and part of the fringe F are removed using slits in the vertical direction (y-direction).

Then, an inter-layered insulation layer 41 covering a memory cell MC and a select gate transistor ST is formed on a semiconductor substrate 30. In addition, a contact hole reaching the fringe F is formed in the inter-layered insulation layer 41.

Then, contact plugs CP are filled in the contact hole and a metal layer 42 is formed on the inter-layered insulation layer 41. The metal layer 42 connects a word line WL to a word line driver.

The contact plugs CP may be formed separately from the metal layer 42 or may be formed at the same time. These members may be formed in accordance with metal sputtering and RIE or may be formed in accordance with a Damascene technique or a dual Damascene technique.

In the above processes, as a result, a nonvolatile semiconductor memory having a word line layout of FIG. 53 is formed, whereas another layout can be provided by changing patterns of the photoresists 38 and 39 or a resist pattern obtained when separating word lines WL.

In addition, while a resist solidifying process has been utilized in the present example, the layout according to the example of the present invention can be provided even if the solidifying process is not utilized.

For example, instead of the solidifying process, the fringe position or size can be adjusted by, for example, adding PEP once. In this case, a portion that is undesirable for etching is covered with a photoresist, and, in this state, the mask members 36 and 37 of FIGS. 77 to 81 may be etched.

In accordance with the manufacturing method described above, a nonvolatile semiconductor memory having a layout according to an example of the present invention is provided.

(9) Others

While the examples of the present invention have been achieved in accordance with reduction of word line pitches caused by development of a fine processing technique, the fine processing technique is not limited to a side wall processing technique using a side wall as a mask.

Further, while the examples of the present invention are effective for a NAND cell type flash memory, it can also be applied to a general nonvolatile semiconductor memory having a cell unit that consists of select gate transistors and memory cells.

3. Summary

According to the examples of the present invention, there can be achieved a word line layout compatible with word lines with narrow pitches, the word line layout allocating a contact area for forming a fringe having a sufficiently large size at an end of each of the word lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   cell units each having a first select gate transistor, a second select gate transistor, memory cells connected in series in a first direction and provided between the first and second select gate transistors; and
   a block comprising the cell units arranged in a second direction which crosses the first direction and having a first select gate line extending in the second direction and connected to the first select gate transistors, a second select gate line extending in the second direction and connected to the second select gate transistors, and word lines extending in the second direction, respectively connected to the memory cells;
wherein:
on a first side of the block, at least one of the word lines at the first select gate line side extends in the second direction, is bent toward the first select gate line side, is connected to a contact plug, and has a distal end, and
on a second side of the block opposite to the first side, the at least one of the word lines at the first select gate line side has no bent points, and is not connected to contact plugs.

2. The nonvolatile semiconductor memory according to claim 1, wherein an Nth (N is a natural number and up to half of the number of word lines in the block) word line from the first select gate line has a shorter length in the second direction than a length in the second direction of an (N+1)th word line from the first select gate line.

3. The nonvolatile semiconductor memory according to claim 1, wherein an Nth (N is a natural number and up to half of the number of word lines in the block) word line from the first select gate line has a shorter length between the distal end and a bent point than a length between the distal end and a bent point of an (N+1)th word line from the first select gate line.

4. The nonvolatile semiconductor memory according to claim 1, wherein an Nth (N is a natural number and up to half of the number of word lines in the block) word line from the first select gate line has a shorter length between the distal end and the contact plug than a length between the distal end and the contact plug of an (N+1)th word line from the first select gate line.

5. The nonvolatile semiconductor memory according to claim 1, wherein an ith (i is an odd number) word line from the first select gate line has a fringe, an (i+1)th word line from the first select gate line has a fringe, and the ith word line and the (i+1)th word line face each other.

6. The nonvolatile semiconductor memory according to claim 1, wherein, on the first side of the block, half of the word lines at the first select gate line side extend in the second direction, are bent toward the first select gate line side, are respectively connected to contact plugs, respectively have distal ends, and on the second side of the block, the half of the word lines at the first select gate line side have no bent points, and are not connected to contact plugs.

7. The nonvolatile semiconductor memory according to claim 6, wherein an Nth (N is a natural number and up to half of the number of word lines in the block) word line from the first select gate line has a shorter length in the second direction than a length in the second direction of an (N+1)th word line from the first select gate line.

8. The nonvolatile semiconductor memory according to claim 6, wherein an Nth (N is a natural number and up to half of the number of word lines in the block) word line from the first select gate line has a shorter length between the distal end and a bent point than a length between the distal end and a bent point of an (N+1)th word line from the first select gate line.

9. The nonvolatile semiconductor memory according to claim 6, wherein an Nth (N is a natural number and up to half of the number of word lines in the block) word line from the first select gate line has a shorter length between the distal end and the contact plug than a length between the distal end and the contact plug of an (N+1)th word line from the first select gate line.

10. The nonvolatile semiconductor memory according to claim 1, wherein a word line positioned next to the first select gate line is bent toward the first select gate line side.

11. The nonvolatile semiconductor memory according to claim 1, wherein a word line positioned next to the first select gate line is bent toward the first select gate line side, and extends beyond the first select gate line in the first direction.

12. A nonvolatile semiconductor memory comprising:
cell units each having a first select gate transistor, a second select gate transistor, memory cells connected in series in a first direction and provided between the first and second select gate transistors; and
a block comprising the cell units arranged in a second direction which crosses the first direction and having a first select gate line extending in the second direction and connected to the first select gate transistors, a second select gate line extending in the second direction and connected to the second select gate transistors, and word lines extending in the second direction, respectively connected to the memory cells;
wherein:
on a first side of the block, the word lines extend in the second direction, are bent toward the first select gate line side, respectively connected to contact plugs, and respectively have distal ends, and
on a second side of the block opposite to the first side, the word lines have no bent points, and are not connected to contact plugs.

13. The nonvolatile semiconductor memory according to claim 12, wherein an Nth (N is a natural number and up to half of the number of word lines in the block) word line from the first select gate line has a shorter length in the second direction than a length in the second direction of an (N+1)th word line from the first select gate line.

14. The nonvolatile semiconductor memory according to claim 12, wherein, on the second side of the block, the word lines have distal ends provided at a same position in the second direction.

15. The nonvolatile semiconductor memory according to claim 12, wherein a word line positioned next to the first select gate line is bent toward the first select gate line side, and extends beyond the first select gate line in the first direction.

16. A nonvolatile semiconductor memory comprising:
cell units each having a first select gate transistor, a second select gate transistor, memory cells connected in series in a first direction and provided between the first and second select gate transistors; and
first and second blocks, each comprising the cell units, arranged in a second direction which crosses the first direction and having a first select gate line extending in the second direction and connected to the first select gate transistors, a second select gate line extending in the second direction and connected to the second select gate transistors, and word lines extending in the second direction, respectively connected to the memory cells;
wherein:
the first select gate line in the first block and the first select gate line in the second block are adjacent to each other,
word lines in the first block, on a first side of the blocks, extend in the second direction, are bent toward the first select gate line side, are respectively connected to contact plugs, and respectively have distal ends,
the word lines in the first block, on a second side of the blocks opposite to the first side, have no bent points, and are not connected to contact plugs,
word lines in the second block, on the second side of the blocks, extend in the second direction, are bent toward the first select gate line side, are respectively connected to contact plugs, and respectively have distal ends, and the word lines in the second block, on the first side of the blocks, have no bent points, and are not connected to contact plugs.

17. The nonvolatile semiconductor memory according to claim 16, wherein an Nth (N is a natural number and up to half of the number of word lines in the first block) word line from the first select gate line in the first block has a shorter length in the second direction than a length in the second direction of an (N+1)th word line from the first select gate line in the first block.

18. The nonvolatile semiconductor memory according to claim 16, wherein, the word lines in the first block, on the second side of the blocks, have distal ends provided at a same position in the second direction.

19. The nonvolatile semiconductor memory according to claim 16, wherein a word line positioned next to the first select gate line in the first block is bent toward the first select gate line side in the first block, and extends in the first direction beyond the first select gate line in the second block.

20. The nonvolatile semiconductor memory according to claim 16, wherein a word line positioned next to the first select gate line in the first block is bent toward the first select gate line side in the first block, and extends in the first direction beyond the first select gate line in the second block, and a word line positioned next to the first select gate line in the second block is bent toward the first select gate line side in the second block, and extends in the first direction beyond the first select gate line in the first block.

* * * * *